(12) United States Patent
Otsuka

(10) Patent No.: US 11,368,128 B2
(45) Date of Patent: Jun. 21, 2022

(54) CAPACITANCE SENSOR CIRCUIT AND SEMICONDUCTOR INTEGRATED CIRCUIT

(71) Applicant: LAPIS SEMICONDUCTOR CO., LTD., Yokohama (JP)

(72) Inventor: Masayuki Otsuka, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 108 days.

(21) Appl. No.: 16/795,537

(22) Filed: Feb. 19, 2020

(65) Prior Publication Data

US 2020/0274498 A1 Aug. 27, 2020

(30) Foreign Application Priority Data

Feb. 21, 2019 (JP) ............... JP2019-029381

(51) Int. Cl.
| | |
|---|---|
| H03F 1/30 | (2006.01) |
| H03F 3/45 | (2006.01) |
| G01K 3/00 | (2006.01) |
| G01K 7/34 | (2006.01) |

(52) U.S. Cl.
CPC ............ *H03F 1/301* (2013.01); *G01K 3/005* (2013.01); *G01K 7/34* (2013.01); *H03F 3/45179* (2013.01); *H03F 2200/447* (2013.01)

(58) Field of Classification Search
CPC ................. H03F 1/301; H03F 3/45179; H03F 2200/447; H03F 1/0205; H03F 3/45183; G01K 3/005; G01K 7/34; G01K 3/04; G01K 11/06; G01V 3/00; H03K 17/007
USPC .................................................. 330/252–261
See application file for complete search history.

(56) References Cited

FOREIGN PATENT DOCUMENTS

| | | |
|---|---|---|
| JP | 2007333484 | 12/2007 |
| JP | 2018118925 | 8/2018 |

*Primary Examiner* — Khanh V Nguyen
*Assistant Examiner* — Khiem D Nguyen
(74) *Attorney, Agent, or Firm* — JCIPRNET

(57) ABSTRACT

A capacitance sensor circuit is provided, including: a capacitance variable capacitor changing from a first capacitance to a second capacitance corresponding to environmental change; a reference capacitor; and an amplifier circuit charging the capacitance variable capacitor via a first node and the reference capacitor via a second node, and outputting a determination signal. In the amplifier circuit, a differential amplification part generates a potential difference signal obtained by amplifying the potential difference between the first and the second nodes; an output part outputs the determination signal based on the potential difference signal; and when the difference between the increase degrees of the potentials of the first and the second nodes is less than a predetermined value, the output part holds and outputs the determination signal immediately before that state and a bias control part stops a current flowing through the differential amplification part.

13 Claims, 29 Drawing Sheets

CAPACITANCE SENSOR CIRCUIT AND SEMICONDUCTOR INTEGRATED CIRCUIT

CROSS REFERENCE TO RELATED APPLICATIONS

This application claims the priority benefit of Japanese Patent Application No. 2019-029381, filed on Feb. 21, 2019. The entirety of the above-mentioned patent application is hereby incorporated by reference herein and made a part of this specification.

BACKGROUND OF THE DISCLOSURE

Technical Field

The disclosure relates to a capacitance sensor circuit and a semiconductor integrated circuit.

Related Art

As a sensor that detects a temperature change, a capacitance sensor circuit is proposed in which a space between electrodes of a capacitor is filled with a lump of wax and the temperature change is detected based on a state change of the wax (for example, patent literature 1 (Japanese Patent Application Laid-open No. 2007-333484)). The lump of wax acts as a dielectric, and the liquid of the wax is absorbed by an absorption part arranged at a position adjacent to the capacitor when the temperature reaches a melting point of the wax. When the wax is absorbed by the absorption part, a region clamped between the electrodes of the capacitor is filled with air. Since the dielectric constant of air is smaller than the dielectric constant of wax, the electrostatic capacitance of the capacitor decreases and the impedance increases.

The impedance is measured by an impedance conversion part in an IC, and is transmitted from an antenna after data modulation. The transmitted data is received by a device on the receiving side that is different from the device on the transmitting side. The device on the receiving side compares a measurement value of the received impedance with threshold information and determines whether the wax has melted.

In a communication system equipped with this capacitance sensor circuit, a configuration is proposed in which the device on the transmitting side does not transmit the measurement value of the impedance but transmits a melting determination result of wax (for example, patent literature 2 (Japanese Patent Application Laid-open No. 2018-118925)). According to this configuration, since a memory that stores the threshold information of the impedance or a melting determination part is not required in the device on the receiving side, the device on the receiving side can be configured simply. In addition, since a current consumption for reading the threshold information from the memory or an operation current of the melting determination part is not required in the device on the receiving side, the current consumption can be reduced. In addition, it is also possible to reduce the current consumption of the IC by setting a clock signal to a low frequency in the device on the transmitting side.

In the capacitance sensor circuit of patent literature 2, a capacitance variable capacitor whose electrostatic capacitance changes due to the melting of the wax is arranged on a substrate, and a fixed capacitor whose capacitance value does not change is arranged in the IC. Then, a differential amplifier in the capacitance sensor circuit is used to compare the potentials of nodes connected to the respective capacitors, to thereby obtain the melting determination result of the wax.

However, in this configuration, when the capacitance value of the capacitance variable capacitor and the capacitance value of the fixed capacitor are the same, the differential amplifier always outputs the same potential, and thus the differential amplifier is not turned off and continues to pass current even though the measurement operation ends. Accordingly, the current consumption increases.

The disclosure provides a capacitance sensor circuit capable of detecting an environmental change while suppressing an increase in current consumption.

SUMMARY

According to one embodiment, a capacitance sensor circuit of the disclosure comprises a capacitance variable capacitor whose electrostatic capacitance changes from a first capacitance to a second capacitance corresponding to an environmental change; a reference capacitor having an electrostatic capacitance between the first capacitance and the second capacitance as a reference capacitance value; and an amplifier circuit that charges the capacitance variable capacitor via a first node and charges the reference capacitor via a second node corresponding to a clock signal, amplifies a potential difference between a potential of the first node and a potential of the second node, and outputs a binary determination signal indicating whether the electrostatic capacitance of the capacitance variable capacitor has changed to exceed the reference capacitance value based on the amplified potential difference; the amplifier circuit includes: a differential amplification part that amplifies the potential difference between the potential of the first node and the potential of the second node, and generates a potential difference signal indicating the amplified potential difference; a bias control part that supplies a bias signal to the differential amplification part, and controls an operation current of the differential amplification part; and an output part that outputs the binary determination signal based on the potential difference signal. When it becomes a state that a difference between an increase degree of the potential of the first node and an increase degree of the potential of the second node is less than a predetermined value due to the change in the electrostatic capacitance of the capacitance variable capacitor, the output part holds and outputs the binary determination signal immediately before the state, and the bias control part stops a current flowing through the differential amplification part.

In addition, according to another embodiment, a capacitance sensor circuit of the disclosure comprises a capacitance variable capacitor whose electrostatic capacitance changes from a first capacitance to a second capacitance corresponding to an environmental change; a first capacitor circuit including a plurality of capacitors and being capable of selectively changing a capacitance value of the electrostatic capacitance; and an amplifier circuit that charges the capacitance variable capacitor via a first node and charges the capacitors of the first capacitor circuit via a second node corresponding to a clock signal, amplifies a potential difference between a potential of the first node and a potential of the second node, and outputs a binary determination signal indicating whether the electrostatic capacitance of the capacitance variable capacitor has changed to exceed the capacitance value of the first capacitor circuit based on the amplified potential difference; the amplifier circuit includes: a first charging part that is connected to the first node and charges the capacitance variable capacitor; a second charging part that is connected to the second node and charges the capacitors of the first capacitor circuit; a differential amplification part that amplifies the potential difference between the potential of the first node and the potential of the second node, and generates a potential difference signal indicating the amplified potential difference; a bias control part that supplies a bias signal to the differential amplification part, and controls an operation current of the differential amplification part; and an output part that outputs the binary determination signal based on the potential difference signal; and the first capacitor circuit selectively changes a capacitance value by switching connection and non-connection between each of the plurality of capacitors and the second node based on a capacitance value selection signal.

In addition, according to another embodiment, a semiconductor integrated circuit of the disclosure, which is electrically connected to a capacitance variable capacitor whose electrostatic capacitance changes from a first capacitance to a second capacitance corresponding to an environmental change and which determines whether the electrostatic capacitance of the capacitance variable capacitor has changed to exceed a reference capacitance value, includes: a reference capacitor having an electrostatic capacitance between the first capacitance and the second capacitance as the reference capacitance value; and an amplifier circuit that charges the capacitance variable capacitor via a first node and charges the reference capacitor via a second node corresponding to a clock signal, amplifies a potential difference between a potential of the first node and a potential of the second node, and outputs a binary determination signal indicating whether the electrostatic capacitance of the capacitance variable capacitor has changed to exceed the reference capacitance value based on the amplified potential difference; the amplifier circuit includes: a differential amplification part that amplifies the potential difference between the potential of the first node and the potential of the second node, and generates a potential difference signal indicating the amplified potential difference; a bias control part that supplies a bias signal to the differential amplification part, and controls an operation current of the differential amplification part; and an output part that outputs the binary determination signal based on the potential difference signal. When it becomes a state that a difference between an increase degree of the potential of the first node and an increase degree of the potential of the second node is less than a predetermined value due to the change in the electrostatic capacitance of the capacitance variable capacitor, the output part holds and outputs the determination signal immediately before the state, and the bias control part stops a current flowing through the differential amplification part.

In addition, according to another embodiment, a semiconductor integrated circuit of the disclosure, which is electrically connected to a capacitance variable capacitor whose electrostatic capacitance changes from a first capacitance to a second capacitance corresponding to an environmental change and which determines whether the electrostatic capacitance of the capacitance variable capacitor has changed to exceed a reference capacitance value, including: a first capacitor circuit having a plurality of capacitors and being capable of selectively changing an electrostatic capacitance used as the reference capacitance value; and an amplifier circuit that charges the capacitance variable capacitor via a first node and charges the capacitors of the first capacitor circuit via a second node corresponding to a clock signal, amplifies a potential difference between a potential of the first node and a potential of the second node, and outputs a binary determination signal indicating whether the electrostatic capacitance of the capacitance variable capacitor has changed to exceed the capacitance value of the first capacitor circuit based on the amplified potential difference; the amplifier circuit includes: a first charging part that is connected to the first node and charges the capacitance variable capacitor; a second charging part that is connected to the second node and charges the capacitors of the first capacitor circuit; a differential amplification part that amplifies the potential difference between the potential of the first node and the potential of the second node, and generates a potential difference signal indicating the amplified potential difference; a bias control part that supplies a bias signal to the differential amplification part, and controls an operation current of the differential amplification part; and an output part that outputs the binary determination signal based on the potential difference signal; and the first capacitor circuit selectively changes the electrostatic capacitance by switching connection and non-connection between each of the plurality of capacitors and the second node based on a capacitance value selection signal.

According to the capacitance sensor circuit of the disclosure, it is possible to detect an environmental change without increasing the current consumption even when the electrostatic capacitance of the capacitance variable capacitor and the electrostatic capacitance of the fixed capacitor have substantially the same capacitance value.

DESCRIPTION OF THE EXAMPLES

Hereinafter, preferred examples of the disclosure are described in detail. Moreover, in the following description of each example and the accompanying drawings, substantially identical or equivalent parts are denoted by the same reference signs.

Example 1

Figure 1:
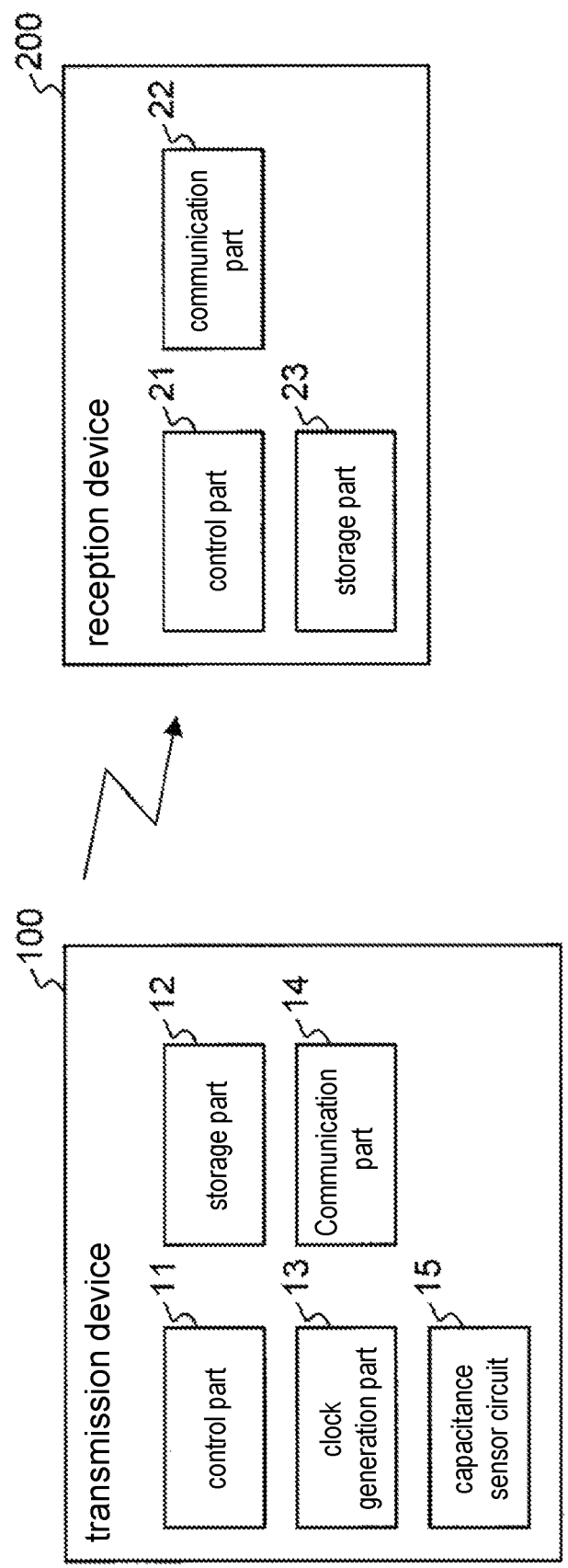
FIG. 1 is a block diagram showing configurations of a transmission device and a reception device of an example.

FIG. 1 is a block diagram including configurations of a transmission device 100 and a reception device 200 of the example. The transmission device 100 is a RFID (Radio Frequency Identification) transmission device that uses short-range wireless communication to transmit ID (Identification) information, and transmits information data including the ID information to the reception device 200.

The transmission device 100 is configured by an IC (Integrated Circuit) tag serving as a semiconductor communication device. The transmission device 100 includes a control 11, a storage part 12, a clock generation part 13, a communication part 14, and a capacitance sensor circuit 15.

The control part 11 is a processing control part configured by a microprocessor for example. The control part 11 can control each part of the transmission device 100 by, for example, reading a control program from the storage part 12 and executing the control program.

The storage part 12 is configured by, for example, a non-volatile memory such as a flash memory or the like. In addition, the storage part 12 can store a control program of the transmission device 100 and store ID information for identifying the transmission device 100.

The clock generation part 13 is configured by an oscillation circuit or the like, and generates a clock signal used for the operation of each part of the transmission device 100. For example, the clock generation part 13 generates a clock signal CLKIN and supplies the signal to the capacitance sensor circuit 15.

The communication part 14 includes an antenna (not shown), and transmits data by wireless communication conforming to the RFID standard for example. The communication part 14 modulates a wireless carrier wave signal according to binary data indicating the ID information of the transmission device 100 read from the storage part 12 and a sensor result obtained by the capacitance sensor circuit 15, and transmits the wireless carrier wave representing the ID information and the sensor result to the reception device 200.

The capacitance sensor circuit 15 is a circuit that includes a capacitor whose electrostatic capacitance changes corresponding to a temperature change, and detects a change in the electrostatic capacitance of the capacitor to output a detection result.

Figure 2:
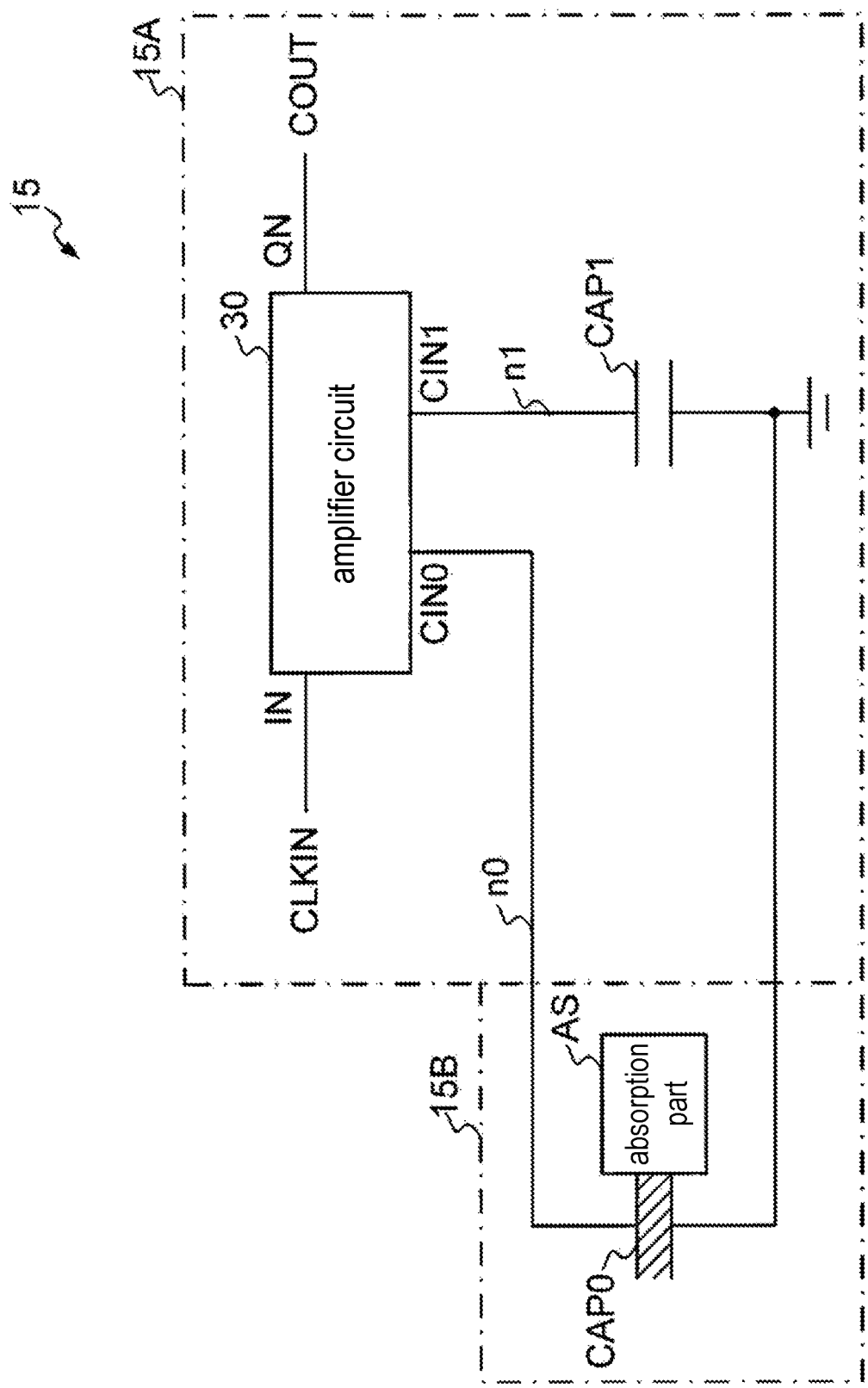
FIG. 2 is a block diagram showing a configuration of a capacitance sensor circuit of the example.

FIG. 2 is a block diagram showing a configuration of the capacitance sensor circuit 15. The capacitance sensor circuit 15 is configured by an internal circuit 15A arranged inside a semiconductor integrated circuit and an external circuit 15B arranged on a substrate outside the semiconductor integrated circuit. The internal circuit 15A is configured by an amplifier circuit 30 and a capacitor CAP1. The external circuit 15B is configured by a capacitor CAP0 and an absorption part AS.

Regarding the capacitor CAP0, one end thereof is connected to the amplifier circuit 30 via a node n0 (a first node), and the other end thereof is grounded. A dielectric DE having a relative dielectric constant sufficiently higher than 1.0 (for example, a relative dielectric constant of 2.0 or more) is arranged in a region between two electrodes of the capacitor CAP0 (hereinafter referred to as space between the electrodes). The dielectric DE is configured by wax for example, and changes its state, that is, changes from solid to liquid, when reaching a predetermined melting point.

The absorption part AS is configured by a material such as paper that absorbs liquid or the like. When the dielectric DE melts and changes from solid to liquid, the dielectric DE is absorbed by the absorption part AS. Thereby, the space between the electrodes of the capacitor CAP0 is filled with air. The relative dielectric constant of air is about 1.0, which is lower than the relative dielectric constant of the dielectric DE. Accordingly, the dielectric DE changes from solid to liquid and thereby the electrostatic capacitance (that is, the capacitance value) of the capacitor CAP0 is reduced. In the following description, the electrostatic capacitance in a state that the space between the electrodes of the capacitor CAP0 is filled with the solid of the dielectric DE is referred to as a first capacitance, and the capacitance in a state that the space between the electrodes of the capacitor CAP0 is filled with the air is referred to as a second capacitance.

In the example, the dielectric DE arranged between the electrodes of the capacitor CAP0 is absorbed by the absorption part AS once changing from solid to liquid, and thus does not return to the space between the electrodes of the capacitor CAP0 even if the dielectric DE has changed to solid again. That is, the capacitor CAP0 is configured not to return to the initial state once changing from the state in which the space between the electrodes is filled with the dielectric DE to the state in which the above space is filled with air. Accordingly, the change in the electrostatic capacitance of the capacitor CAP0 (that is, the change in the dielectric constant between the electrodes caused by the melting of the dielectric DE of substance (solid)) is irreversible.

In this manner, the capacitor CAP0 is a capacitance variable capacitor whose electrostatic capacitance irreversibly changes from the first capacitance (the electrostatic capacitance in the state that the space between the electrodes is filled with the solid of the dielectric DE) to the second capacitance (the electrostatic capacitance in the state that the space between the electrodes is filled with air) corresponding to an environmental change (for example, a temperature change in the example).

Regarding the capacitor CAP1, one end thereof is connected to the amplifier circuit 30 via a node n1 (a second node), and the other end thereof is grounded together with the other end of the capacitor CAP0. The capacitor CAP1 is a fixed capacitor whose electrostatic capacitance has a fixed value. The electrostatic capacitance of the capacitor CAP1 is set to a third capacitance that is a capacitance value (for example, an intermediate capacitance value) between the first capacitance and the second capacitance. The electrostatic capacitance of the capacitor CAP1 has a property as a reference capacitance value for determining whether the electrostatic capacitance of the capacitor CAP0 has changed.

Besides, when the ambient temperature of the capacitor CAP0 becomes a predetermined temperature close to the melting point of the dielectric DE and the solid dielectric DE filling the space between the electrodes melts to some extent (for example, about half), a part of the dielectric DE may be absorbed by the absorption AS, and the electrostatic capacitance of the capacitor CAP0 becomes substantially the same capacitance value as the third capacitance that is the electrostatic capacitance of the capacitor CAP1. That is, in a transient period until the dielectric DE changes from the solid state to the liquid state, the capacitor CAP0 and the capacitor CAP1 temporarily have substantially the same electrostatic capacitance.

The amplifier circuit 30 is connected to the capacitor CAP0 via the node n0 that is the first node, and is connected to the capacitor CAP1 via the node n1 that is the second node. The amplifier circuit 30 has a CIN0 terminal connected to one end of the capacitor CAP0 via the node n0, and a CIN1 terminal connected to one end of the capacitor CAP1 via the node n1. In addition, the amplifier circuit 30 has an input terminal IN that receives an input of the clock signal CLKIN, and an output terminal QN that outputs a detection signal COUT indicating a sensor result.

The amplifier circuit 30 charges and discharges the capacitor CAP0 via the CIN0 terminal and the node n0. In addition, the amplifier circuit 30 charges and discharges the capacitor CAP1 via the CIN1 terminal and the node n1. Based on a charging/discharging timing of the capacitors CAP0 and CAP1, the amplifier circuit 30 outputs the detection signal COUT indicating whether the dielectric DE between the electrodes of the capacitor CAP0 melts. That is, the amplifier circuit 30 is a determination part which charges the capacitor CAP0 and the capacitor CAP1 corresponding to the supply of the clock signal CLKIN, and determines whether the electrostatic capacitance of the capacitor CAP0 is the first capacitance or the second capacitance based on the potential of the node n0 and the potential of the node n1.

Figure 3:
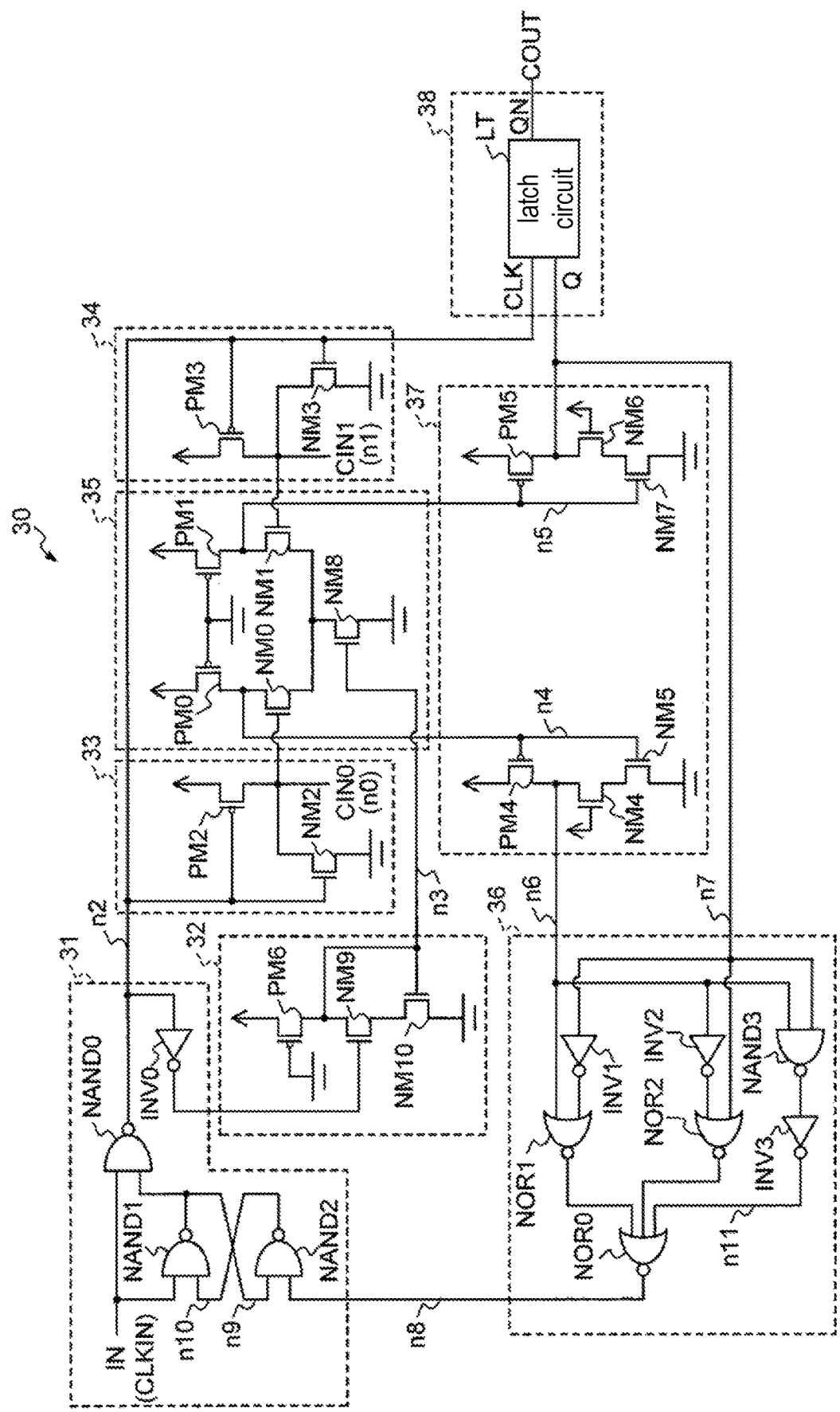
FIG. 3 is a circuit diagram showing a configuration of an amplifier circuit included in the capacitance sensor circuit of the example.

FIG. 3 is a circuit diagram showing a configuration of the amplifier circuit 30. The amplifier circuit 30 includes a plurality of logic gates, a plurality of transistors, and a latch circuit. The amplifier circuit 30 includes a control part 31, a bias signal generation part 32, a first current supply part 33, a second current supply part 34, a differential amplifier part 35, an exclusive logic gate circuit 36, an inverter part 37, and a data latch part 38.

The control part 31 includes a NAND0, a NAND1, a NAND2, and an inverter INV0.

The NAND0, NAND1, and NAND2 are two-input NAND gate circuits that output a negative AND. One input end of the NAND0 is connected to an input terminal IN of the amplifier circuit 30, and receives an input of the clock signal CLKIN.

The NAND1 and NAND2 constitute a flip-flop circuit. One input end of the NAND1 is connected to the input terminal IN of the amplifier circuit 30. An output end of the NAND1 is connected to the other input end of the NAND0. One input end of the NAND2 is connected together with the output end of the NAND1 to the other input end of the NAND0 via a node n9. An output terminal of the NAND2 is connected to the other input end of the NAND1 via a node n10.

An input end of the inverter INV0 is connected to an output terminal of the NAND0 via a node n2. The inverter INV0 inverts an output signal of the NAND0 that is input to the input end, and outputs the inverted signal from the output end.

The bias signal generation part 32 is a signal generation part that generates a bias signal supplied to the differential amplifier part 35 based on the output signal of the inverter INV0. The bias signal generation part 32 supplies the generated bias signal to the differential amplifier part 35. An operation current of the differential amplifier part 35 is controlled according to the supply of the bias signal. The bias signal generation part 32 includes a transistor PM6, a transistor NM9, and a transistor NM10.

The transistor PM6 is configured by a P-channel MOSFET (Metal Oxide Semiconductor Field Effect Transistor) which is a transistor of a first conductivity type. In the transistor PM6, the source is connected to the power supply, the gate grounded, and the drain is connected to a node n3.

The transistors NM9 and NM10 are respectively configured by an N-channel MOSFET which is a transistor of a second conductivity type. In the transistor NM9, the gate is connected to the output end of the inverter INV0, and the drain is connected to the node n3. In the transistor NM10, the source is grounded, and the gate is connected to the node n3. The source of the transistor NM9 and the drain of the transistor NM10 are connected to each other.

The first current supply part 33 is a charging control part that controls charging/discharging of the capacitor CAP0 by supplying a current to the node n0 via the CIN0 terminal. The first current supply part 33 includes a transistor PM2 and a transistor NM2.

The transistor PM2 is configured by a P-channel MOSFET which is a transistor of the first conductivity type. In the transistor PM2, the source is connected to the power supply, and the gate is connected to the node n2.

The transistor NM2 is configured by an N-channel MOSFET which is a transistor of the second conductivity type. In the transistor NM2, the source is grounded, and the gate is connected to the node n2. The drain of the transistor PM2 and the drain of the transistor NM2 are connected to one end of the capacitor CAP0 via the CIN0 terminal.

The second current supply part 34 is a charging control part that controls charging/discharging of the capacitor CAP1 by supplying a current to the node n1 via the CIN1 terminal. The second current supply part 34 includes a transistor PM3 and a transistor NM3.

The transistor PM3 is configured by a P-channel MOSFET which is a transistor of the first conductivity type. In the transistor PM3, the source is connected to the power supply, and the gate is connected to the node n2.

The transistor NM3 is configured by an N-channel MOSFET which is a transistor of the second conductivity type. In the transistor NM3, the source is grounded, and the gate is connected to the node n2. The drain of the transistor PM3 and the drain of the transistor NM3 are connected to one end of the capacitor CAP1 via the CIN1 terminal.

The differential amplifier part 35 is a differential amplifier circuit which amplifies and outputs a potential difference between the charging potentials of the capacitors CAP0 and CAP1. The differential amplifier part 35 includes transistors PM0, PM1, NM0, NM1, and NM8.

The transistors PM0 and PM1 are respectively configured by a P-channel MOSFET which is a transistor of the first conductivity type. In the transistors PM0 and PM1, the respective sources are connected to the power supply, and the gates are connected to each other and are commonly grounded.

The transistors NM0 and NM1 are respectively configured by an N-channel MOSFET which is a transistor of the second conductivity type. The drain of the transistor NM0 is connected to the drain of the transistor PM0. The gate of the transistor NM0 is connected to the drain of the transistor PM2 and the drain of the transistor NM2, and is connected to one end of the capacitor CAP0 via the CIN0 terminal.

The drain of the transistor NM1 is connected to the drain of the transistor PM1. The gate of the transistor NM1 is connected to the drain of the transistor PM3 and the drain of the transistor NM3, and is connected to one end of the capacitor CAP1 via the CIN1 terminal.

In the transistor NM8, the source is grounded, and the drain is connected to the sources of the transistors NM0 and NM1. The gate of the transistor NM8 is connected to the node n3, and is connected, via the node n3, to the gate of the transistor NM10, the drain of the transistor PM6, and the drain of the transistor NM9. The transistor NM8 has a function of serving as a constant current source circuit. A constant current (a tail current) sent by the transistor NM8 serving as a constant current source circuit is controlled according to the bias signal (that is, the potential of the node n3) from the bias signal generation part 32.

The exclusive logic gate circuit 36 is a logic gate circuit that outputs the exclusive OR thereof to a node n8 using signals on nodes n6 and n7 as input. The exclusive logic gate circuit 36 includes a NOR0, a NOR1, a NOR2, a NAND3, an inverter INV1, an inverter INV2, and an inverter INV3.

An input end of the inverter INV1 is connected to the node n7. The inverter INV1 inverts the signal on the node n7 input to the input end, and outputs the inverted signal from the output end. An input end of the inverter INV2 is connected to the node n6. The inverter INV2 inverts the signal on the node n6 input to the input end, and outputs the inverted signal from the output end.

The NOR1 and NOR2 are two-input NOR gate circuits which output a negative OR. One input end of the NOR1 is connected to the node n6 in common with an input end of the inverter INV2. The other input end of the NOR1 is connected to an output end of the inverter INV1. The NOR1 outputs, from the output end, a signal of negative OR between the signal on the node n6 and the signal output from the output end of the inverter INV1.

One input end of the NOR2 is connected to the node n7 in common with an input end of the inverter INV1. The other input end of the NOR2 is connected to an output end of the inverter INV2. The NOR2 outputs, from the output end, a signal of negative OR between the signal on the node n7 and the signal output from the output end of the inverter INV2.

The NAND3 is a two-input NAND gate circuit that outputs a negative AND. One input end of the NAND3 is connected to the node n6 in common with one input end of the NOR1 and the input end of the inverter INV2. The other input end of the NAND3 is connected to the node n7 in common with the input end of the inverter INV1 and the other input end of the NOR2. The NAND3 outputs, from the output end, a signal of negative AND between the signal on the node n6 and the signal on the node n7.

Regarding the inverter INV3, an input end thereof is connected to an output end of the NAND3, and an output end thereof is connected to a node n11. The inverter INV3 inverts an output signal of the NAND3 input to the input end and outputs the inverted signal from the output end.

The NOR0 is a three-input NOR gate circuit that outputs a negative OR. A first input end of the NOR0 is connected to an output end of the NOR1. A second input end of the NOR0 is connected to an output end of the NOR2. A third input end of the NOR0 is connected to an output end of the inverter INV3 via the node n11. An output end of the NOR0 is connected to the other input end of the NAND2 of the control part 31 via the node n8. The NOR0 outputs, from the output end, a negative OR of the output signal of the NOR1, the output signal of the NOR2 and the signal on the node n11.

The inverter part 37 is a circuit that inverts the output signal from the differential amplifier part 35 and outputs the inverted signal. The inverter part 37 includes transistors PM4, PM5, NM4, NM5, NM6 and NM7.

The transistor PM4 is configured by a P-channel MOSFET which is a transistor of the first conductivity type. In the transistor PM4, the source is connected to the power supply, and the gate is connected to a node n4.

The transistor NM4 is configured by an N-channel MOSFET which is a transistor of the second conductivity type. In the transistor NM4, the gate is connected to the power supply, and the drain is connected to the node n6 in common with the drain of the transistor PM4.

The transistor NM5 is configured by an N-channel MOSFET which is a transistor of the second conductivity type. In the transistor NM5, the source is grounded, the drain is connected to the source of the transistor NM4, and the gate is connected to the node n4.

The transistor PM5 is configured by a P-channel MOSFET which is a transistor of the first conductivity type. In the transistor PM5, the source is connected to the power supply, and the gate is connected to a node n5.

The transistor NM6 is configured by an N-channel MOSFET which is a transistor of the second conductivity type. In the transistor NM6, the gate is connected to the power supply, and the drain is connected to the node n7 in common with the drain of the transistor PM5.

The transistor NM7 is configured by an N-channel MOSFET which is a transistor of the second conductivity type. In the transistor NM7, the source is grounded, the drain is connected to the source of the transistor NM6, and the gate is connected to the node n5.

Besides, the transistors PM0 and PM1 are formed with the same dimensions (gate length, gate width and the like). Similarly, the transistors PM2 and PM3, PM4 and PM5, NM0 and NM1, NM2 and NM3, NM4 and NM6, and NM5 and NM7 are respectively formed with the same dimensions.

The data latch part 38 is configured by a latch circuit LT. The latch circuit LT has a clock terminal CLK, a signal input terminal Q, and an output terminal QN. The latch circuit LT captures data input to the signal input terminal Q when a clock signal input to the clock terminal CLK is at an L-level (that is, a ground potential level). In addition, when the clock signal input to the clock terminal CLK transitions from the L-level to an H-level (that is, a power supply potential level), the latch circuit LT outputs, from the output terminal QN, an inverted signal of the data captured when the clock signal is at the L-level. Then, the latch circuit LT continues to output the same output data (that is, the output data is held) until the clock signal input to the clock terminal CLK transitions from the L-level to the H-level again. In this manner, the latch circuit LT is an output part that outputs and holds the binary determination signal indicating whether the electrostatic capacitance of the capacitor CAP0 has changed from the first capacitance to the second capacitance based on the potential difference amplified by the differential amplifier part 35.

Referring again to FIG. 1, the reception device 200 includes a control part 21, a communication part 22, and a storage part 23.

The control part 21 is a processing control part configured by a microprocessor for example. The control part 21 can control each part of the reception device 200 by, for example, reading out a control program from the storage part 23 and executing the control program.

The communication part 22 includes an antenna (not shown), and receives data by wireless communication conforming to the RFID standard for example. The communication part 22 demodulates a signal (a wireless transmission wave) received from the transmission device 100, and obtains ID information of the transmission device 100 and information of a sensor result in the transmission device 100.

The storage part 23 is configured by, for example, a non-volatile memory such as a flash memory or the like. The storage part 23 can store, for example, a control program of the reception device 200, and can store various data extracted from the signal received by the communication part 22. For example, the storage part 23 stores the ID information of the transmission device 100 and the information of the sensor result in the transmission device 100.

Figure 4:
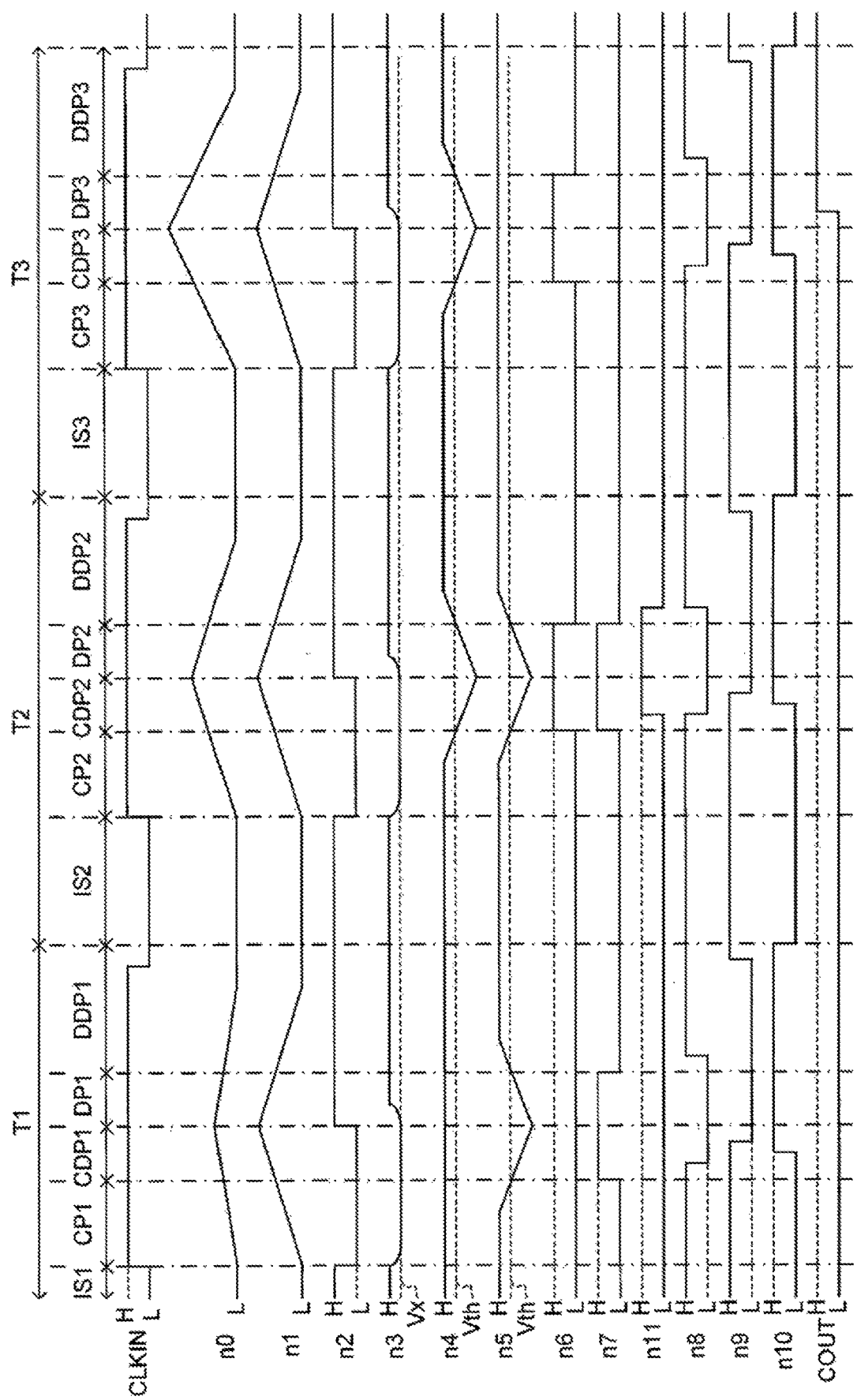
FIG. 4 is a time chart showing the operation of the capacitance sensor circuit of the example.

Next, the operation of the capacitance sensor circuit 15 of the example is described with reference to the circuit diagrams of FIGS. 2 and 3 and the time chart of FIG. 4. In the following description, a period in which the dielectric DE between the electrodes of the capacitor CAP0 in FIG. 2 has not melted (that is, a period in which the ambient temperature has not yet reached the melting point of the dielectric DE) is defined as a period T1. In addition, a period in which the dielectric DE has melted to some extent (for example, about half) and the electrostatic capacitance of the capacitor CAP0 and the electrostatic capacitance of the CAP1 have substantially the same capacitance value is defined as a period T2. In addition, a period after all of the dielectric DE has melted (that is, a period after the dielectric DE melts and is absorbed by the absorption part AS) is defined as a period T3.

Here, "the dielectric DE has not melted" includes not only a case in which the dielectric DE is not melted at all, but also a case in which the electrostatic capacitance of the capacitor CAP0 is still close to the first capacitance and has not yet been close to the third capacitance which is the electrostatic capacitance of the capacitor CAP1 even if the dielectric DE has melted slightly. In addition, "all of the dielectric DE has melted" includes not only a case in which the dielectric DE has completely melted, but also a case in which the dielectric DE has melted to such an extent that the electrostatic capacitance of the capacitor CAP0 has a capacitance value close to the second capacitance even if there remains a little part that has not wholly melted.

First, the operation of the capacitance sensor circuit 15 in the period T1 (that is, the state in which the dielectric DE has not melted) is described.

[First Initial State IS1]

When the clock signal CLKIN at the L-level is input to the input terminal IN of the amplifier circuit 30, the potential of the node n2 becomes the H-level. Thereby, the potentials of the nodes n0 and n1 become the L-level, and the potentials of the nodes n3, n4, and n5 become the H-level. In addition, the potentials of the nodes n6 and n7 become the L-level, the potential of the node n8 becomes the H-level, the potential of the node n9 becomes the H-level, the potential of the node n10 becomes the L-level, and the potential of the node n11 becomes the L-level. In FIG. 4, the period of this state is shown as a first initial state IS1.

In the first initial state IS1, since the potential of the node n2 is at the H-level, the value of the detection signal COUT output from the output terminal QN of the latch circuit LT maintains the previous data value. That is, since the dielectric DE between the electrodes of the capacitor CAP0 is in a state before melting, the detection signal COUT of the L-level is output.

[First Charging Period CP1]

After that, when the clock signal CLKIN becomes the H-level, the potential of the node n2 becomes the L-level. The potential of the node n2 is inverted by the inverter INV0, and the inverted signal at the H-level is applied to the gate of the transistor NM9. Thereby, the bias signal generation part 32 operates, and the node n3 becomes an intermediate potential Vx. Thereby, a bias signal at the intermediate potential Vx level is supplied to the gate of the transistor NM8 which is a constant current source.

In addition, since the potential of the node n2 is at the L-level, the transistors NM2 and NM3 are both turned off, and the transistors PM2 and PM3 both comes into an ON state. Thereby, the capacitor CAP0 is charged via the CIN0 terminal, and the capacitor CAP1 is charged via the CIN1 terminal.

Since the dielectric DE has not melted in the period T1, the capacitance value of the capacitor CAP0 is the first capacitance, which is larger than the third capacitance that is the capacitance value of the capacitor CAP1. Accordingly, the capacitor CAP1 is charged earlier than the capacitor CAP0, and the potential of the node n1 increases earlier than that of the node n0.

The potential of the node n1 is applied to the gate of the transistor NM1, and the potential of the node n5 is reduced due to the operation of the differential amplifier part 35. On the other hand, since the potential of the node n0 increases later than that of the node n1, the potential of the node n4 is hardly reduced due to the function of the differential amplifier part 35. In FIG. 4, the period of this state is shown as a first charging period CP1.

[First Charging Detection Period CDP1]

After that, when the potential of the node n5 is reduced to a threshold level Vth of the inverter part 37, the potential of the node n7 becomes the H-level, and the input signal at the H-level is captured from the signal input terminal Q to the latch circuit LT. In addition, since the potential of the node n6 is at the L-level, the potential of the node n11 is maintained at the L-level even when the potential of the node n7 becomes the H-level. In FIG. 4, the period of this state is shown as a first charging detection period CDP1.

In the first charging detection period CDP1, the potentials of the nodes n8, n10, and n9 change sequentially with a time difference. Specifically, the potential of the node n7 becomes the H-level, and thereby the potential of the node n8 becomes the L-level. The potential of the node n10 becomes the H-level corresponding to the change in the potential of the node n8. The potential of the node n9 becomes the L-level corresponding to the change in the potential of the node n10.

[First Discharging Period DP1]

The potential of the node n9 becomes the L-level, and thereby the potential of the node n2 changes to the H-level. Thereby, a signal at the H-level is supplied as a clock signal to the clock terminal CLK of the latch circuit LT. At this time, since the node n7 is at the H-level, the signal at the H-level is captured to the signal input terminal Q. Accordingly, the latch circuit LT outputs the inverted signal QN at the L-level as the output signal COUT from the output terminal QN.

In addition, the potential of the node n2 becomes the H-level, and thereby an inverted signal at the L-level obtained by inverting the potential of the node n2 is applied to the gate of the transistor NM9. Thereby, the bias signal generation part 32 is turned off (that is, in a non-operating state), and the potential of the node n3 becomes the H-level. Thereby, a bias signal at the H-level is supplied to the gate of the transistor NM8, and the transistor NM8 serving as a constant current source is turned on. In addition, since the transistors NM2 and NM3 are turned on and the transistors PM2 and PM3 are turned off, the capacitors CAP0 and CAP1 are discharged via the CIN0 terminal and the CIN1 terminal. In FIG. 4, the period of this state is shown as a first discharging period DP1.

[First Discharging Detection Period DDP1]

After that, when the potential of the node n5 increases to the threshold level Vth of the inverter part 37, the potential of the node n7 becomes the L-level and the potential of the node n8 becomes the H-level. After that, when the clock signal CLKIN becomes the L-level, the potential of the node n9 becomes the H-level and the potential of the node n10 becomes the L-level. In FIG. 4, the period of this state is shown as a first discharging detection period DDP1.

Next, the operation of the capacitance sensor circuit 15 in the period T2 (that is, a state in which the dielectric DE has melted to some extent and is partially absorbed by the absorption part AS, and the electrostatic capacitance of the capacitor CAP0 and the electrostatic capacitance of the CAP1 become substantially the same capacitance value) is described.

[Second Initial State IS2]

When the clock signal CLKIN of the L-level is input to the input terminal IN of the amplifier circuit 30, the potential of the node n2 becomes the H-level. Thereby, the potentials of the nodes n0 and n1 become the L-level, and the potentials of the nodes n3, n4, and n5 become the H-level. In addition, the potentials of the nodes n6 and n7 become the L-level, the potential of the node n11 becomes the L-level, the potential of the node n8 becomes the H-level, the potential of the node n9 becomes the H-level, and the potential of the node n10 becomes the L-level. In FIG. 4, the period of this state is shown as a second initial state IS2.

In the second initial state IS2, since the potential of the node n2 becomes the H-level, the L-level that is the previous data value is held as the detection signal COUT output from the output terminal QN of the latch circuit LT.

[Second Charging Period CP2]

After that, when the clock signal CLKIN becomes the H-level, the potential of the node n2 becomes the L-level. The potential of the node n2 is inverted by the inverter INV0, and an inverted signal at the H-level is applied to the gate of the transistor NM9. Thereby, the bias signal generation part 32 operates, and the node n3 becomes the intermediate potential Vx. Thereby, a bias signal at the intermediate potential Vx level is supplied to the gate of the transistor NM8 which is a constant current source.

In addition, since the potential of the node n2 is at the L-level, the transistors NM2 and NM3 are both turned off, and the transistors PM2 and PM3 are both turned on. Thereby, the capacitor CAP0 is charged via the CIN0 terminal, and the capacitor CAP1 is charged via the CIN1 terminal.

In the period T2, the dielectric DE has melted to some extent, and the capacitors CAP0 and CAP1 have substantially the same capacitance value (that is, the third capacitance). Therefore, the capacitor CAP0 and the capacitor CAP1 are charged at substantially the same speed, and the potentials of the nodes n0 and n1 increase at increase rates of the same degree (that is, a state in which the difference in the increase degree is less than a predetermined value).

The potential of the node n0 is applied to the gate of the transistor NM0, and the potential of the node n4 is reduced due to the operation of the differential amplifier part 35. On the other hand, the potential of the node n1 is applied to the gate of the transistor NM1, and the potential of the node n5 is reduced due to the operation of the differential amplifier part. Since the increase rates of the potentials of the nodes n0 and n1 are substantially the same, the potentials of the nodes n4 and n5 are also reduced at substantially the same reduction rate (that is, a state in which the difference in the reduction degree is less than a predetermined value). In FIG. 4, the period of this state is shown as a second charging period CP2.

[Second Charging Detection Period CDP2]

After that, when the potential of the node n4 is reduced to the threshold level Vth of the inverter part 37, the potential of the node n6 becomes the H-level. Similarly, when the potential of the node n5 is reduced to the threshold level Vth of the inverter part 37, the potential of the node n7 becomes the H-level. Since the reduction rates of the potentials of the nodes n4 and n5 are substantially the same, the potentials of the nodes n6 and n7 become the H-level substantially at the same time.

The potentials of the nodes n6 and n7 become the H-level, and thereby the potential of the node n11 becomes the H-level. In addition, the potentials of the nodes n8, n10, and n9 change sequentially with a time difference. Specifically, the potentials of the nodes n6 and n7 become the H-level, and the potential of the node n11 becomes the H-level, and thereby the potential of the node n8 becomes the L-level. Corresponding to the change in the potential of the node n8, the potential of the node n10 becomes the H-level. Corresponding to the change in the potential of the node n10, the potential of the node n9 becomes the L-level. In FIG. 4, the period of this state is shown as a second charging detection period CDP2.

[Second Discharging Period DP2]

Since the clock signal CLKIN is at the H-level and the potential of the node n9 becomes the L-level, the node n2 which is a negative AND of the clock signal CLKIN and the node n2 becomes the H-level. At this time, since the node n7 is at the H-level, an input signal at the H-level is captured to the signal input terminal Q of the latch circuit LT. Accordingly, the latch circuit LT outputs the inverted signal QN at the L-level obtained by inverting the above input signal as the output signal COUT from the output terminal QN.

In addition, the potential of the node n2 becomes the H-level, and thereby an inverted signal at the L-level obtained by inverting the potential of the node n2 is applied to the gate of the transistor NM9. Thereby, the bias signal generation part 32 is turned off (that is, in a non-operating state), and the potential of the node n3 becomes the H-level. Thereby, a bias signal at the H-level is supplied to the gate of the transistor NM8, and the transistor NM8 serving as a constant current source is turned on. In addition, since the transistors NM2 and NM3 are turned on and the transistors PM2 and PM3 are turned off, the capacitors CAP0 and CAP1 are discharged via the CIN0 terminal and the CIN1 terminal. In FIG. 4, the period of this state is shown as a second discharging period DP2.

[Second Discharging Detection Period DDP2]

After that, when the potential of the node n4 increases to the threshold level Vth of the inverter part 37, the potential of the node n6 becomes the L-level. Similarly, when the potential of the node n5 increases to the threshold level Vth of the inverter part 37, the potential of the node n7 becomes the L-level. Thereby, the potential of the node n11 becomes the L-level, and the potential of the node n8 becomes the H-level. After that, when the clock signal CLKIN becomes the L-level, the potential of the node n9 becomes the H-level and the potential of the node n10 becomes the L-level. In FIG. 4, the period of this state is shown as a second discharge detection period DDP2.

Next, the operation of the capacitance sensor circuit 15 in the period T3 (that is, a state in which all of the dielectric DE has melted and is absorbed by the absorption part AS) is described.

[Third Initial State IS3]

When the clock signal CLKIN at the L-level is input to the input terminal IN of the amplifier circuit 30, the potential of the node n2 becomes the H-level. Thereby, the potentials of the nodes n0 and n1 become the L-level, and the potentials of the nodes n3, n4, and n5 become the H-level. In addition, the potentials of the nodes n6 and n7 become the L-level, the potential of the node n11 becomes the L-level, the potential of the node n8 becomes the H-level, the potential of the node n9 becomes the H-level, and the potential of the node n10 becomes the L-level. In FIG. 4, the period of this state is shown as a third initial state IS3.

In the third initial state IS3, since the potential of the node n2 is at the H-level, the L-level that is the previous data value is held as the detection signal COUT output from the output terminal QN of the latch circuit LT.

[Third Charging Period CP3]

After that, when the clock signal CLKIN becomes the H-level, the potential of the node n2 becomes the L-level. The potential of the node n2 is inverted by the inverter INV0, and an inverted signal at the H-level is applied to the gate of the transistor NM9. Thereby, the bias signal generation part 32 operates, and the node n3 becomes the intermediate potential Vx. Thereby, a bias signal at the intermediate potential Vx level is supplied to the gate of the transistor NM8 which is a constant current source.

In addition, since the potential of the node n2 is at the L-level, the transistors NM2 and NM3 are both turned off, and the transistors PM2 and PM3 are both turned on. Thereby, the capacitor CAP0 is charged via the CIN0 terminal, and the capacitor CAP1 is charged via the CIN1 terminal.

In the period T3, since the dielectric DE has melted, the capacitance value of the capacitor CAP0 is the second capacitance, which is smaller than the third capacitance that is the capacitance value of the capacitor CAP1. Accordingly, the capacitor CAP0 is charged earlier than the capacitor CAP1, and the potential of the node n0 increases earlier than that of the node n1.

The potential of the node n0 is applied to the gate of the transistor NM0, and the potential of the node n4 is reduced due to the operation of the differential amplifier part 35. On the other hand, since the potential of the node n1 increases later than that of the node n0, the potential of the node n5 is hardly reduced due to the function of the differential amplifier part 35. In FIG. 4, the period of this state is shown as a third charging period CP3.

[Third Charging Detection Period CDP3]

After that, when the potential of the node n4 is reduced to the threshold level Vth of the inverter part 37, the potential of the node n6 becomes the H-level. On the other hand, since the potential of the node n5 is not reduced, the node n7 is maintained at the L-level, and an input signal at the L-level is captured from the signal input terminal Q to the latch circuit LT. In addition, since the potential of the node n7 is at the L-level, the potential of the node n11 is maintained at the L-level even when the potential of the node n6 changes to the H-level. In FIG. 4, the period of this state is shown as a third charging detection period CDP3.

In the third charge detection period CDP3, the potentials of the nodes n8, n10, and n9 change sequentially with a time difference. Specifically, the potential of the node n6 becomes the H-level, and thereby the potential of the node n8 becomes the L-level. Corresponding to the change in the potential of the node n8, the potential of the node n10 becomes the H-level. Corresponding to the change in the potential of the node n10, the potential of the node n9 becomes the L-level.

[Third Discharging Period DP3]

The potential of the node n9 becomes the L-level, and thereby the potential of the node n2 becomes the H-level. Thereby, a signal at the H-level is supplied as a clock signal to the clock terminal CLK of the latch circuit LT. At this time, since the node n7 is at the L-level, the signal at the L-level is captured to the signal input terminal Q. Accordingly, the latch circuit LT outputs the inverted signal QN at the H-level as the output signal COUT from the output terminal QN.

In addition, the potential of the node n2 becomes the H-level, and thereby an inverted signal at the L-level obtained by inverting the potential of the node n2 is applied to the gate of the transistor NM9. Thereby, the bias signal generation part 32 is turned off (that is, in a non-operating state), and the potential of the node n3 becomes the H-level. Thereby, a bias signal at the H-level is supplied to the gate of the transistor NM8, and the transistor NM8 serving as a constant current source is turned on. In addition, since the transistors NM2 and NM3 are turned on and the transistors PM2 and PM3 are turned off, the capacitors CAP0 and CAP1 are discharged via the CIN0 terminal and the CIN1 terminal. In FIG. 4, the period of this state is shown as a third discharging period DP3.

[Third Discharging Detection Period DDP3]

After that, when the potential of the node n4 increases to the threshold level Vth of the inverter part 37, the potential of the node n6 becomes the L-level and the potential of the node n8 becomes the H-level. After that, when the clock signal CLKIN becomes the L-level, the potential of the node n9 becomes the H-level and the potential of the node n10 becomes the L-level. In FIG. 4, the period of this state is shown as a third discharging detection period DDP3.

As described above, the capacitance sensor circuit 15 of the example outputs the detection signal COUT at the L-level when the dielectric DE between the electrodes of the capacitor CAP0 has not melted. In addition, when the dielectric DE has melted to some extent and the capacitors CAP0 and CAP1 have substantially the same capacitance value, the capacitance sensor circuit 15 outputs the same detection signal COUT at the L-level as in the case that the dielectric DE has not melted. Besides, the capacitance sensor circuit 15 outputs the detection signal COUT at the H-level when all of the dielectric DE has melted, that is, when the melting progresses and the capacitance value of the capacitor CAP0 is completely lower than the capacitance value of the capacitor CAP1. Thereby, it is determined whether the temperature around the capacitance sensor circuit 15 has reached the melting point of the dielectric DE.

According to the capacitance sensor circuit 15 of the example, the transmission device 100 can transmit, to the reception device 200, a binary signal ("H" or "L") indicating whether the dielectric DE has melted. Thereby, in the device on the receiving side, a configuration for determining whether the dielectric has melted based on, for example, the impedance of the capacitor (a memory for storing threshold information of the impedance, a melting determination part for comparing the measured impedance and the threshold to determine the presence or absence of melting, or the like) is unnecessary. Accordingly, it is possible to reduce the current consumption for reading threshold information from the memory or an operation current of the melting determination part in the device on the receiving side.

In addition, according to the capacitance sensor circuit 15 of the example, the potentials of the nodes n0 and n1 increase only in the first charging period CP1, the first charging detection period CDP1, the second charging period CP2, the second charging detection period CDP2, the third charging period CP3, and the third charging detection period CDP3, and the potentials are reduced or maintained at a constant potential in other periods. That is, the current is consumed only in the first charging period CP1, the first charging detection period CDP1, the second charging period CP2, the second charging detection period CDP2, the third charging period CP3, and the third charging detection period CDP3, and the current is not consumed in other periods. Therefore, even when the electrostatic capacitance of the capacitor CAP0 and the electrostatic capacitance of the capacitor CAP1 have substantially the same capacitance value, the current consumption of the entire circuit can be suppressed.

That is, when the capacitance sensor circuit 15 is different from that of the example and has a configuration in which the exclusive logic gate circuit 36 does not have the inverters INV3 and the NAND3, and the NOR0 outputs a signal of negative OR of the outputs of the NOR1 and the NOR2 to the node n8, the differential amplifier part 35 always outputs the same potential in the period in which the capacitors CAP0 and CAP1 have substantially the same capacitance value (the period T2), and thus the differential amplifier part 35 keeps the current flowing even if the charging detection period ends. In contrast, according to the capacitance sensor circuit 15 of the example, the current flows only in the second charging period CP2 and the second charging detection period CDP2 in the period T2, and thus the current consumption can be reduced compared to the case in which the exclusive logic gate circuit 36 outputs only the negative OR of the NOR0 and NOR1. In particular, the current consumption can be further suppressed by lengthening a clock cycle (that is, by lowering the frequency) of the clock signal CLKIN.

In this manner, according to the capacitance sensor circuit 15 of the example, even when the capacitors CAP0 and CAP1 have substantially the same capacitance value, the determination result on whether the substance between the capacitor electrodes outside the semiconductor integrated circuit has melted can be transmitted to the reception device 200 without increasing the current consumption.

Example 2

Figure 5:
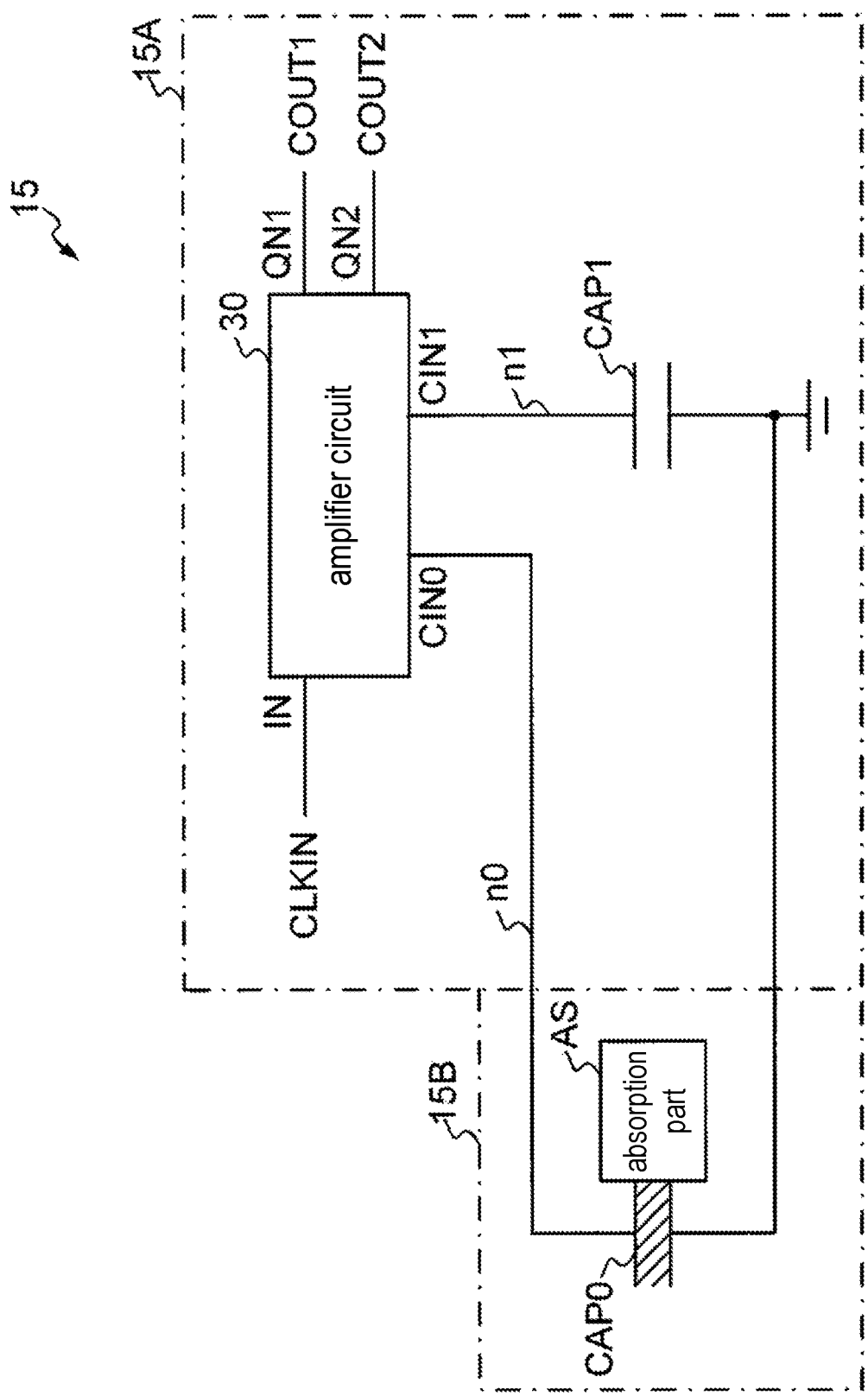
FIG. 5 is a block diagram showing a configuration of a capacitance sensor circuit of Example 2.

Next, Example 2 of the disclosure is described. FIG. 5 is a block diagram showing a configuration of the capacitance sensor circuit 15 of the example. The capacitance sensor circuit 15 of the example is different from the capacitance sensor circuit 15 of Example 1 in that the amplifier circuit 30 outputs an error flag signal COUT2 in addition to a detection signal COUT1 indicating the sensor result.

The error flag signal COUT2 is a signal indicating whether the electrostatic capacitance of the capacitor CAP0 and the electrostatic capacitance of the capacitor CAP1 have substantially the same capacitance value. The amplifier circuit 30 outputs an error flag signal COUT2 at the H-level when the electrostatic capacitances of the capacitors CAP0 and CAP1 have substantially the same capacitance value. In addition, the amplifier circuit 30 outputs an error flag signal COUT2 at the L-level when the electrostatic capacitances of the capacitors CAP0 and CAP1 have different capacitance values.

Figure 6:
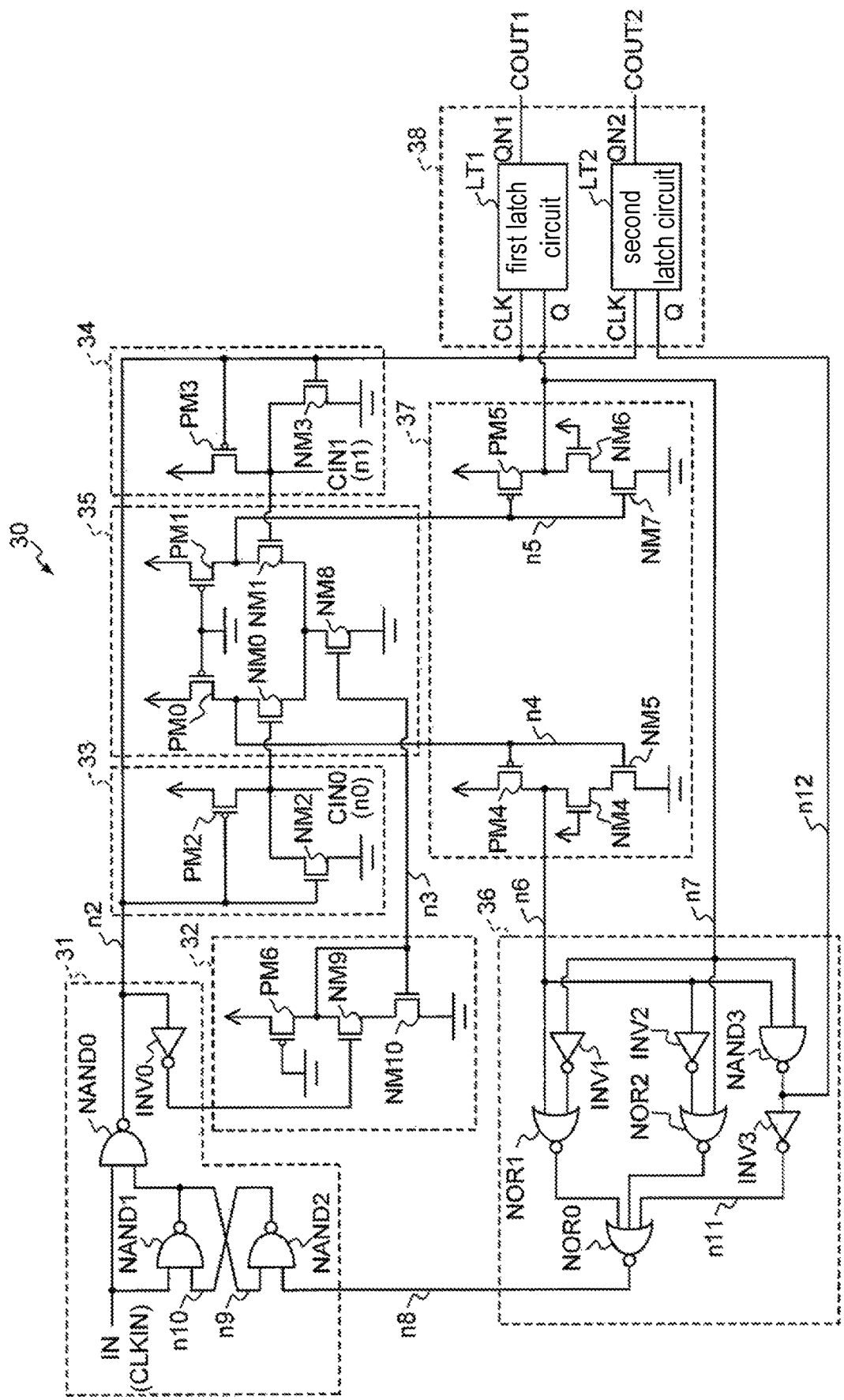
FIG. 6 is a circuit diagram showing a configuration of an amplifier circuit included in the capacitance sensor circuit of Example 2.

FIG. 6 is a circuit diagram showing a configuration of the amplifier circuit 30. The amplifier circuit 30 of the example is common to the amplifier circuit 30 of Example 1 in the configurations of the control part 31, the bias signal generation part 32, the first current supply part 33, the second current supply part 34, the differential amplifier part 35, the exclusive logic gate circuit 36, and the inverter part 37, and is different from the amplifier circuit 30 of Example 1 in the configuration of the data latch part 38.

The data latch part 38 includes a first latch circuit LT1 and a second latch circuit LT2. Each of the first latch circuit LT1 and the second latch circuit LT2 has the clock terminal CLK, the signal input terminal Q, and the output terminal QN.

The clock terminal CLK of the first latch circuit LT1 is connected to the gates of the transistors PM3 and NM3 and is connected to the node n2. The signal input terminal Q of the first latch circuit LT1 is connected to a node connecting the drains of the transistors PM5 and NM6 and is connected to the node n7.

The clock terminal CLK of the second latch circuit LT2 is connected to the clock terminal CLK of the first latch circuit LT1 or the gates of the transistors PM3 and NM3, and is connected to the node n2. The signal input terminal Q of the second latch circuit LT2 is connected to a node n12, and is connected to the output end of the NAND3 and the input end of the INV3.

Each of the first latch circuit LT1 and the second latch circuit LT2 captures the data input to the signal input terminal Q when the clock signal input to the clock terminal CLK is at the L-level (that is, the ground potential level). In addition, when the clock signal input to the clock terminal CLK transitions from the L-level to the H-level (that is, the power supply potential level), each of the first latch circuit LT1 and the second latch circuit LT2 outputs, from the output terminal QN, an inverted signal of the data captured when the clock signal is at the L-level. Then, each of the first latch circuit LT1 and the second latch circuit LT2 continues to output the same output data (that is, the output data is held) until the clock signal input to the clock terminal CLK transitions from the L-level to the H-level again.

The first latch circuit LT1 is an output part which outputs and holds a binary detection signal COUT1 indicating whether the electrostatic capacitance of the capacitor CAP0 has changed from the first capacitance to the second capacitance based on the potential difference amplified by the differential amplifier part 35. On the other hand, the second latch circuit LT2 is an output part which outputs and holds a binary error flag signal COUT2 indicating whether the electrostatic capacitance of the capacitor CAP0 and the electrostatic capacitance of the capacitor CAP1 are equal to each other based on the output of the NAND3.

Figure 7:
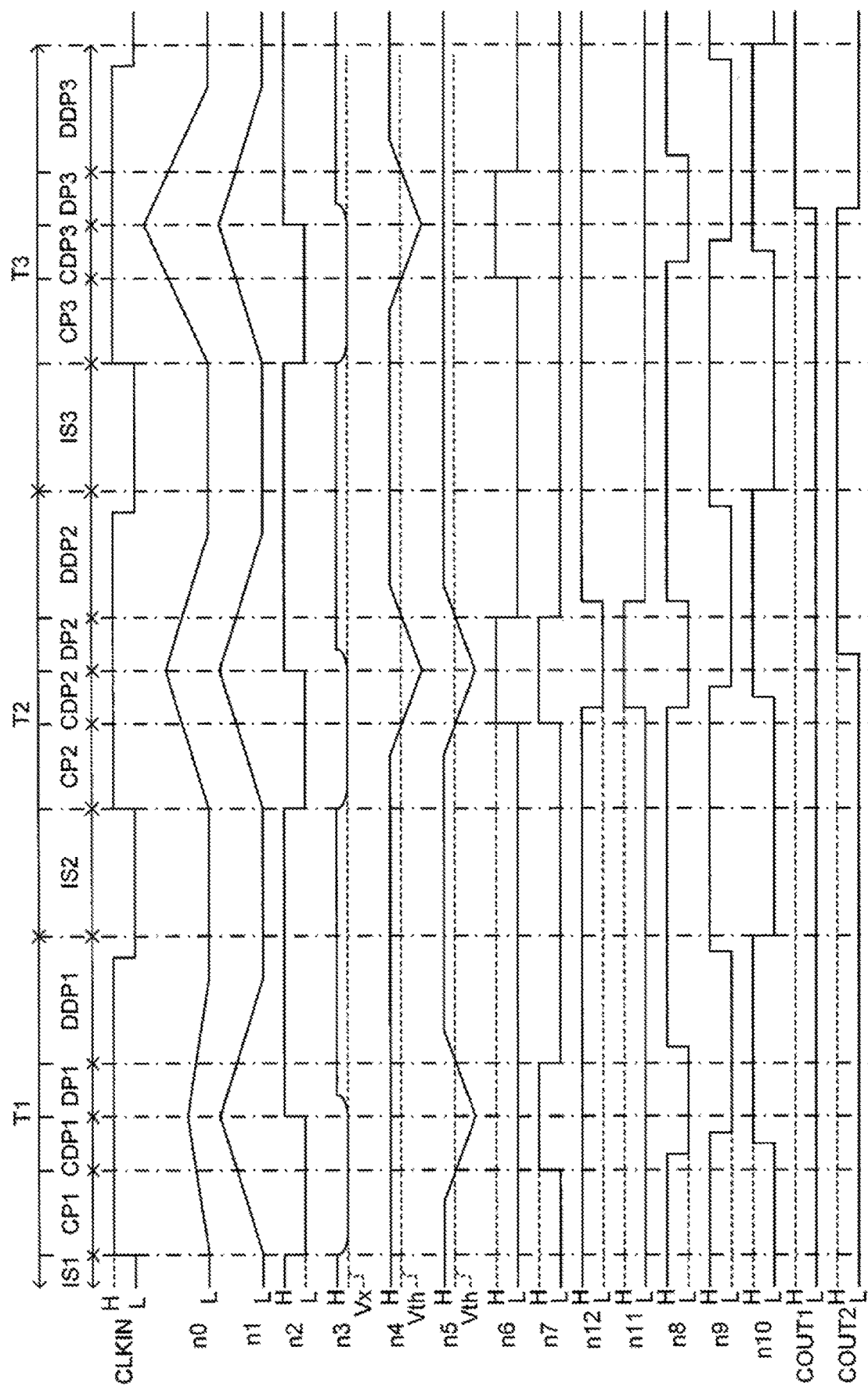
FIG. 7 is a time chart showing the operation of the capacitance sensor circuit of Example 2.

Next, the operation of the capacitance sensor circuit 15 of the example is described with reference to a time chart in FIG. 7. Similar to Example 1, the operation of the capacitance sensor circuit 15 is described, wherein a period in which the dielectric DE between the electrodes of the capacitor CAP0 has not melted is set as the period T1, a period in which the dielectric DE has melted to some extent and the electrostatic capacitance of the capacitor CAP0 and the electrostatic capacitance of the capacitor CAP1 have substantially the same capacitance value is set as the period T2, and a period after all of the dielectric DE has melted is set as the period T3.

First, the operation of the capacitance sensor circuit 15 in the period T1 is described.

[First Initial State IS1]

When the clock signal CLKIN at the L-level is input to the input terminal IN of the amplifier circuit 30, the potential of the node n2 becomes the H-level. Thereby, the potentials of the nodes n0 and n1 become the L-level, and the potentials of the nodes n3, n4, and n5 become the H-level.

In addition, the potentials of the nodes n6 and n7 become the L-level, the potential of the node n8 becomes the H-level, the potential of the node n9 becomes the H-level, the potential of the node n10 becomes the L-level, and the potential of the node n11 becomes the L-level. In FIG. 7, the period of this state is shown as a first initial state IS1.

In the first initial state IS1, since the potential of the node n2 is at the H-level, the value of a detection signal COUT1 output from the output terminal QN of the latch circuit LT1 holds the previous data value. That is, since the dielectric DE between the electrodes of the capacitor CAP0 is in a state before melting, the detection signal COUT1 at the L-level is output.

Similarly, since the potential of the node n2 is at the H-level, the value of the error flag signal COUT2 output from the output terminal QN of the second latch circuit LT2 also holds the previous data value. That is, since the electrostatic capacitance of the capacitor CAP0 is larger than the electrostatic capacitance of the capacitor CAP1, the error flag signal COUT2 at the L-level is output.

[First Charging Period CP1]

After that, when the clock signal CLKIN becomes the H-level, the potential of the node n2 becomes the L-level. The potential of the node n2 is inverted by the inverter INV0, and the inverted signal at the H-level is applied to the gate of the transistor NM9. Thereby, the bias signal generation part 32 operates, and the node n3 becomes an intermediate potential Vx. Thereby, a bias signal at the intermediate potential Vx level is supplied to the gate of the transistor NM8 which is a constant current source.

In addition, since the potential of the node n2 is at the L-level, the transistors NM2 and NM3 are both turned off, and the transistors PM2 and PM3 are both turned on. Thereby, the capacitor CAP0 is charged via the CIN0 terminal, and the capacitor CAP1 is charged via the CIN1 terminal.

Since the dielectric DE has not melted in the period T1, the capacitance value of the capacitor CAP0 is the first capacitance, which is larger than the third capacitance that is the capacitance value of the capacitor CAP1. Accordingly, the capacitor CAP1 is charged earlier than the capacitor CAP0, and the potential of the node n1 increases earlier than that of the node n0.

The potential of the node n1 is applied to the gate of the transistor NM1, and the potential of the node n5 is reduced due to the operation of the differential amplifier part 35. On the other hand, since the potential of the node n0 increases later than that of the node n1, the potential of the node n4 is hardly reduced due to the function of the differential amplifier part 35. In FIG. 7, the period of this state is shown as a first charging period CP1.

[First Charging Detection Period CDP1]

After that, when the potential of the node n5 is reduced to the threshold level Vth of the inverter part 37, the potential of the node n7 becomes the H-level, and the input signal at the H-level is captured from the signal input terminal Q to the latch circuit LT. In addition, since the potential of the node n6 is at the L-level, the potential of the node n12 is maintained at the H-level and the potential of the node n11 is maintained at the L-level even when the potential of the node n7 becomes the H-level. Thereby, the input signal at the H-level is captured from the signal input terminal Q to the second latch circuit LT2. In FIG. 7, the period of this state is shown as a first charging detection period CDP1.

In the first charging detection period CDP1, the potentials of the nodes n8, n10, and n9 change sequentially with a time difference. Specifically, the potential of the node n7 becomes the H-level, and thereby the potential of the node n8 becomes the L-level. The potential of the node n10 becomes the H-level corresponding to the change in the potential of the node n8. The potential of the node n9 becomes the L-level corresponding to the change in the potential of the node n10.

[First Discharging Period DP1]

The potential of the node n9 becomes the L-level, and thereby the potential of the node n2 changes to the H-level. Thereby, a signal at the H-level is supplied as a clock signal to the clock terminal CLK of the first latch circuit LT1. At this time, since the node n7 is at the H-level, the signal at the H-level is captured to the signal input terminal Q. Accordingly, the first latch circuit LT1 outputs the inverted signal QN at the L-level as the output signal COUT from the output terminal QN.

Similarly, a signal at the H-level is supplied as a clock signal to the clock terminal CLK of the second latch circuit LT2. At this time, since the node n12 is at the H-level, the signal at the H-level is captured to the signal input terminal Q. Accordingly, the second latch circuit LT2 outputs the inverted signal QN at the L-level as the error flag signal COUT2 from the output terminal QN.

In addition, when the potential of the node n2 becomes the H-level, an inverted signal at the L-level obtained by inverting the potential of the node n2 is applied to the gate of the transistor NM9. Thereby, the bias signal generation part 32 is turned off (that is, in a non-operating state), and the potential of the node n3 becomes the H-level. Thereby, a bias signal at the H-level is supplied to the gate of the transistor NM8, and the transistor NM8 serving as a constant current source is turned on. In addition, since the transistors NM2 and NM3 are turned on and the transistors PM2 and PM3 are turned off, the capacitors CAP0 and CAP1 are discharged via the CIN0 terminal and the CIN1 terminal. In FIG. 7, the period of this state is shown as a first discharging period DP1.

[First Discharging Detection Period DDP1]

After that, when the potential of the node n5 increases to the threshold level Vth of the inverter part 37, the potential of the node n7 becomes the L-level and the potential of the node n8 becomes the H-level. After that, when the clock signal CLKIN becomes the L-level, the potential of the node n9 becomes the H-level and the potential of the node n10 becomes the L-level. In FIG. 7, the period of this state is shown as a first discharging detection period DDP1.

Next, the operation of the capacitance sensor circuit 15 in the period T2 (that is, a state in which the dielectric DE has melted to some extent and is partially absorbed by the absorption part AS, and the electrostatic capacitance of the capacitor CAP0 and the electrostatic capacitance of the CAP1 become substantially the same capacitance value) is described.

[Second Initial State IS2]

When the clock signal CLKIN of the L-level is input to the input terminal IN of the amplifier circuit 30, the potential of the node n2 becomes the H-level. Thereby, the potentials of the nodes n0 and n1 become the L-level, and the potentials of the nodes n3, n4, and n5 become the H-level. In addition, the potentials of the nodes n6 and n7 become the L-level, the potential of the node n12 becomes the H-level, the potential of the node n11 becomes the L-level, the potential of the node n8 becomes the H-level, the potential of the node n9 becomes the H-level, and the potential of the node n10 becomes the L-level. In FIG. 7, the period of this state is shown as a second initial state IS2.

In the second initial state IS2, since the potential of the node n2 becomes the H-level, the L-level that is the previous data value is held as the detection signal COUT1 output from the output terminal QN of the first latch circuit LT1. Similarly, the L-level that is the previous data value is held as the error flag signal COUT2 output from the output terminal QN of the second latch circuit LT2.

[Second Charging Period CP2]

After that, when the clock signal CLKIN becomes the H-level, the potential of the node n2 becomes the L-level. The potential of the node n2 is inverted by the inverter INV0, and an inverted signal at the H-level is applied to the gate of the transistor NM9. Thereby, the bias signal generation part 32 operates, and the node n3 becomes the intermediate potential Vx. Thereby, a bias signal at the intermediate potential Vx level is supplied to the gate of the transistor NM8 which is a constant current source.

In addition, since the potential of the node n2 is at the L-level, the transistors NM2 and NM3 are both turned off, and the transistors PM2 and PM3 are both turned on. Thereby, the capacitor CAP0 is charged via the CIN0 terminal, and the capacitor CAP1 is charged via the CIN1 terminal.

In the period T2, the dielectric DE has melted to some extent, and the capacitors CAP0 and CAP1 have substantially the same capacitance value (that is, the third capacitance). Therefore, the capacitor CAP0 and the capacitor CAP1 are charged at substantially the same speed, and the potentials of the nodes n0 and n1 increase at increase rate of the same degree (that is, a state in which the difference in the increase degree is less than a predetermined value).

The potential of the node n0 is applied to the gate of the transistor NM0, and the potential of the node n4 is reduced due to the operation of the differential amplifier part 35. On the other hand, the potential of the node n1 is applied to the gate of the transistor NM1, and the potential of the node n5 is reduced due to the operation of the differential amplifier part 35. Since the increase rates of the potentials of the nodes n0 and n1 are substantially the same, the potentials of the nodes n4 and n5 are also reduced at substantially the same reduction rate (that is, a state in which the difference in the reduction degree is less than a predetermined value). In FIG. 7, the period of this state is shown as a second charging period CP2.

[Second Charging Detection Period CDP2]

After that, when the potential of the node n4 is reduced to the threshold level Vth of the inverter part 37, the potential of the node n6 becomes the H-level. Similarly, when the potential of the node n5 is reduced to the threshold level Vth of the inverter part 37, the potential of the node n7 becomes the H-level. Since the reduction rates of the potentials of the nodes n4 and n5 are substantially the same, the potentials of the nodes n6 and n7 become the H-level substantially at the same time.

The potentials of the nodes n6 and n7 become the H-level, and thereby the potential of the node n12 becomes the L-level, and the potential of the node n11 becomes the H-level. In addition, the potentials of the nodes n8, n10, and n9 change sequentially with a time difference. Specifically, the potentials of the nodes n6 and n7 become the H-level, and the potential of the node n11 becomes the H-level, and thereby the potential of the node n8 becomes the L-level. Corresponding to the change in the potential of the node n8, the potential of the node n10 becomes the H-level. Corresponding to the change in the potential of the node n10, the potential of the node n9 becomes the L-level. In FIG. 7, the period of this state is shown as a second charging detection period CDP2.

[Second Discharging Period DP2]

Since the clock signal CLKIN is at the H-level and the potential of the node n9 becomes the L-level, the node n2 which is a negative AND of the clock signal CLKIN and the node n2 becomes the H-level. At this time, since the node n7 is at the H-level, an input signal at the H-level is captured to the signal input terminal Q of the first latch circuit LT1. Accordingly, the first latch circuit LT1 outputs the inverted signal QN at the L-level obtained by inverting the above input signal as the detection signal COUT1 from the output terminal QN. In addition, since the potential of the node n12 is at the L-level, the input signal at the L-level is captured to the signal input terminal Q of the second latch circuit LT2. Accordingly, the second latch circuit LT2 outputs the inverted signal QN at the H-level as the error flag signal COUT2 from the output terminal QN.

In addition, the potential of the node n2 becomes the H-level, and thereby an inverted signal at the L-level obtained by inverting the potential of the node n2 is applied to the gate of the transistor NM9. Thereby, the bias signal generation part 32 is turned off (that is, in a non-operating state), and the potential of the node n3 becomes the H-level. Thereby, a bias signal at the H-level is supplied to the gate of the transistor NM8, and the transistor NM8 serving as a constant current source is turned on. In addition, since the transistors NM2 and NM3 are turned on and the transistors PM2 and PM3 are turned off, the capacitors CAP0 and CAP1 are discharged via the CIN0 terminal and the CIN1 terminal. In FIG. 7, the period of this state is shown as a second discharging period DP2.

[Second Discharging Detection Period DDP2]

After that, when the potential of the node n4 increases to the threshold level Vth of the inverter part 37, the potential of the node n6 becomes the L-level. Similarly, when the potential of the node n5 increases to the threshold level Vth of the inverter part 37, the potential of the node n7 becomes the L-level. Thereby, the potential of the node 12 becomes the H-level, the potential of the node n11 becomes the L-level, and the potential of the node n8 becomes the H-level. After that, when the clock signal CLKIN becomes the L-level, the potential of the node n9 becomes the H-level and the potential of the node n10 becomes the L-level. In FIG. 7, the period of this state is shown as a second discharge detection period DDP2.

Next, the operation of the capacitance sensor circuit 15 in the period T3 (that is, a state in which all of the dielectric DE has melted and is absorbed by the absorption part AS) is described.

[Third Initial State IS3]

When the clock signal CLKIN at the L-level is input to the input terminal IN of the amplifier circuit 30, the potential of the node n2 becomes the H-level. Thereby, the potentials of the nodes n0 and n1 become the L-level, and the potentials of the nodes n3, n4, and n5 become the H-level. In addition, the potentials of the nodes n6 and n7 become the L-level, the potential of the node n12 becomes the H-level, the potential of the node n11 becomes the L-level, the potential of the node n8 becomes the H-level, the potential of the node n9 becomes the H-level, and the potential of the node n10 becomes the L-level. In FIG. 7, the period of this state is shown as a third initial state IS3.

In the third initial state IS3, since the potential of the node n2 is at the H-level, the L-level that is the previous data value is held as the detection signal COUT1 output from the output terminal QN of the first latch circuit LT1. In addition, the H-level that is the previous data value is held as the error flag signal COUT2 output from the output terminal QN of the second latch circuit LT2.

[Third Charging Period CP3]

After that, when the clock signal CLKIN becomes the H-level, the potential of the node n2 becomes the L-level. The potential of the node n2 is inverted by the inverter INV0, and an inverted signal at the H-level is applied to the gate of the transistor NM9. Thereby, the bias signal generation part 32 operates, and the node n3 becomes the intermediate potential Vx. Thereby, a bias signal at the intermediate potential Vx level is supplied to the gate of the transistor NM8 which is a constant current source.

In addition, since the potential of the node n2 is at the L-level, the transistors NM2 and NM3 are both turned off, and the transistors PM2 and PM3 are both turned on. Thereby, the capacitor CAP0 is charged via the CIN0 terminal, and the capacitor CAP1 is charged via the CIN1 terminal.

In the period T3, since the dielectric DE has melted, the capacitance value of the capacitor CAP0 is the second capacitance, which is smaller than the third capacitance that is the capacitance value of the capacitor CAP1. Accordingly, the capacitor CAP0 is charged earlier than the capacitor CAP1, and the potential of the node n0 increases earlier than that of the node n1.

The potential of the node n0 is applied to the gate of the transistor NM0, and the potential of the node n4 is reduced due to the operation of the differential amplifier part 35. On the other hand, since the potential of the node n1 increases later than that of the node n0, the potential of the node n5 is hardly reduced due to the function of the differential amplifier part 35. In FIG. 7, the period of this state is shown as a third charging period CP3.

[Third Charging Detection Period CDP3]

After that, when the potential of the node n4 is reduced to the threshold level Vth of the inverter part 37, the potential of the node n6 becomes the H-level. On the other hand, since the potential of the node n5 is not reduced, the node n7 is maintained at the L-level, and an input signal at the L-level is captured from the signal input terminal Q to the first latch circuit LT1. In addition, since the potential of the node n7 is at the L-level, the potential of the node n12 is maintained at the H-level and the potential of the node n11 is maintained at the L-level even when the potential of the node n6 changes to the H-level. In FIG. 7, the period of this state is shown as a third charging detection period CDP3.

In the third charge detection period CDP3, the potentials of the nodes n8, n10, and n9 change sequentially with a time difference. Specifically, the potential of the node n6 becomes the H-level, and thereby the potential of the node n8 becomes the L-level. Corresponding to the change in the potential of the node n8, the potential of the node n10 becomes the H-level. Corresponding to the change in the potential of the node n10, the potential of the node n9 becomes the L-level.

[Third Discharging Period DP3]

The potential of the node n9 becomes the L-level, and thereby the potential of the node n2 becomes the H-level. Thereby, a signal at the H-level is supplied as a clock signal to the clock terminal CLK of the first latch circuit LT1. At this time, since the node n7 is at the L-level, the signal at the L-level is captured to the signal input terminal Q. Accordingly, the first latch circuit LT1 outputs the inverted signal QN at the H-level as the detection signal COUT1 from the output terminal QN.

In addition, a signal at the H-level is supplied as a clock signal to the clock terminal CLK of the second latch circuit LT2. At this time, since the node n12 is at the H-level, the signal at the H-level is captured to the signal input terminal Q. Accordingly, the second latch circuit LT2 outputs the inverted signal QN at the L-level as the error flag signal COUT2 from the output terminal QN.

In addition, the potential of the node n2 becomes the H-level, and thereby an inverted signal at the L-level obtained by inverting the potential of the node n2 is applied to the gate of the transistor NM9. Thereby, the bias signal generation part 32 is turned off (that is, in a non-operating state), and the potential of the node n3 becomes the H-level. Thereby, a bias signal at the H-level is supplied to the gate of the transistor NM8, and the transistor NM8 serving as a constant current source is turned on. In addition, since the transistors NM2 and NM3 are turned on and the transistors PM2 and PM3 are turned off, the capacitors CAP0 and CAP1 are discharged via the CIN0 terminal and the CIN1 terminal. In FIG. 7, the period of this state is shown as a third discharging period DP3.

[Third Discharging Detection Period DDP3]

After that, when the potential of the node n4 increases to the threshold level Vth of the inverter part 37, the potential of the node n6 becomes the L-level and the potential of the node n8 becomes the H-level. After that, when the clock signal CLKIN becomes the L-level, the potential of the node n9 becomes the H-level and the potential of the node n10 becomes the L-level. In FIG. 7, the period of this state is shown as a third discharging detection period DDP3.

As described above, in the capacitance sensor circuit 15 of the example, when the dielectric DE between the electrodes of the capacitor CAP0 has not yet melted, the amplifier circuit 30 outputs the detection signal COUT1 at the L-level and the error flag signal COUT2 at the L-level. When the dielectric DE has melted to some extent and the electrostatic capacitance of each of the capacitors CAP0 and CAP1 becomes substantially the same capacitance value, the amplifier circuit 30 outputs the detection signal COUT1 at the L-level and the error flag signal COUT2 at the H-level. Then, when all of the dielectric DE has melted, the amplifier circuit 30 outputs the detection signal COUT1 at the H-level and the error flag signal COUT2 at the L-level. As described above, according to the capacitance sensor circuit 15 of the example, in addition to the information on whether the dielectric DE has melted, the information on whether the capacitors CAP0 and CAP1 have substantially the same capacitance value can be output.

In addition, similar to the case of Example 1, the current is consumed only in the first charging period CP1, the first charging detection period CDP1, the second charging period CP2, the second charging detection period CDP2, the third charging period CP3, and the third charging detection period CDP3, and the current is not consumed in other periods. Therefore, even when the electrostatic capacitance of the capacitor CAP0 and the electrostatic capacitance of the capacitor CAP1 have substantially the same capacitance value, the current consumption of the entire circuit can be suppressed by setting the clock signal CLKIN to a low frequency.

That is, according to the capacitance sensor circuit 15 of the example, even when the capacitors CAP0 and CAP1 have substantially the same capacitance value, the determination result on whether the substance between the capacitor electrodes outside the semiconductor integrated circuit has melted can be transmitted to the reception device 200 without increasing the current. In addition, the determination result on whether the capacitors CAP0 and CAP1 have substantially the same capacitance value can be transmitted to the reception device 200.

Example 3

Figure 8:
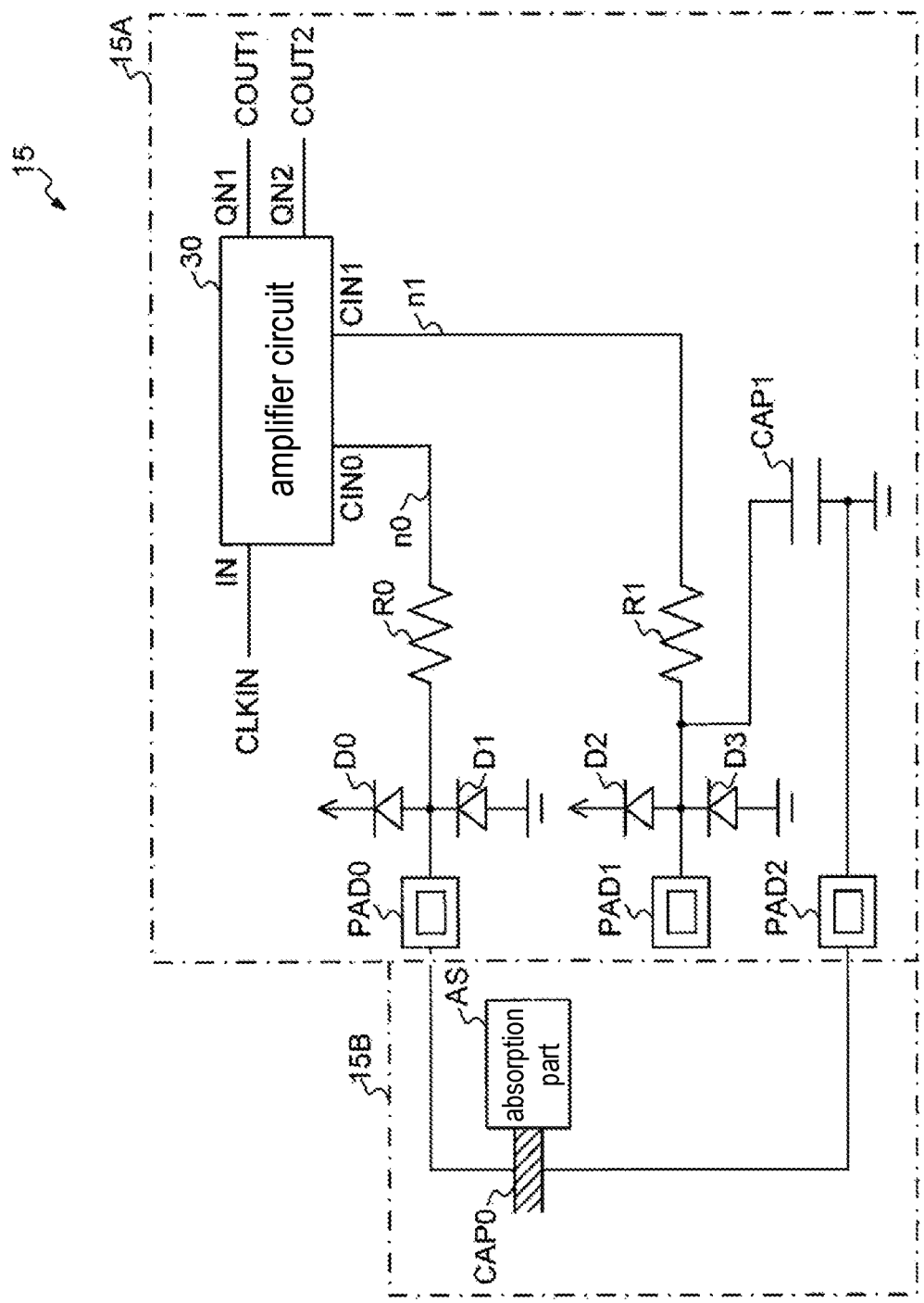
FIG. 8 is a block diagram showing a configuration of a capacitance sensor circuit of Example 3.

Next, Example 3 of the disclosure is described. FIG. 8 is a block diagram showing a configuration of the capacitance sensor circuit 15 of the example. The capacitance sensor circuit 15 of the example is different from the capacitance sensor circuit 15 of Example 2 in terms of including resistors R0 and R1, diodes D0, D1, D2, and D3, and a PAD0, a PAD1, and a PAD2.

The resistors R0 and R1 are resistors for countermeasures against static electricity and have the same resistance value. One end of the resistor R0 is connected to the node n0. The other end of the resistor R0 is connected to the anode of the diode D0 and the cathode of the diode D1. One end of the resistor R1 is connected to the node n1. The other end of the resistor R1 is connected to the cathode of the diode D2, the anode of the diode D3, and the PAD1, and is also connected to one end of the capacitor CAP1.

The diodes D0, D1, D2 and D3 are diodes for countermeasures against static electricity, and are configured so that the parasitic capacitance of each cathode and the parasitic capacitance of each anode all have the same capacitance value. The anode of the diode D0 and the cathode of the diode D1 are connected to each other. The cathode of the diode D0 is connected to the power source, and the anode of the diode D1 is grounded. The anode of the diode D2 and the cathode of the diode D3 are connected to each other. The cathode of the diode D2 is connected to the power source, and the anode of the diode D3 is grounded.

The PAD0, PAD1, and PAD2 are bonding pads, and all have parasitic capacitances having the same capacitance value. One end of the capacitor CAP0 is connected, via the PAD0, to the other end of the resistor R0, the anode of the diode D0, and the cathode of the diode D1. The other end of the capacitor CAP0 is grounded in common with the other end of the capacitor CAP1 via the PAD2.

Since the resistors R0 and R1 have the same resistance value, the resistance value from the node n0 to one end of the capacitor CAP0 is the same as the resistance value from the node n1 to one end of the capacitor CAP1. In addition, the parasitic capacitance configured by the anode of the diode D0, the cathode of the diode D1, and the PAD0 is the same as the parasitic capacitance configured by the anode of the diode D2, the cathode of the diode D3, and the PAD1.

Therefore, a circuit in which the same resistance and the same parasitic capacitance are respectively added to the nodes n0 and n1 of the capacitance sensor circuit 15 of Example 2 shown in FIG. 5 becomes the capacitance sensor circuit 15 of the example shown in FIG. 8. Accordingly, the capacitance sensor circuit 15 of the example performs the same operation as the capacitance sensor circuit 15 of Example 2.

Moreover, since the capacitance sensor circuit 15 of the example is equipped with the resistors R0 and R1 for countermeasures against static electricity and the diodes D0, D1, D2, and D3, the resistance to static electricity is higher than that of the capacitance sensor circuit 15 of Example 2. In addition, when a wiring of the capacitor CAP0 arranged in the external circuit 15B outside the semiconductor integrated circuit serves as an antenna and receives noise, the resistance value of the resistor R0 or the parasitic capacitance of the resistor R0 and the node n0 functions as a filter, and thus the noise resistance is high.

Therefore, according to the example, it is possible to implement a capacitance sensor circuit with high resistance to static electricity or noise resistance while suppressing current consumption of the entire circuit.

Example 4

Figure 9:
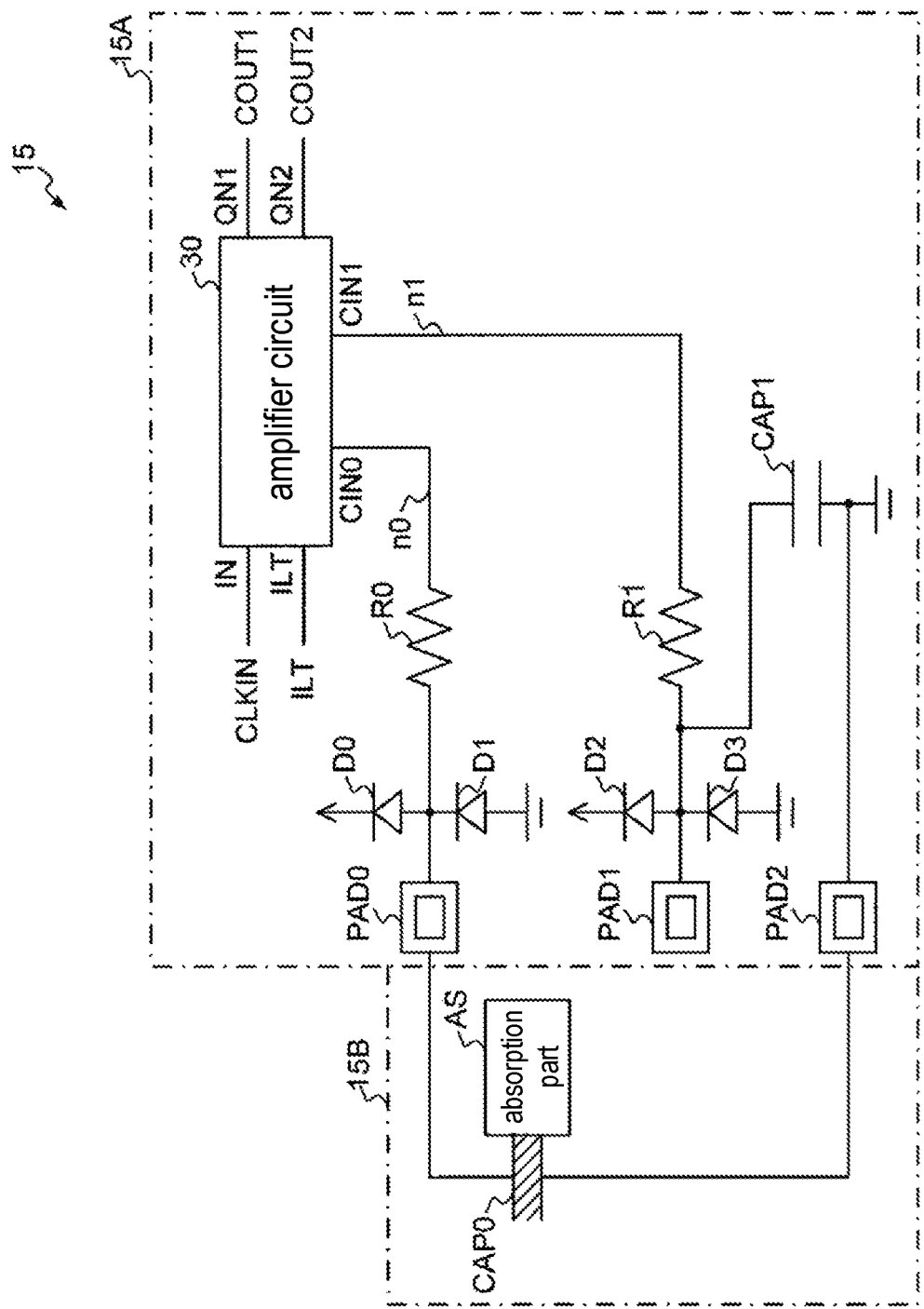
FIG. 9 is a block diagram showing a configuration of a capacitance sensor circuit of Example 4.

Next, Example 4 of the disclosure is described. FIG. 9 is a block diagram showing a configuration of the capacitance sensor circuit 15 of the example. The capacitance sensor circuit 15 of the example is different from the capacitance sensor circuit 15 of Example 3 in that a leak test signal ILT is also input to the amplifier circuit 30 in addition to the clock signal CLKIN.

The capacitance sensor circuit 15 of the example can switch between a normal mode for performing a normal operation and a leak test mode for executing a leak test. The leak test signal ILT is a switching signal for performing the mode switching, and becomes the H-level in the leak test mode and becomes the L-level in the normal mode. The leak test signal ILT is supplied to the input terminal ILT of the amplifier circuit 30.

Figure 10:
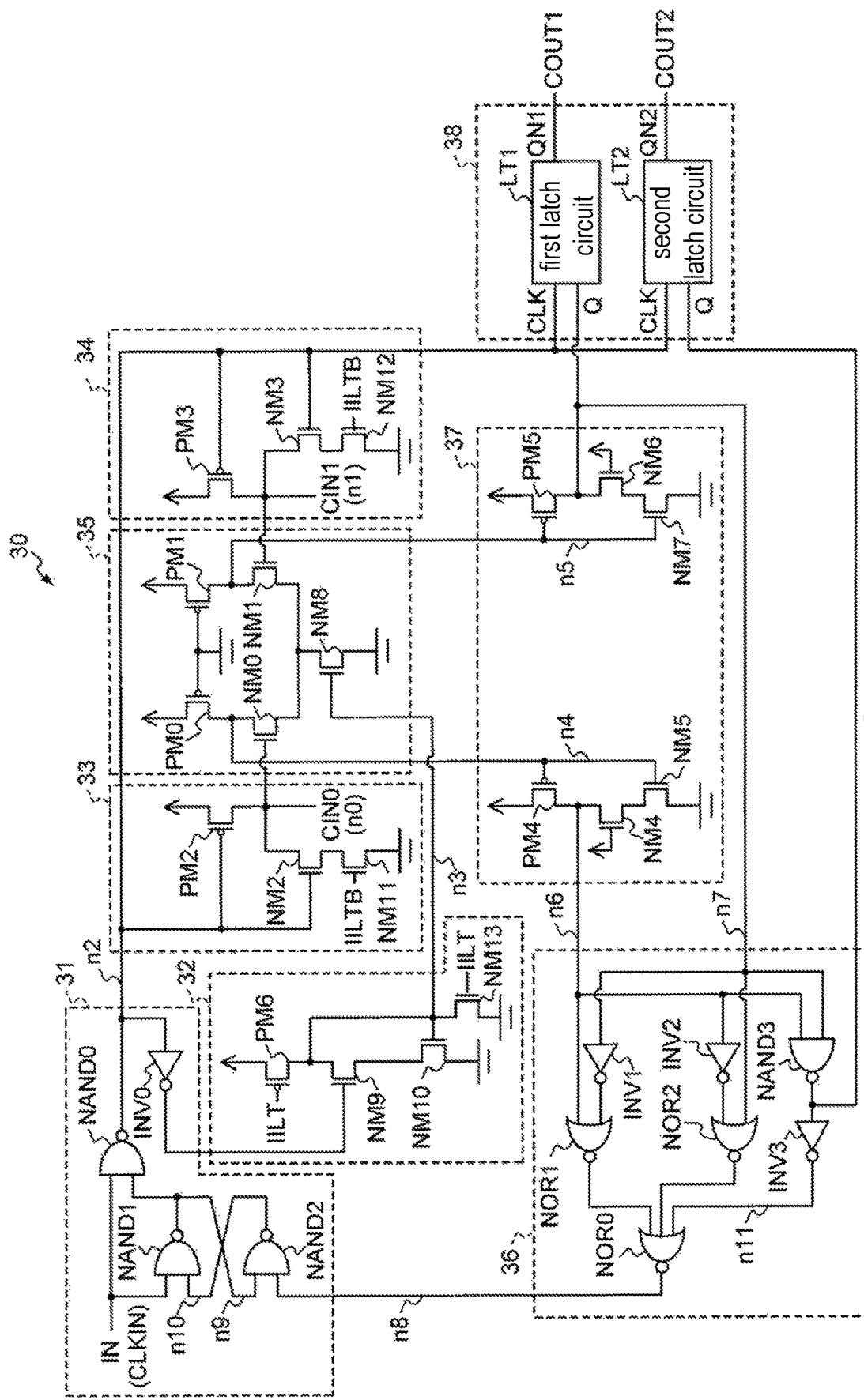
FIG. 10 is a circuit diagram showing a configuration of an amplifier circuit included in the capacitance sensor circuit of Example 4.

FIG. 10 is a circuit diagram showing a configuration of the amplifier circuit 30. In addition, FIG. 11 is a circuit diagram showing a configuration of a second control part 39 which is a part of the amplifier circuit 30.

As shown in FIG. 10, the amplifier circuit 30 of the example is in common with the amplifier circuit 30 of Example 1 in the configurations of the control part 31, the differential amplifier part 35, the exclusive logic gate circuit 36, the inverter part 37, and the data latch part 38, and is different from the amplifier circuit 30 of Example 1 in the configurations of the bias signal generation part 32, the first current supply part 33, and the second current supply part 34.

Figure 11:
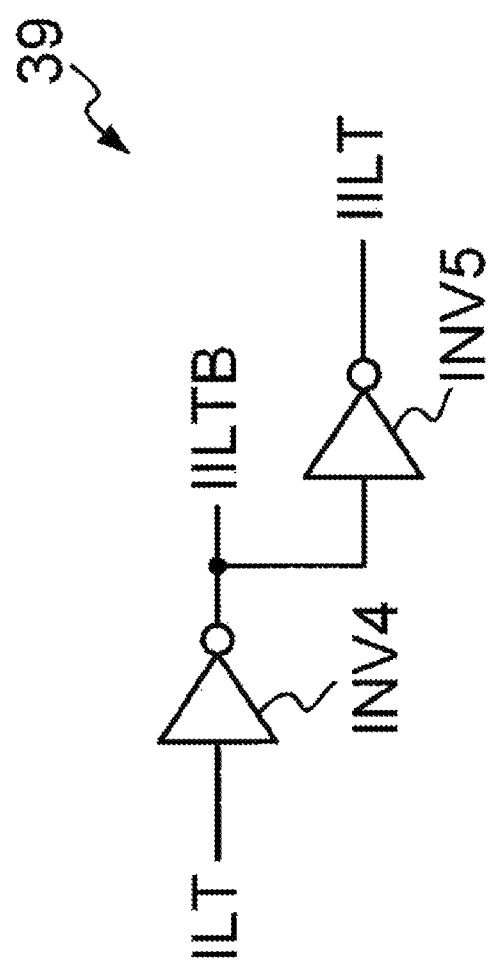
FIG. 11 is a circuit diagram showing a configuration of a second control circuit of Example 4.

In addition, the amplifier circuit 30 of the example is different from the amplifier circuit 30 of Example 1 in terms of including the second control part 39 shown in FIG. 11. The second control part 39 includes an inverter INV4 and an inverter INV5. An output end of the inverter INV4 is connected to an input end of the inverter INV5.

The leak test signal ILT is supplied to an input end of the inverter INV4. The inverter INV4 outputs an inverted signal IILTB, which is a signal obtained by inverting the leak test signal ILT, from the output end. The inverter INV5 receives supply of the inverted signal IILTB at the input end, and outputs a control signal IILT, which is a signal obtained by further inverting the inverted signal IILTB, from the output end.

Referring again to FIG. 10, the bias signal generation part 32 of the example includes a transistor PM6, a transistor NM9, a transistor NM10, and a transistor NM13. The configurations of the transistor NM9 and the transistor NM10 are the same as in Examples 1 to 3.

The transistor PM6 is configured by a P-channel MOSFET, and the source is connected to the power supply and the drain is connected to the node n3. The gate of the transistor PM6 is connected to the output end of the inverter INV5 of the second control part 39 shown in FIG. 11, and receives the supply of the control signal IILT.

The transistor NM13 is configured by an N-channel MOSFET. In the transistor NM13, the source is grounded, and the drain is connected to the node n3. The gate of the transistor NM13 is connected to the output end of the inverter INV5 of the second control part 39 shown in FIG. 11, and receives the supply of the control signal IILT.

The first current supply part 33 of the example includes a transistor PM2, a transistor NM2, and a transistor NM11. The configuration of the transistor PM2 is the same as in Examples 1 to 3.

The transistor NM2 is configured by an N-channel MOSFET, the gate is connected to the node n2 in common with the gate of the transistor PM2, and the drain is connected to one end of the capacitor CAP0 via the CIN0 terminal.

The transistor NM11 is configured by an N-channel MOSFET, and the source is grounded and the drain is connected to the drain of the transistor NM2. The gate of the transistor NM11 is connected to the output end of the inverter INV4 of the second control part 39 shown in FIG. 11, and receives the supply of the inverted signal IILTB.

The second current supply part 34 of the example includes a transistor PM3, a transistor NM3, and a transistor NM12. The configuration of the transistor PM3 is the same as in Examples 1 to 3.

The transistor NM3 is configured by an N-channel MOSFET, and the gate is connected to the node n2 in common with the gate of the transistor PM3 and the drain is connected to one end of the capacitor CAP0 via the CIN0 terminal.

The transistor NM12 is configured by an N-channel MOSFET, and the source is grounded and the drain is connected to the drain of the transistor NM3. The gate of the transistor NM12 is connected to the output end of the inverter INV4 of the second control part 39 shown in FIG. 11, and receives the supply of the inverted signal IILTB.

Next, the operation of the capacitance sensor circuit 15 of the example is described with reference to a time chart in FIG. 12.

[Normal Mode (Initial State 1)]

In the normal mode, the leak test signal ILT at the L-level is supplied to the amplifier circuit 30. At this time, the inverted signal IILTB becomes the H-level, and the control signal IILT becomes the L-level.

The transistor PM6 receives the supply of the control signal IILT at the L-level at the gate and is turned on. The transistor NM13 receives the supply of the control signal IILT at the L-level at the gate and is turned off.

The transistor NM11 receives the supply of the inverted signal IILTB at the H-level at the gate and is turned on. Similarly, the transistor NM12 receives the supply of the inverted signal IILTB at the H-level at the gate and is turned on.

Thereby, the amplifier circuit 30 of the example is in the same state as the amplifier circuit 30 of Example 2 shown in FIG. 6. Accordingly, the capacitance sensor circuit 15 of the example can execute the same operation as that of the capacitance sensor circuit of Example 3 as an operation in the normal mode. In FIG. 12, the period of this state is shown as a normal mode (initial state 1).

[Leak Test Mode]

In the leak test mode, the leak test signal ILT at the H-level is supplied to the amplifier circuit 30. At this time, the inverted signal IILTB becomes the L-level, and the control signal IILT becomes the H-level.

The transistor PM6 receives the supply of the control signal IILT at the H-level at the gate and is turned off. The transistor NM13 receives the supply of the control signal IILT at the H-level at the gate and is turned on.

The transistor NM11 receives the supply of the inverted signal IILTB at the L-level at the gate and is turned off. Similarly, the transistor NM12 receives the supply of the inverted signal IILTB at the L-level at the gate and is turned off.

Figure 12:
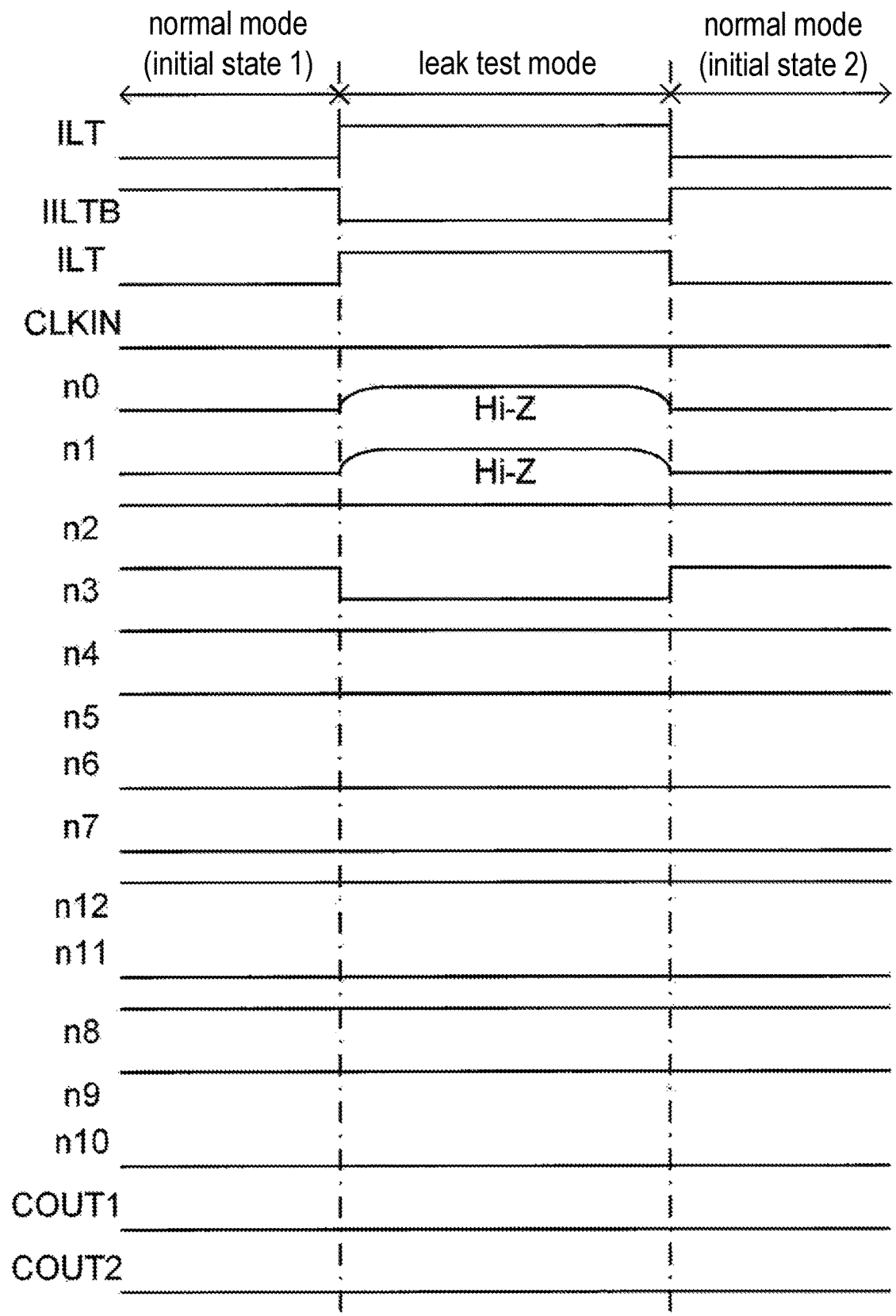
FIG. 12 is a time chart showing the operation of the capacitance sensor circuit of Example 4.

Thereby, both the node n0 and the node n1 come into a high impedance state (shown as Hi-Z in FIG. 12). In addition, the potential of the node n3 becomes the L-level.

The potential of the node n3 becomes the L-level, and thereby the transistor NM8 is turned off. Therefore, the through-current does not pass through the space between the bias signal generation part 32 and the differential amplifier part 35. In FIG. 12, the period of this state is shown as a leak test mode.

[Normal Mode (Initial State 2)]

When the signal level of the leak test signal ILT becomes the L-level again, the inverted signal IILTB becomes the H-level, and the control signal IILT becomes the L-level. The transistors PM6, NM11 and NM12 are turned on, and the transistor NM13 is turned off.

Thereby, the amplifier circuit 30 of the example comes into the same state as the amplifier circuit 30 of Example 2 shown in FIG. 6. Accordingly, the capacitance sensor circuit 15 of the example can execute the same operation as that of the capacitance sensor circuit of Example 3 as an operation in the normal mode. In FIG. 12, the period of this state is shown as a normal mode (initial state 2).

As described above, in the capacitance sensor circuit 15 of the example, the nodes n0 and n1 can be set in the high impedance state by supplying the leak test signal ILT at the H-level to the amplifier circuit 30. Therefore, according to the capacitance sensor circuit 15 of the example, it is possible to execute a screening test for detecting a short-circuit failure of the PAD0 or the like in a test process. That is, the configuration of the capacitance sensor circuit 15 of the example is effective for preventing the outflow of defective products.

Example 5

Figure 13:
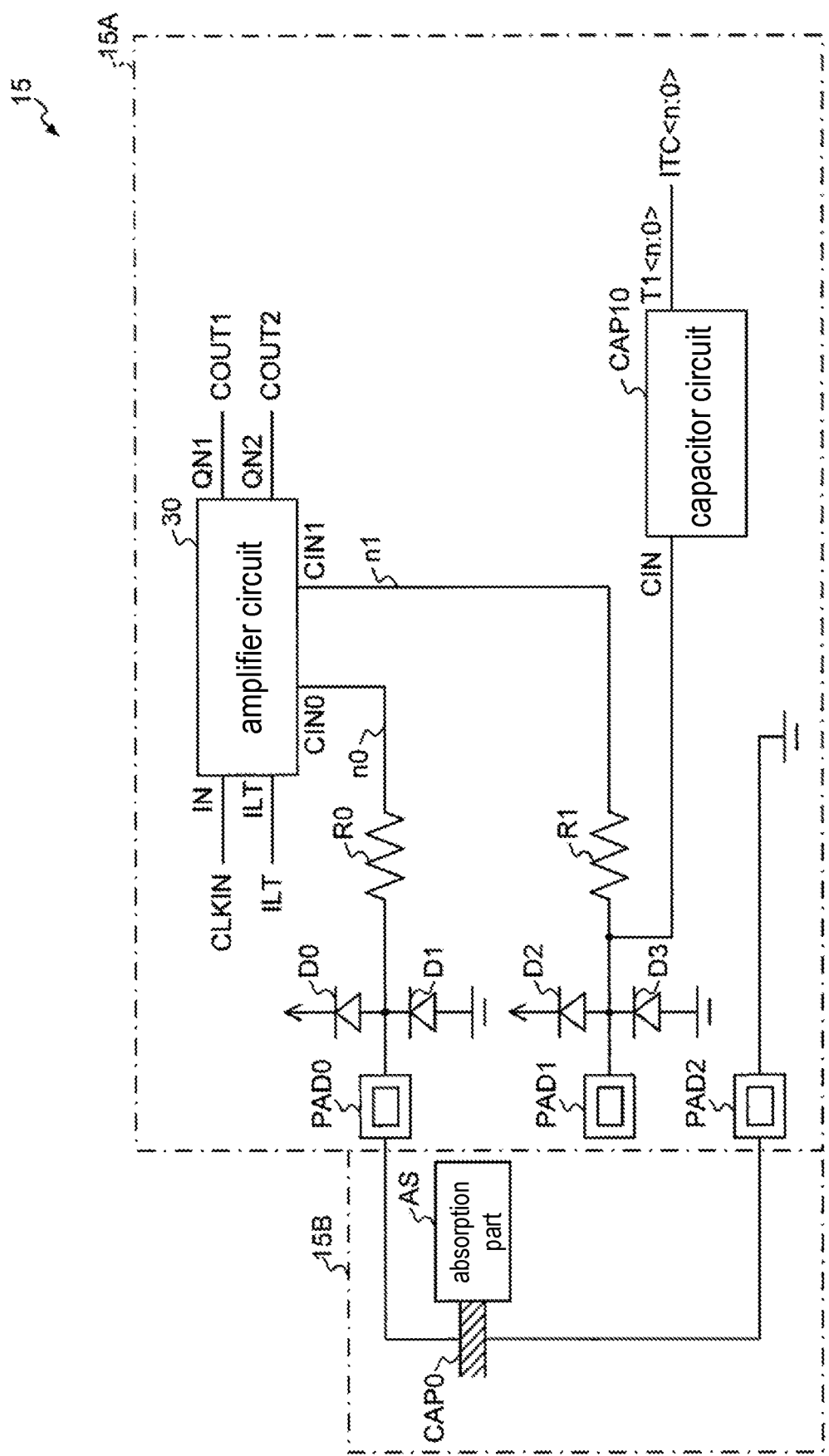
FIG. 13 is a block diagram showing a configuration of a capacitance sensor circuit of Example 5.

Next, Example 5 of the disclosure is described. FIG. 13 is a block diagram showing a configuration of the capacitance sensor circuit 15 of the example. The capacitance sensor circuit 15 of the example is different from the capacitance sensor circuit 15 of Example 4 shown in FIG. 9 in terms of including a capacitor circuit CAP10 instead of the capacitor CAP1.

The capacitor circuit CAP10 is a circuit that includes a plurality of capacitors and that is capable of selectably switching the capacitance value of the electrostatic capacitance of the entire circuit. A trimming signal ITC<n:0> for selecting the capacitance value is supplied to the capacitor circuit CAP10. The trimming signal ITC<n:0> is a signal of n+1 bits.

The capacitor circuit CAP10 has a CIN terminal connected to the amplifier circuit 30, and a signal input terminal T1<n:0> for n+1 bits that receives the supply of the trimming signal ITC<n:0>.

One end of the resistor R1 of the example is connected to the node n1. The other end of the resistor R1 is connected to the cathode of the diode D2, the anode of the diode D3, and the PAD1, and is also connected to the CIN terminal of the capacitor circuit CAP10.

Figure 14:
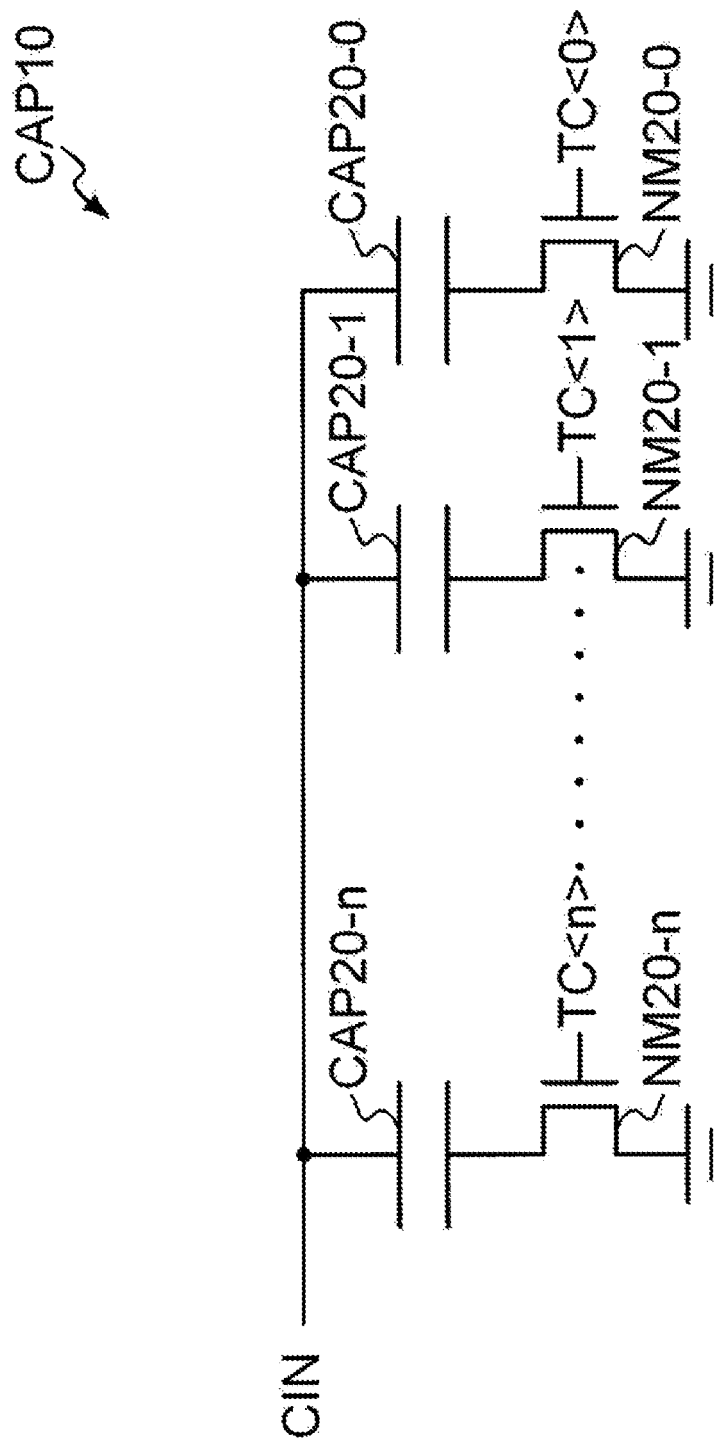
FIG. 14 is a circuit diagram showing a configuration of a capacitor circuit of Example 5.

FIG. 14 is a circuit diagram showing a configuration of the capacitor circuit CAP10. The capacitor circuit CAP10 includes (n+1) capacitors, which are capacitors CAP20-0, CAP20-1, . . . , and CAP20-n. In addition, the capacitor circuit CAP10 includes (n+1) transistors NM20-0, NM20-1, . . . , and NM20-n that are N-channel MOSFETs.

One end of each of the capacitors CAP20-0 to CAP20-n is connected to the CIN terminal via a common line. The other end of the capacitor CAP20-0 is connected to the drain of the transistor NM20-0. Similarly, the other ends of the capacitors CAP20-1 to CAP20-n are respectively connected to the drains of the transistors NM20-1 to NM20-n.

The source of each of the transistors NM20-0 to NM20-n is grounded. The gates of the transistors NM20-0 to NM20-n are connected to the signal input terminal T1<n:0>.

A selection signal TC<0> is supplied to the gate of the transistor NM20-0. Similarly, selection signals TC<1> to TC<n> are respectively supplied to the gates of the transistors NM20-1 to NM20-n. In the example, the selection signals TC<0> to TC<n> are signals forming each digit of the trimming signal ITC<n:0>, and have a signal level of "0" or "1" (that is, the L-level or H Level).

Next, the capacitance value selection operation of the capacitor circuit CAP10 in the capacitance sensor circuit 15 of the example is described.

For example, when the trimming signal ITC<n:0> is 0 h, the TC<0> to TC<n> are all "0", and the transistors NM20-0 to NM20-n are all turned off. In this state, none of the capacitors CAP20-0 to CAP20-n function as a capacitance.

When the trimming signal ITC<n:0> is 1 h, only the TC<0> is "1", and the TC<1> to TC<n> are all "0". Therefore, only the transistor NM20-0 is turned on, and the transistors NM20-1 to NM20-n are all turned off. In this state, the capacitor CAP20-0 functions as a capacitance, and the capacitors CAP20-1 to 20-n do not function as capacitances.

When the trimming signal ITC<n:0> is 2 h, only the TC<1> is "1", and the TC<0> and the TC<2> to TC<n> are all "0". Therefore, only the transistor NM20-1 is turned on, and the transistors NM20-0 and the transistors NM20-2 to NM20-n are all turned off. In this state, the capacitor CAP20-1 functions as a capacitance, and the capacitors CAP20-0 and CAP20-2 to 20-n do not function as capacitances.

In this manner, the capacitors CAP20-0 to 20-n can selectively function as capacitances by selectively turning on the transistors NM20-0 to 20-n. Besides, a plurality of transistors within the transistors NM20-0 to 20-n can also be turned on at the same time. That is, according to the trimming signal ITC<n:0> of n+1 bits, the capacitance value as the (n+1)th power of 2 can be selected.

As described above, according to the capacitance sensor circuit 15 of the example, the capacitance value of the capacitor circuit CAP10 can be appropriately selected by supplying the trimming signal ITC<n:0>. Thereby, the parasitic capacitance of the capacitor CAP0 outside the semiconductor integrated circuit can be cancelled. This is effective for precisely determining whether the dielectric DE between the electrodes of the capacitor CAP0 has melted.

Example 6

Figure 15:
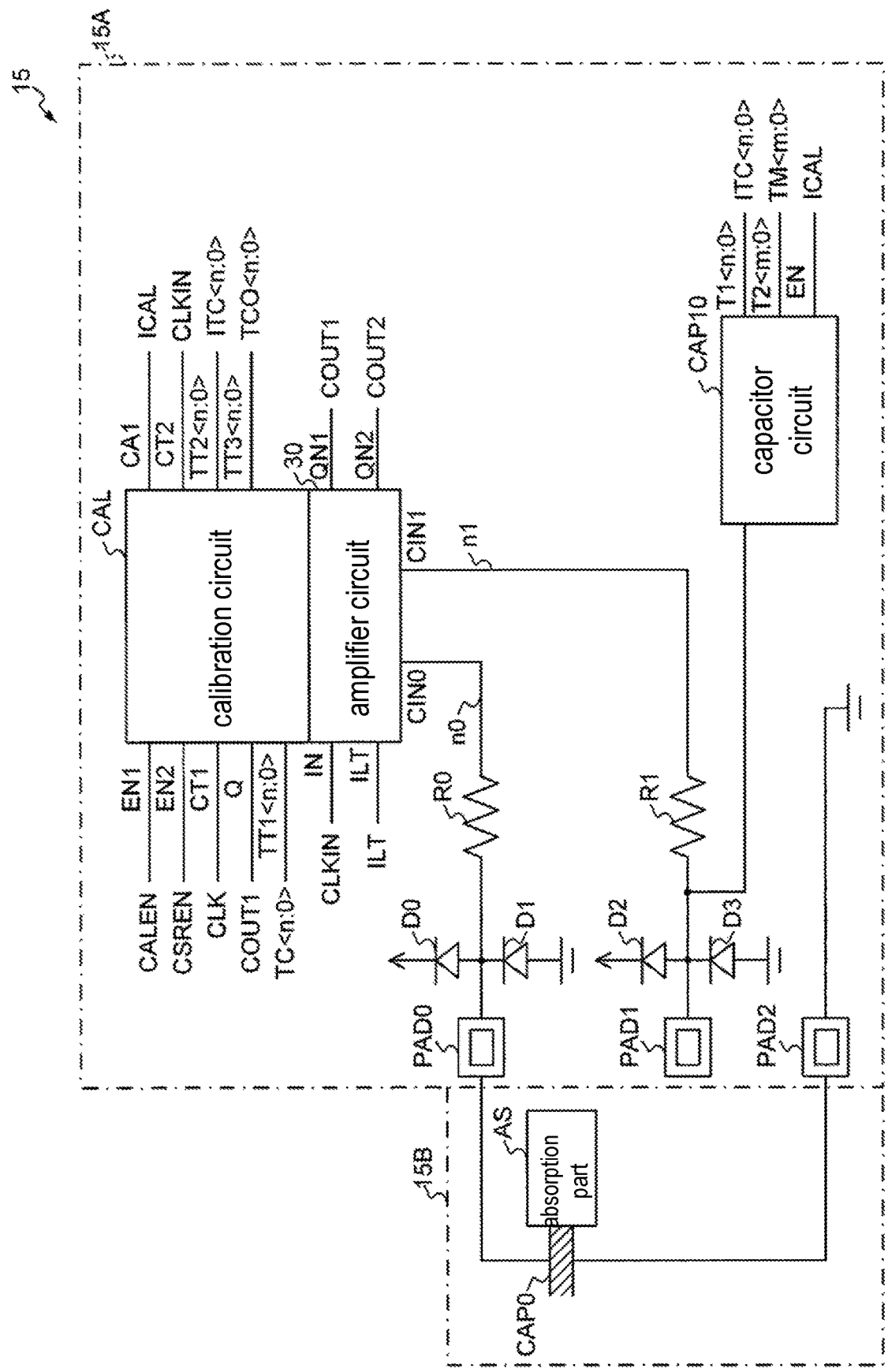
FIG. 15 is a block diagram showing a configuration of a capacitance sensor circuit of Example 6.

Next, Example 6 of the disclosure is described. FIG. 15 is a block diagram showing a configuration of the capacitance sensor circuit 15 of the example. The capacitance sensor circuit 15 of the example is different from the capacitance sensor circuit 15 of Example 5 shown in FIG. 13 in the configuration of the capacitor circuit CAP10 and in terms of including a calibration circuit CAL.

The capacitor circuit CAP10 of the example has a signal input terminal T1<n:0> for n+1 bits, a signal input terminal T2<m:0> for m+1 bits, and an enable terminal EN. A trimming signal ITC<n:0> of n+1 bits for selecting the capacitance value of the capacitor circuit CAP10 is supplied to the signal input terminal T1<n:0>.

A margin trimming signal TM<m:0> of m+1 bits for determining whether the dielectric DE between the electrodes of the capacitor CAP0 has melted is supplied to the signal input terminal T2<m:0>. A control signal ICAL is supplied to the enable terminal EN.

The calibration circuit CAL is a calibration circuit arranged to execute calibration of the amplifier circuit 30. The calibration circuit CAL has enable terminals EN1 and EN2.

A calibration enable signal CALEN is supplied to the enable terminal EN1. The calibration enable signal CALEN is a signal for switching between a normal mode for causing the amplifier circuit 30 to execute a normal operation and a calibration mode for causing the amplifier circuit 30 to execute a calibration operation, and becomes the H-level in the normal mode and becomes the L-level in the normal mode.

A capacitance sensor circuit enable signal CSREN is supplied to the enable terminal EN2. The capacitance sensor circuit enable signal CSREN is a signal for switching the capacitance sensor circuit 15 between an active state (that is, a state in which the normal operation is executed) and an inactive state. The inactive mode is selected when the signal level of the capacitance sensor circuit enable signal CSREN is L-level, and the normal mode is selected when the signal level of the capacitance sensor circuit enable signal CSREN is H-level.

In addition, the calibration circuit CAL has a clock terminal CT1 and a signal input terminal Q. The clock signal CLK is supplied to the clock terminal CT1. The signal input terminal Q is connected to an output terminal QN1 of the amplifier circuit 30 and receives supply of the detection signal COUT1 output from the amplifier circuit 30.

In addition, the calibration circuit CAL has a signal input terminal TT1<n:0> for n+1 bits. A first trimming signal TC<n:0> of n+1 bits for cancelling the parasitic capacitance of the capacitor CAP0 outside the semiconductor integrated circuit is supplied to the signal input terminal TT1<n:0>.

In addition, the calibration circuit CAL has a terminal CA1 and a clock terminal CT2, and a signal input terminal TT2<n:0> for n+1 bits. The terminal CA1 is connected to the enable terminal EN that receives an input of the control signal ICAL of the capacitor circuit CAP10. The clock terminal CT2 is connected to the input terminal IN that receives the supply of the clock signal CLKIN of the amplifier circuit 30. The trimming signal ITC<n:0> is supplied to the signal input terminal TT2<n:0>.

In addition, the calibration circuit CAL has an output terminal TT3<n:0> for n+1 bits. A second trimming signal TCO<n:0> is output from the output terminal TT3. The second trimming signal TCO<n:0> is output after execution of the calibration.

The second trimming signal TCO<n:0> output from the output terminal TT3<n:0> is temporarily stored in a non-volatile memory (not shown) arranged in the internal circuit 15A, read out from the non-volatile memory after the transmission device 100 is powered on, and supplied to the signal input terminal TT1<n:0> as the first trimming signal TC<n:0>.

Figure 16:
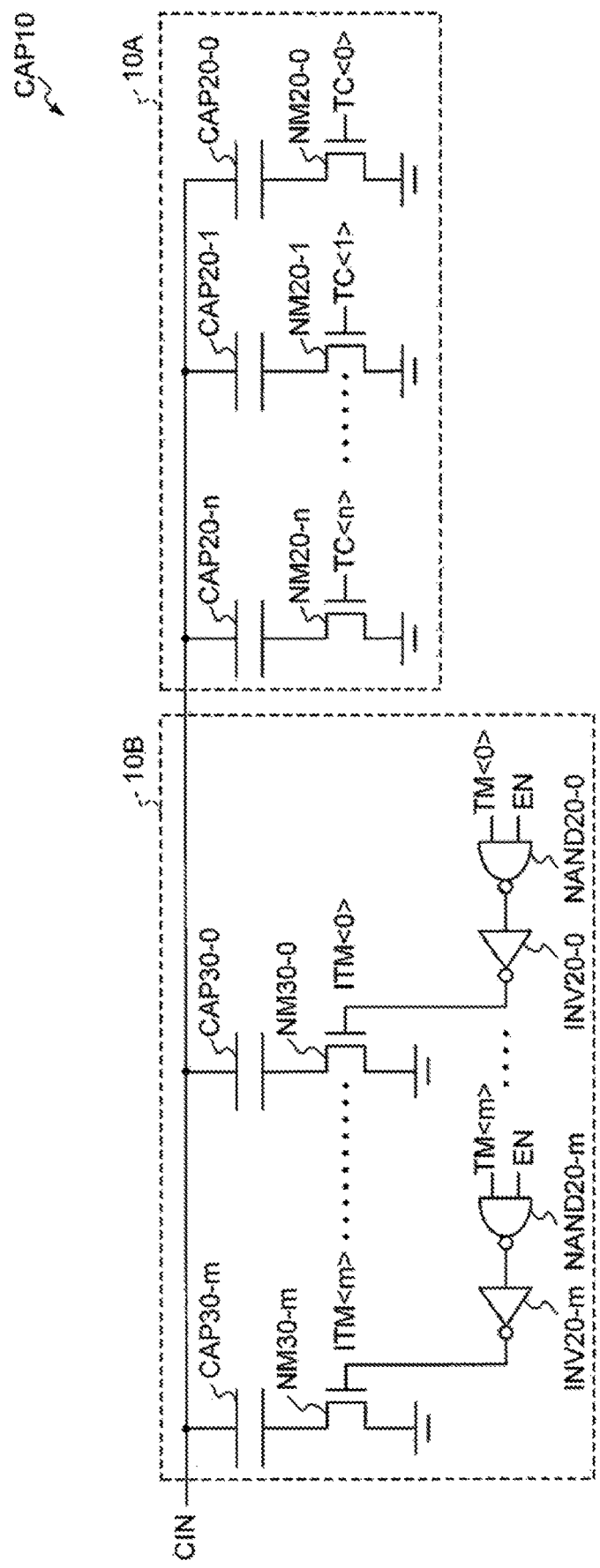
FIG. 16 is a circuit diagram showing a configuration of a capacitor circuit of Example 6.

FIG. 16 is a circuit diagram showing a configuration of the capacitor circuit CAP10 of the example. The capacitor circuit CAP10 includes a first circuit part 10A and a second circuit part 10B.

The first circuit part 10A has the same configuration as the capacitor circuit CAP10 of Example 5 shown in FIG. 14. That is, the first circuit part 10A includes capacitors CAP20-0, CAP20-1, . . . , and CAP20-n and transistors NM20-0, NM20-1, . . . , and NM20-n, which are N-channel MOS-FETs. In each of the capacitors CAP20-0 to CAP20-n, one end is connected to the CIN terminal via a common line, and the other end is connected to each drain of the transistors NM20-1 to NM20-n. In each of the transistors NM20-0 to NM20-n, the source is grounded, and first selection signals TC<0> to TC<n> are supplied to the gate.

The second circuit part 10B includes capacitors CAP30-0 to 30-m that are m+1 capacitors, and transistors NM30-0 to 30-m that are m+1 N-channel MOSFETs. In addition, the second circuit part 10B includes NAND20-0 to 20-m that are m+1 NAND gate circuits, and inverters INV20-0 to 20-m that are m+1 inverter circuits.

One end of each of the capacitors CAP30-0 to 30-m is connected to the CIN terminal via the common line. The other end of the capacitor CAP30-0 is connected to the drain of the transistor NM30-0. Similarly, the other ends of the capacitors CAP30-1 to 30-m are respectively connected to the drains of the transistors NM30-1 to 30-m. The source of each of the transistors NM30-0 to 30-m is grounded.

The NAND20-0 to 20-m are two-input NAND gate circuits that output a negative AND. Margin selection signals TM<0> to TM<m> are supplied to one input end of each of the NAND20-0 to 20-m. The margin selection signals TM<0> to TM<m> are signals forming each digit of the margin trimming signal TM<m:0>, and have a signal level of "0" or "1" (for example, the L-level or H-level). The other input end of each of the NAND20-0 to 20-m is connected to the enable terminal EN of the capacitor circuit CAP10.

The input ends of the inverters 20-0 to 20-m are connected to the output ends of the NAND20-0 to 20-m. The output ends of the inverters 20-0 to 20-m are respectively connected to the gates of the transistors NM30-0 to 30-m. The inverters 20-0 to 20-m supply inverted selection signals ITM<0> to ITM<m>, which are signals obtained by inverting the output signals of the NAND20-0 to 20-m, to the gates of the transistors NM30-0 to 30-m.

Next, the calibration circuit CAL of the example is described. FIGS. 17A-17C and FIG. 18 are circuit diagrams showing a configuration of the calibration circuit CAL.

Figure 17A:
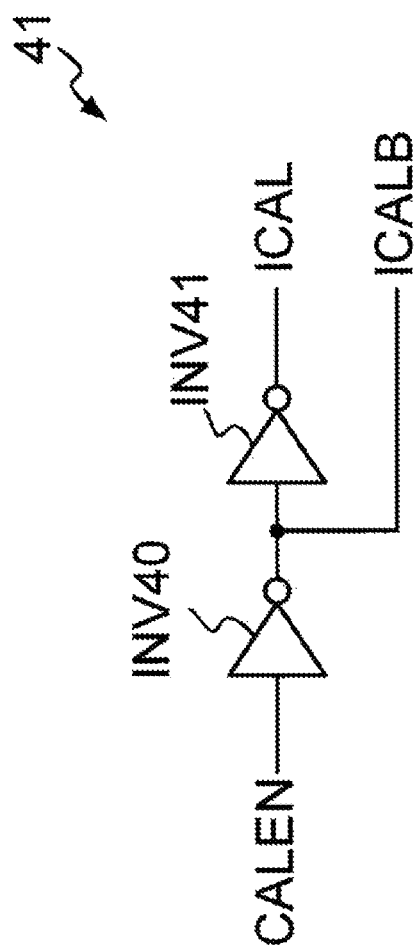
FIG. 17A is a circuit diagram showing a part of a configuration of a calibration circuit of Example 6.

FIG. 17A is a circuit diagram showing a configuration of a control circuit 41 which is a part of the calibration circuit CAL. The control circuit 41 includes an inverter INV40 and an inverter INV41.

The output end of the inverter INV40 is connected to the input end of the inverter INV41. The calibration enable signal CALEN is supplied to the input end of the inverter INV40.

The inverter INV40 outputs an inverted control signal ICALB, which is a signal obtained by inverting the calibration enable signal CALEN, from the output end. The inverter INV41 receives the supply of the inverted control signal ICALB at the input end, and outputs a control signal ICAL, which is a signal obtained by further inverting the inverted signal ICALB, from the output end.

Figure 17B:
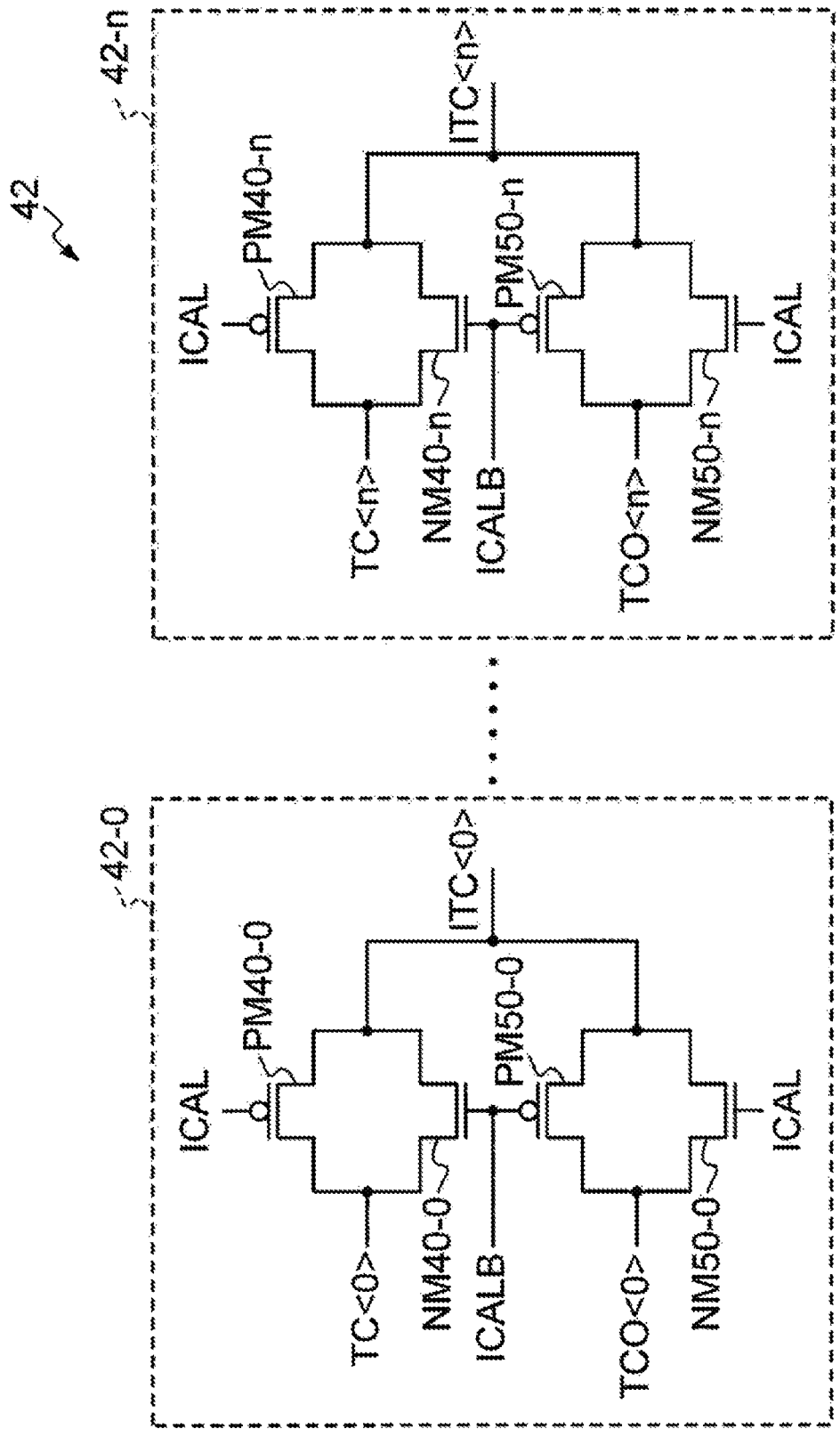
FIG. 17B is a circuit diagram showing a part of the configuration of the calibration circuit of Example 6.

FIG. 17B is a circuit diagram showing a configuration of the trimming signal generation circuit 42 which is a part of the calibration circuit CAL. The trimming signal generation circuit 42 includes n+1 signal generation parts which are the signal generation parts 42-0 to 42-n.

The first selection signals TC<0> to TC<n> are supplied to the signal generation circuits 42-0 to 42-n. The first selection signals TC<0> to TC<n> are signals forming each digit of the first trimming signal TC<n:0>, and have a signal level of "0" or "1" (that is, the L-level or H-level).

In addition, second selection signals TCO<0> to TCO<n> are supplied to the signal generation circuits 42-0 to 42-n. The second selection signals TCO<0> to TCO<n> are signals forming each digit of the second trimming signal TCO<n:0>, and have a signal level of "0" or "1" (that is, the L-level or H-level).

The signal generation part 42-0 includes transistors PM40-0, NM40-0, PM50-0, and NM50-0. The control signal ICAL output from the control circuit 41 is supplied to the gate of the transistor PM40-0. The source of the transistor PM40-0 and the drain of the transistor NM40-0 are connected to each other, and receive the supply of the first selection signal TC<0>. The drain of the transistor PM40-0 and the source of the transistor NM40-0 are connected to each other.

The gate of the transistor NM40-0 and the gate of the transistor PM50-0 are connected to each other, and receive the supply of the inverted control signal ICALB. The source of the transistor PM50-0 and the drain of the transistor NM50-0 are connected to each other and receive the supply of the second selection signal TCO<0>. The control signal ICAL output from the control circuit 41 is supplied to the gate of the transistor NM50-0. The drain of the transistor PM50-0 and the source of the transistor NM50-0 are connected to each other.

A connection part between the drain of the transistor PM40-0 and the source of the transistor NM40-0 and a connection part between the drain of the transistor PM50-0 and the source of the transistor NM50-0 are connected to each other, and the signal generation part 42-0 outputs the selection signal ITC<0> from the connection end thereof.

The signal generation parts 42-1 to 42-n also have the same configuration. For example, the signal generation part 40-n includes transistors PM40-n, NM40-n, PM50-n, and NM50-n. The control signal ICAL output from the control circuit 41 is supplied to the gate of the transistor PM40-n. The source of the transistor PM40-n and the drain of the transistor NM40-n are connected to each other, and receive the supply of the first selection signal TC<n>. The drain of the transistor PM40-n and the source of the transistor NM40-n are connected to each other.

The gate of the transistor NM40-$n$ and the gate of the transistor PM50-$n$ are connected to each other, and receive the supply of the inverted control signal ICALB. The source of the transistor PM50-$n$ and the drain of the transistor NM50-$n$ are connected to each other, and receive the supply of the calibration selection signal TCO<n>. The control signal ICAL output from the control circuit 41 is supplied to the gate of the transistor NM50-$n$. The drain of the transistor PM50-$n$ and the source of the transistor NM50-$n$ are connected to each other.

The connection part between the drain of the transistor PM40-$n$ and the source of the transistor NM40-$n$ and the connection part between the drain of the transistor PM50-$n$ and the source of the transistor NM50-$n$ are connected to each other, and the signal generation part 42-$n$ outputs the selection signal ITC<n> from the connection end thereof.

In this manner, the signal generation circuits 42-0 to 42-$n$ receive the supply of the first selection signals TC<0> to TC<n> and the second selection signals TCO<0> to TCO<n>, and output the selection signals ITC<0> to ITC<n>. The selection signals ITC<0> to ITC<n> are signals forming each digit of the trimming signal ITC<n:0> of n+1 bits, and have a signal level of "0" or "1" (that is, the L-level or H Level).

Figure 17C:
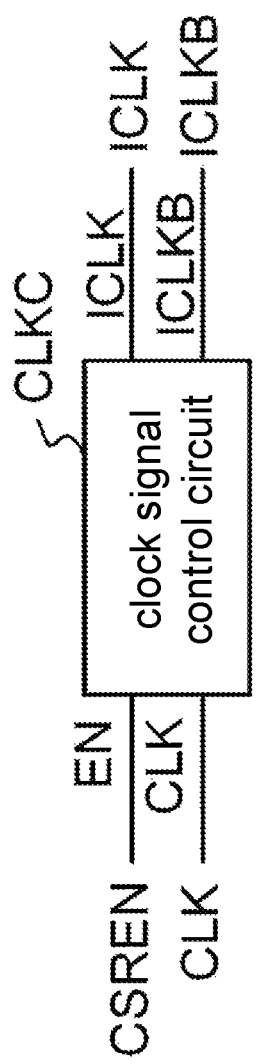
FIG. 17C is a circuit diagram showing a part of the configuration of the calibration circuit of Example 6.

FIG. 17C is a block diagram showing a configuration of a clock signal control circuit CLKC which is a part of the calibration circuit CAL. The clock signal control circuit CLKC has an enable terminal EN, a clock terminal CLK, a first output terminal ICLK, and a second output terminal ICLKB.

The enable terminal EN is connected to the enable terminal EN2 of the calibration circuit CAL, and is supplied with the capacitance sensor circuit enable signal CSREN. The clock signal CLK is supplied to the clock terminal CLK. When the signal level of the capacitance sensor circuit enable signal CSREN is the L-level, the output clock signal ICLK is fixed at the L-level and the inverted clock signal ICLKB is fixed at the H-level. On the other hand, when the signal level of the capacitance sensor circuit enable signal CSREN is the H-level, the clock signal control circuit CLKC outputs the output clock signal ICLK in phase with the clock signal CLK, and outputs an inverted signal of the clock signal CLK as the inverted clock signal ICLKB.

Figure 18:
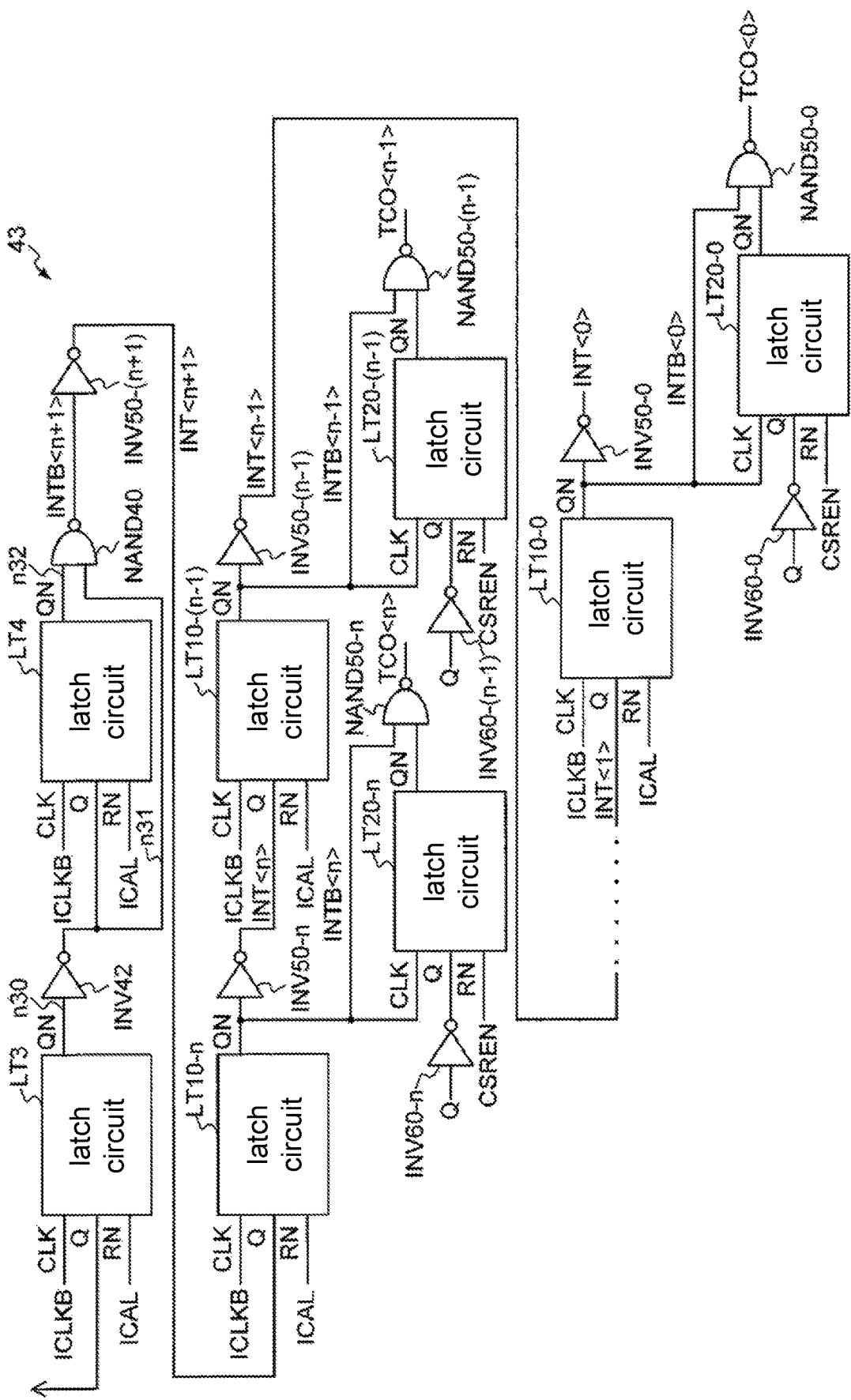
FIG. 18 is a circuit diagram showing a part of the configuration of the calibration circuit of Example 6.

FIG. 18 is a circuit diagram showing a configuration of a calibration trimming signal generation circuit 43 which is a part of the calibration circuit CAL. The calibration trimming signal generation circuit 43 includes latch circuits LT3, LT4, LT10-0 to 10-$n$, and LT20-0 to 20-$n$. In addition, the calibration trimming signal generation circuit 43 includes an inverter 42, inverters 50-0 to 50-($n$+1), and inverters 60-0 to 60-$n$. In addition, the calibration trimming signal generation circuit 43 includes a NAND40 and NAND50-0 to 50-$n$.

The signal input terminal Q of the latch circuit LT3 is connected to the power supply. The inverted clock signal ICLKB is supplied to the clock terminal CLK of the latch circuit LT3. The control signal ICAL is supplied to an input terminal RN of the latch circuit LT3. The output terminal QN of the latch circuit LT3 is connected to the input end of the inverter INV42 via a node n30. The output end of the inverter INV42 is connected to the signal input terminal Q of the latch circuit LT4 via a node n31.

The inverted clock signal ICLKB is supplied to the clock terminal CLK of the latch circuit LT4. The control signal ICAL is supplied to the input terminal RN of the latch circuit LT4. The output terminal QN of the latch circuit LT3 is connected to one input end of the NAND40 via a node n32.

The other input end of the NAND40 is connected to the output end of the inverter 42. The output end of the NAND40 is connected to the input end of the inverter INV50-($n$+1). The NAND40 supplies an output signal INTB<n+1> to the input end of the inverter INV50-($n$+1). The inverter INV50-($n$+1) supplies an output signal INT<n+1> obtained by inverting the output signal INTB<n+1> from the NAND40 to the latch circuit LT10-$n$.

The inverted clock signal ICLKB is supplied to the clock terminal CLK of the latch circuit LT10-$n$. The control signal ICAL is supplied to the input terminal RN of the latch circuit LT10-$n$. The signal input terminal Q of the latch circuit LT10-$n$ is connected to the output end of the inverter INV50-($n$+1). The latch circuit LT10-$n$ outputs an output signal INTB<n> from the output terminal QN. The output terminal QN of the latch circuit LT10-$n$ is connected to the input end of the inverter INV50-$n$, and is connected to the clock terminal CLK of the latch circuit LT20-$n$ and one input end of the NAND50-$n$.

The inverter INV50-$n$ outputs an output signal INT<n> obtained by inverting the output signal INTB<n> from the output terminal QN of the latch circuit LT10-$n$. The output end of the inverter INV50-$n$ is connected to the signal input end of the latch circuit LT10-($n$−1).

The inverted clock signal ICLKB is supplied to the clock terminal CLK of the latch circuit LT10-($n$−1). The control signal ICAL is supplied to the input terminal RN of the latch circuit LT10-($n$−1). The signal input terminal Q of the latch circuit LT10-($n$−1) is connected to the output end of the inverter INV50-$n$. The latch circuit LT10-$n$ outputs an output signal INTB<n−1> from the output terminal QN. The output terminal QN of the latch circuit LT10-$n$ is connected to the input end of the inverter INV50-($n$−1), and is connected to the clock terminal CLK of the latch circuit LT20-($n$−1) and one input end of the NAND50-($n$−1).

The inverter INV50-($n$−1) outputs an output signal INT<n−1> obtained by inverting the output signal INTB<n−1> from the output terminal QN of the latch circuit LT10-($n$−1).

Similarly, in the following, in the latch circuit LT10-$k$ ($k$=($n$−2) to 1) up to the latch circuit LT10-0, the inverted clock signal ICLKB is supplied to the clock terminal CLK. The control signal ICAL is supplied to the input terminal RN of the latch circuit LT10-$k$. The signal input terminal Q of the latch circuit LT10-$k$ is connected to the output end of the inverter INV50-($k$+1). The output terminal QN of the latch circuit LT10-$k$ is connected to the input end of the inverter INV50-$k$, and is connected to the clock terminal CLK of the latch circuit LT20-$k$ and one input end of the NAND50-$k$.

The inverted clock signal ICLKB is supplied to the clock terminal CLK of the latch circuit LT10-0. The control signal ICAL is supplied to the input terminal RN of the latch circuit LT10-0. An output signal INT<1> of the inverter INV50-1 is supplied to the signal input terminal Q of the latch circuit LT10-0. The latch circuit LT10-0 outputs an output signal INTB<0> from the output terminal QN. The output terminal QN of the latch circuit LT10-0 is connected to the input end of the inverter INV50-0, and is connected to the clock terminal CLK of the latch circuit LT20-0 and one input end of the NAND50-0.

The input end of each of the inverters 60-0 to 60-$n$ is connected to the signal input terminal Q of the calibration circuit CAL. Each of the inverters 60-0 to 60-$n$ inverts the signal input to the signal input terminal Q and outputs the inverted signal.

An output signal from the output terminal QN of the latch circuit LT10-$n$ is supplied to the clock terminal CLK of the latch circuit LT20-*n*. The input terminal RN of the latch circuit LT20-*n* is connected to the enable terminal EN2 of the calibration circuit CAL, and is supplied with the capacitance sensor circuit enable signal CSREN. The signal input terminal Q of the latch circuit LT20-*n* is connected to the output end of the inverter INV60-*n*. The output terminal QN of the latch circuit LT20-*n* is connected to the other input end of the NAND50-*n*.

An output signal from the output terminal QN of the latch circuit LT10-(*n*−1) is supplied to the clock terminal CLK of the latch circuit LT20-(*n*−1). The capacitance sensor circuit enable signal CSREN is supplied to the input terminal RN of the latch circuit LT20-(*n*−1). The signal input terminal Q of the latch circuit LT20-(*n*−1) is connected to the output end of the inverter INV60-(*n*−1). The output terminal QN of the latch circuit LT20-(*n*−1) is connected to the other input end of the NAND50-(*n*−1).

Similarly, in the following, in the latch circuit LT20-*k* (*k*=(*n*−2)-0) up to the latch circuit LT20-0, the output signal from the output terminal QN of the latch circuit LT10-*k* is supplied to the clock terminal CLK. The capacitance sensor circuit enable signal CSREN is supplied to the input terminal RN of the latch circuit LT20-*k*. The signal input terminal Q of the latch circuit LT20-*k* is connected to the output end of the inverter INV60-*k*. The output terminal QN of the latch circuit LT20-*k* is connected to the other input end of the NAND50-*k*.

In the latch circuits LT3, LT4, LT10-0 to 10-*n*, and LT20-0 to 20-*n*, when the signal level of the signal input to the input terminal RN is the L-level, the output signal from the output terminal QN is fixed at the H-level. On the other hand, when the signal level of the signal input to the input terminal RN is the H-level, the signal obtained by inverting the signal input to the signal input terminal Q at the rising of the clock terminal CLK is output from the output terminal QN.

The NAND50-0 to 50-*n* output, from each output end, signals of the negative AND between the output signals from the latch circuits LT10-0 to 10-*n* and the output signals from the latch circuits LT20-0 to 20-*n* as the second selection signals TCO<0> to TCO<*n*>. Thereby, the second trimming signal TCO<n:0> is output from the calibration circuit CAL.

Figure 19:
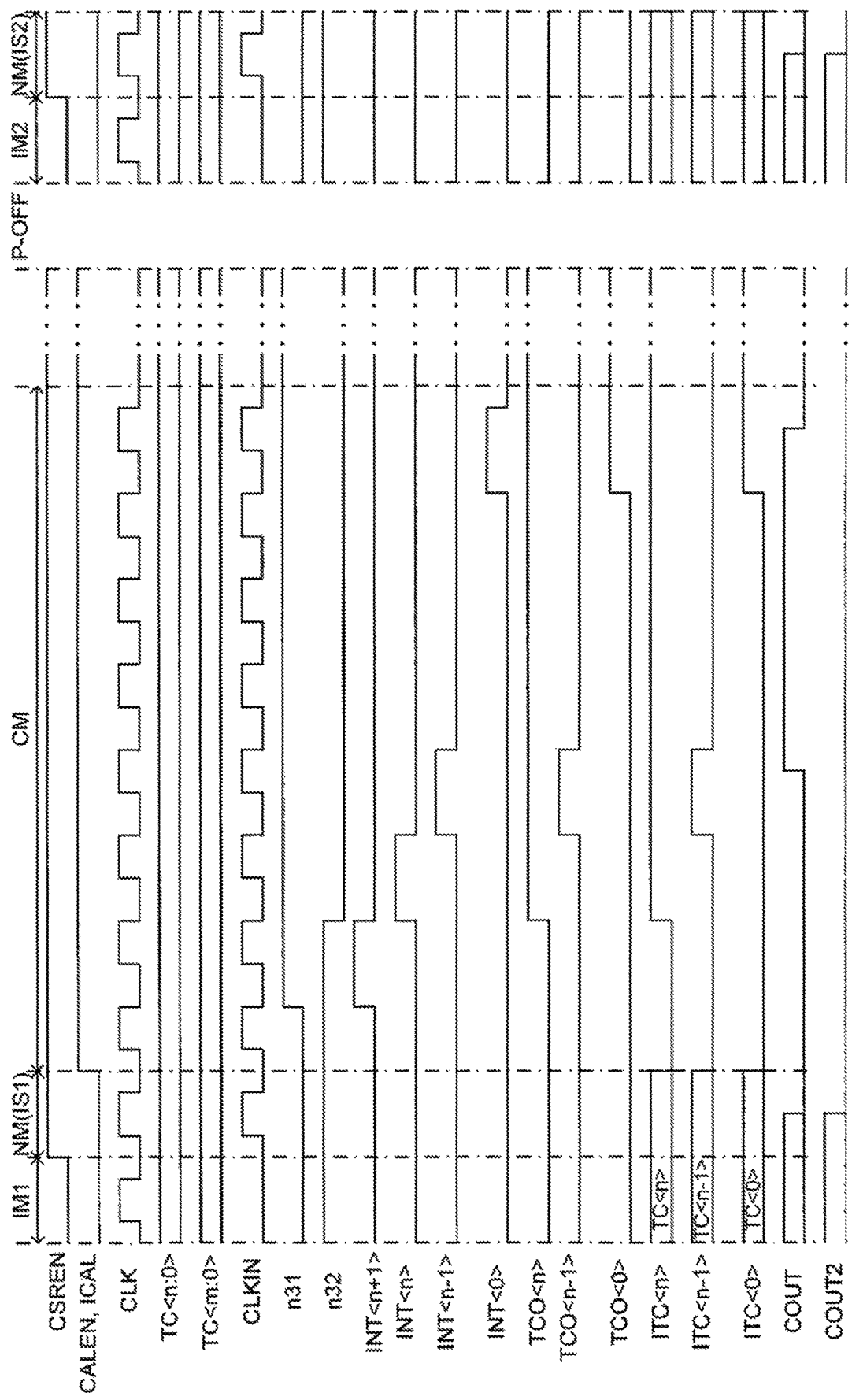
FIG. 19 is a time chart showing the operation of the capacitance sensor circuit of Example 6.

Next, the operation of the capacitance sensor circuit 15 of the example is described with reference to a time chart in FIG. 19.

[Inactive Mode IM1]

When the capacitance sensor circuit enable signal CSREN at the L-level and the calibration enable signal CALEN are supplied, the input signal of the control circuit 41 in FIG. 17A and the input signal of the input terminal RN of the latch circuits LT20-0 to 20-*n* in FIG. 18 both become the L-level. At this time, the output clock signal ICLK becomes the L-level, the inverted clock signal ICLKB becomes the H-level, the control signal ICAL becomes the L-level, and the inverted control signal ICALB becomes the L-level.

The transistors PM40-0 to 40-*n* of the trimming signal generation circuit 42 shown in FIG. 17B receive the supply of the control signal ICAL at the L-level at the gate and are turned on. In addition, the transistors NM40-0 to 40-*n* receive the supply of the inverted control signal ICALB at the H-level at the gate and are turned on.

On the other hand, the transistors PM50-0 to 50-*n* receive the supply of the inverted control signal ICALB at the H-level at the gate and are turned off. In addition, the transistors NM50-0 to 50-*n* receive the supply of the control signal ICAL at the L-level at the gate and are turned off. Thereby, the first selection signals TC<0> to TC<*n*> are output as the selection signals ITC<0> to ITC<*n*>. That is, the first trimming signal TC<n:0> is output as the trimming signal ITC<n:0>.

In addition, the latch circuit LT3, the latch circuit LT4, the latch circuits LT10-0 to 10-*n*, and the latch circuits LT20-0 to 20-*n* of the calibration trimming signal generation circuit 43 shown in FIG. 18 output the signals at the H-level from the output terminal QN. Therefore, the INT<n+1:0> (that is, INT<n+1>, INT<*n*>, ..., and INT<0>) and the TCO<n:0> (that is, TCO<*n*>, TCO<n−1>, ..., and TCO<0>) all become the L-level.

Since the output clock signal ICLK is at the L-level, the clock signal CLKIN also becomes the L-level. Since the clock signal CLKIN is at the L-level, the detection signal COUT1 and the error flag signal COUT2 hold the H-level that is the previous data value. In FIG. 19, the period of this state is shown as an inactive mode IM1.

[Normal Mode NM (Initial State IS1)]

Next, when the capacitance sensor circuit enable signal CSREN becomes the H-level, the clock signal control circuit CLKC outputs the output clock signal ICLK in phase with the clock signal CLK, and outputs the inverted signal of the clock signal CLK as the inverted clock signal ICLKB. Since the signal output from the output terminal QN of each of the latch circuits LT3, LT4, LT10-0 to 10-*n* and LT20-0 to 20-*n* is maintained at the H-level, the signals of the INT<n+1:0> and the TCO<n:0> are maintained at the L-level.

Since the output clock signal ICLK is in phase with the clock signal CLK, the clock signal CLKIN is also in phase with the clock signal CLK. The capacitance sensor circuit 15 operates due to the rising of the clock signal CLKIN, and outputs the detection signal COUT1 and the error flag signal COUT2 indicating a determination result. For example, when the dielectric DE between the electrodes of the capacitor CAP0 has not melted and the capacitance value of the capacitor circuit CAP10 is smaller than that of the capacitor CAP0, the signal levels of the detection signal COUT1 and the error flag signal COUT2 become the L-level. In FIG. 19, the period of this state is shown as a normal mode NM (initial state IS1).

[Calibration Mode CM]

Next, when the calibration enable signal CALEN becomes the H-level, the control signal ICAL becomes the H-level and the inverted control signal ICALB becomes the L-level. The transistors PM40-0 to 40-*n* of the trimming signal generation circuit 42 receive the supply of the control signal ICAL at the H-level at the gate and are turned off, and the transistors NM40-0 to 40-*n* receive the inverted control signal ICALB at the L-level at the gate and are turned off. On the other hand, the transistors PM50-0 to 50-*n* receive the supply of the inverted control signal ICALB at the L-level to the gate and are turned on, and the transistors NM50-0 to 50-*n* receive the control signal ICAL at the H-level at the gate and are turned on.

Thereby, the second selection signals TCO<0> to TCO<*n*> are output as the selection signals ITC<0> to ITC<*n*>. That is, the second trimming signal TCO<n:0> is output as the trimming signal ITC<n:0>. Since all signals of the INT<n+1:0> and the TCO<n:0> are at the L-level, all signals of the trimming signal ITC<n:0> also become the L-level.

When the clock signal CLK is input to the calibration circuit CAL in this state, the potential of the node n31 rises at the falling of the first clock signal CLK, and the node n32 falls at the falling of the second clock signal CLK, and thus the output signal INT<n+1> of the inverter INV50-(*n*+1)

becomes the H-level only between the clock of the first clock signal CLK and the second clock in the period of the calibration mode NM.

Here, the circuit configured by the latch circuits LT10-$n$ to 10-0 and the inverters INV50-$n$ to 50-0 in FIG. 18 is a shift register of INT<$n$:0>. Therefore, an H-pulse of the output signal INT<$n$+1> shifts from INT<$n$> to INT<0> in order after the falling of the third clock of the clock signal CLK. When the output signal INT<$n$> becomes the H-level, the output signal INTB<$n$> becomes the L-level, and thus the second selection signal TCO<$n$> becomes the H-level. At this time, all of the INT<$n$−1:0> are at the L-level.

Since the second trimming signal TCO<$n$:0> is output as the trimming signal ITC<$n$:0>, within the capacitors CAP20-$n$ to 20-0 of the capacitor circuit CAP10 shown in FIG. 16, only the capacitor CAP20-$n$ functions as a capacitance and the other capacitors do not function as capacitances. On the other hand, since the control signal ICAL also becomes the H-level when the calibration enable signal CALEN becomes the H-level, the ITM<$m$:0> (that is, the inverted selection signals ITM<0> to ITM<$m$>) becomes the same signal as the margin trimming signal TM<$m$:0>, and the capacitors CAP30-$m$ to 30-0 function as capacitances corresponding to the signal input of the margin trimming signal TM<$m$:0>.

When the clock signal CLK rises in this state, the result determined by the capacitance sensor circuit 15 is input to the signal input terminal Q of the calibration circuit CAL. Since the INTB<$n$> rises and the INT<$n$> falls at the subsequent falling of the clock signal CLK, the inverted signal of the determination result input to the signal input terminal Q of the calibration circuit CAL is stored in the latch circuit 20-$n$, and the calibration enable signal CALEN is held in the H-level period as output data of the second selection signal TCO<$n$>.

Here, the capacitance sensor circuit 15 of the example is designed to outputs the detection signal COUT1 at the L-level when the dielectric DE between the electrodes of the capacitor CAP0 has not melted, and outputs the detection signal COUT1 at the H-level after the dielectric DE melts. That is, when the capacitance sensor circuit 15 determines that the capacitance value of the capacitor circuit CAP10 is smaller than the capacitance value of the capacitor CAP0, the detection signal COUT1 becomes the L-level, and as a result, the second selection signal TCO<$n$> at the H-level is output. On the other hand, when the capacitance sensor circuit 15 determines that the capacitance value of the capacitor circuit CAP10 is larger than the capacitance value of the capacitor CAP0, the detection signal COUT1 becomes the H-level, and as a result, the second selection signal TCO<$n$> at the L-level is output.

At the next clock, the TCO<$n$−1> becomes the H-level, and all of the INT<$n$−2:0> are maintained at the L-level. Therefore, the capacitor CAP20-$n$ of the capacitor circuit CAP10 functions as a capacitance value when the TCO<$n$> is at the H-level, that is, when the capacitor circuit CAP10 is smaller in capacitance value than the capacitor CAP0, and the capacitor CAP20-$n$ does not function as a capacitance value when the TCO<$n$> is at the L-level, that is, when the capacitor circuit CAP10 is larger in capacitance value than the capacitor CAP0.

In addition, within the capacitors CAP20-($n$−1) to 20-0, only the capacitor CAP20-($n$−1) functions as a capacitance, and the other capacitors do not function as capacitances. When the clock signal CLK rises in this state, the result determined by the capacitance sensor circuit 15 is input to the signal input terminal Q of the calibration circuit CAL. Since the INTB<$n$−1> rises and the INT<$n$−1> falls at the subsequent falling of the clock signal CLK, the inverted signal of the determination result input to the signal input terminal Q of the calibration circuit CAL is stored in the latch circuit 20-($n$−1), and the calibration enable signal CALEN is held in the H-level period as output data of the second selection signal TCO<$n$−1>.

Thereafter, until the inverted signal of the determination result is stored in the latch circuit LT20-0, and the calibration enable signal CALEN is held in the H-level period as the output data of TCO<0>, the same processing is repeated.

In the period in which the calibration enable signal CALEN is at the H-level, a series of operations are performed so that when the capacitance value of the capacitor CAP0 is larger than the capacitance value of the capacitor circuit CAP10, the capacitance value of the capacitor circuit CAP10 is reduced, and when the capacitance value of the capacitor CAP0 is smaller than the capacitance value of the capacitor circuit CAP10, the capacitance of the capacitor circuit CAP10 is increased. That is, the second trimming signal TCO<$n$:0> is set so that the capacitor CAP0 and the capacitor circuit CAP10 have the same capacitance value. In FIG. 19, the period of this state is shown as a calibration mode CM.

[Inactive Mode IM2]

For example, during the calibration mode, the margin trimming signal TM<$m$:0> for setting a capacitance value is supplied to the capacitor circuit CAP10 so that the capacitance value of the capacitor circuit CAP10 is, for example, half of the difference between the capacitance value of the capacitor CAP0 before the dielectric DE melts and the capacitance value of the capacitor CAP0 after the dielectric DE melts, and the data of the second trimming signal TCO<$n$:0> after the calibration is stored in the non-volatile memory (not shown) arranged in the capacitance sensor circuit 15. After the power is turned on, the data of the second trimming signal TCO<$n$:0> is read from the non-volatile memory and input to the signal input terminal TT1<$n$:0> as the first trimming signal TC<$n$:0>. In FIG. 19, the period of this state is shown as an inactive mode IM2.

[Normal Mode NM (Initial State IS2)]

When the capacitance sensor circuit enable signal CSREN at the H-level and the calibration enable signal CALEN at the L-level are supplied to operate the capacitance sensor circuit 15, the calibration enable signal CALEN is at the L-level, and thus all of the ITM<0> (that is, the inverted selection signals ITM<0> to ITM<$m$>) become the L-level. Thereby, none of the capacitors CAP30-0 to 30-$m$ function as a capacitance, and thus the capacitance value of the capacitor circuit CAP10 is set to an intermediate level between the capacitance value before melting and the capacitance value after melting of the dielectric DE having a capacitance of the capacitor CAP0 including the parasitic capacitance value of the capacitor CAP0 outside the semiconductor integrated circuit. In FIG. 19, the period of this state is shown as a normal mode NM (initial state IS2).

As described above, according to the capacitance sensor circuit 15 of the example, the parasitic capacitance of the capacitor CAP0 can be cancelled by performing the calibration, and the capacitance value of the capacitor circuit CAP10 can be set to the intermediate level between the capacitance value before melting and the capacitance value after melting of the dielectric DE of the capacitor CAP0. This is effective for determining whether the substance between the electrodes of the capacitor CAP0 has melted.

Example 7

Figure 20:
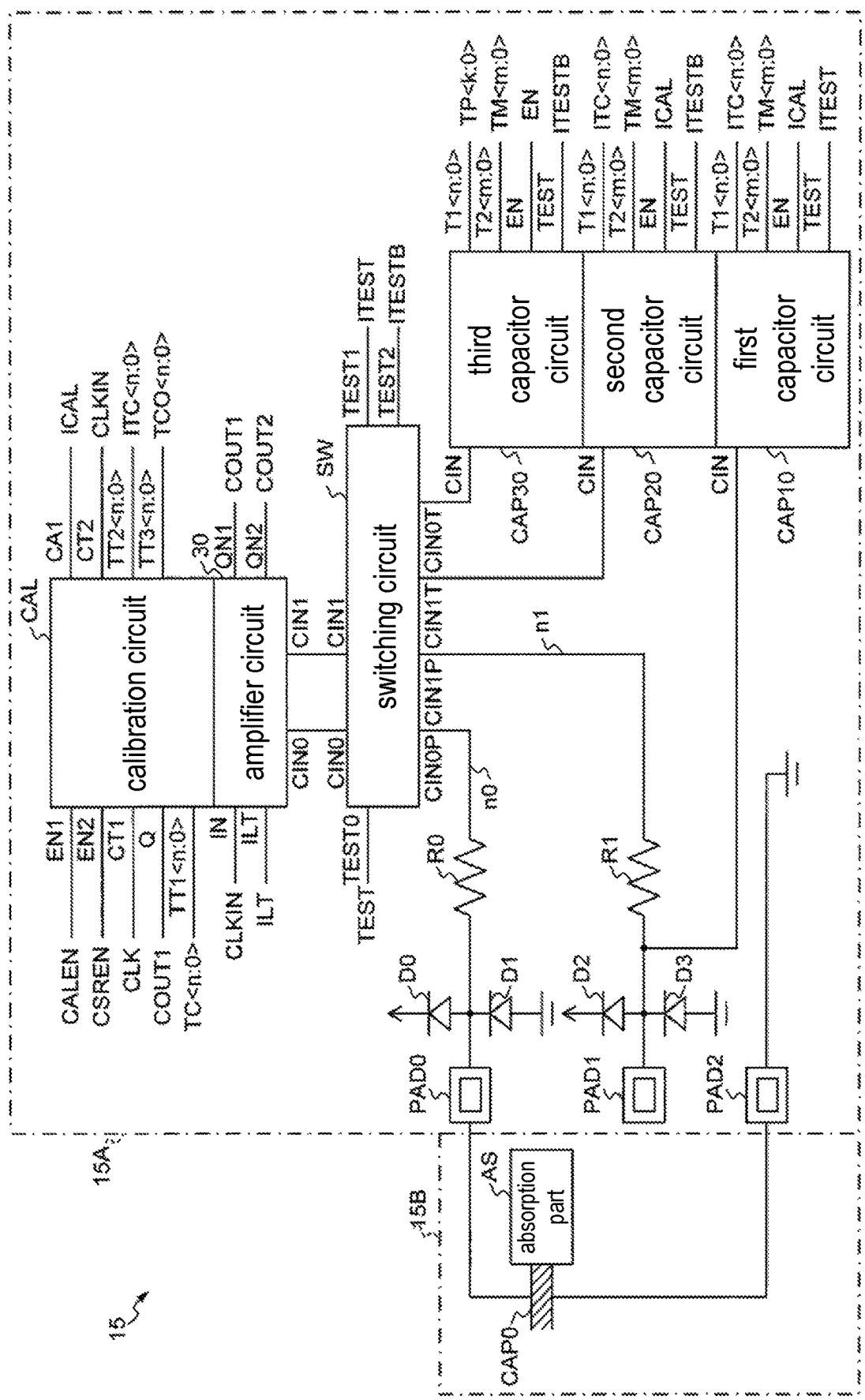
FIG. 20 is a block diagram showing a configuration of a capacitance sensor circuit of Example 7.

Next, Example 7 of the disclosure is described. FIG. 20 is a block diagram showing a configuration of the capacitance sensor circuit 15 of the example. The capacitance sensor circuit 15 of the example is different from the capacitance sensor circuit 15 of Example 6 in terms of including a second capacitor circuit CAP20 and a third capacitor circuit CAP30 in addition to the first capacitor circuit CAP10 and also including a switching circuit SW. In the following description, the first capacitor circuit CAP10, the second capacitor circuit CAP20, and the third capacitor circuit CAP30 are also collectively referred to as capacitor circuits CAP10-30.

The capacitor circuits CAP10-30 are circuits which include a plurality of capacitors and are capable of selectably switching the capacitance value of the electrostatic capacitance of the entire circuit. The capacitor circuits CAP10-30 include a signal input terminal T1<n:0> for n+1 bits, a signal input terminal T2<m:0> for m+1 bits, a CIN terminal, an enable terminal EN, and a test terminal TEST.

When a signal at the L-level is input to the test terminal TEST, the capacitor circuits CAP10-30 are controlled to the non-test mode. When a signal at the H-level is input to the test terminal TEST, the capacitor circuits CAP10-30 are controlled to the test mode.

The signal input terminal T2<m:0> of the first capacitor circuit CAP10 is connected in common with each signal input terminal T2<m:0> of the second capacitor circuit CAP20 and the third capacitor circuit CAP30, and receives the supply of the trimming signal TM<m:0>.

The enable signal EN is supplied to the enable terminal EN of the third capacitor circuit CAP30. The enable signal EN is a signal used in the test mode. When the signal level of the enable signal EN is the H-level, the margin trimming signal TM<m:0> input to the signal input terminal T2 of the third capacitor circuit CAP30 becomes effective. On the other hand, when the signal level of the enable signal EN is the L-level, the margin trimming signal TM<m:0> input to the signal input terminal T2 of the third capacitor circuit CAP30 becomes ineffective.

The capacitance value selection signal TP<k:0> supplied to the signal input terminal T1<n:0> of the third capacitor circuit CAP30 is a signal used in the test mode, and is a capacitor capacitance value selection signal when the parasitic capacitance of the capacitor CAP0 outside the semiconductor integrated circuit is assumed and added in the semiconductor integrated circuit in the test mode. Here, a trimming bit for k+1 bits is described as an example.

The switching circuit SW is a switching circuit for signal path. The switching circuit SW has a CIN0 terminal, a CIN1 terminal, a CIN0P terminal, a CIN1P terminal, a CIN1T terminal, and a CIN0T terminal. The CIN0 terminal is connected to the CIN0 terminal of the amplifier circuit 30. The CIN1 terminal is connected to the CIN1 terminal of the amplifier circuit 30. The CIN0P terminal is connected to one end of the resistor R0 via the node n0. The CIN1P terminal is connected to one end of the resistor R1 via the node n1. The CIN1T terminal is connected to the CIN terminal of the second capacitor circuit CAP20. The CIN0T terminal is connected to the CIN terminal of the third capacitor circuit CAP30.

In addition, the switching circuit SW has test terminals TEST0, TEST1, and TEST2. A test mode signal TEST is supplied to the test terminal TEST0. The test terminal TEST1 is connected in common with the test terminal TEST of the first capacitor circuit CAP10. The test terminal TEST2 is connected in common with the test terminal TEST of the third capacitor circuit CAP30.

When the test mode signal TEST at the L-level is supplied to the test terminal TEST0, the switching circuit SW connects the CIN0 terminal and the CIN0P terminal, and also connects the CIN1 terminal and the CIN1P terminal. At this time, the inputs of the CIN0T terminal and the CIN1T terminal of the switching circuit SW become the L-level.

When the test mode signal TEST at the H-level is supplied to the test terminal TEST0, the switching circuit SW connects the CIN0 terminal and the CIN0T terminal, and also connects the CIN1 terminal and the CIN1T terminal. At this time, the inputs of the CIN0P terminal and the CIN1P terminal of the switching circuit SW become the L-level. The test terminal TEST1 of the switching circuit SW outputs a signal in phase with the test signal TEST input to the test terminal TEST0 as a test signal ITEST. The test terminal TEST2 of the switching circuit SW outputs a signal obtained by inverting the test signal TEST input to the test terminal TEST0 as an inverted test signal ITESTB.

The configurations of the calibration circuit CAL, the capacitor CAP0, the resistor R0, the resistor R1, the diodes D0 to D3, and the PAD0 to PAD2 are the same as those of the capacitance sensor circuit 15 of Example 6. In addition, within the plurality of terminals of the calibration circuit, the connection of the enable terminals EN1 and EN2, the clock terminal CT1, the signal input terminal Q, the signal input terminal TT1<n:0>, the clock terminal CT2, and the output terminal TT3<n:0> is the same as that of the capacitance sensor circuit 15 of Example 6. The connection of the input terminal IN, the input terminal ILT, and the output terminals OUT1 and OUT2 of the amplifier circuit 30 is the same as that of the capacitance sensor circuit 15 of Example 6.

The terminal CA1 of the calibration circuit CAL is connected in common with the enable terminal EN of the first capacitor circuit CAP10 and the enable terminal EN of the second capacitor circuit CAP20, and receives the supply of the control signal ICAL. The signal input terminal TT2<n:0> of the calibration circuit CAL is connected in common with the signal input terminal T1<n:0> of the first capacitor circuit CAP10 and the signal input terminal T1<n:0> of the second capacitor circuit CAP20, and receives the supply of the trimming signal ITC<n:0>.

The CIN0 terminal of the amplifier circuit 30 is connected to the CIN0 terminal of the switching circuit SW. In addition, the CIN1 terminal of the amplifier circuit 30 is connected to the CIN1 terminal of the switching circuit SW.

Figure 21A:
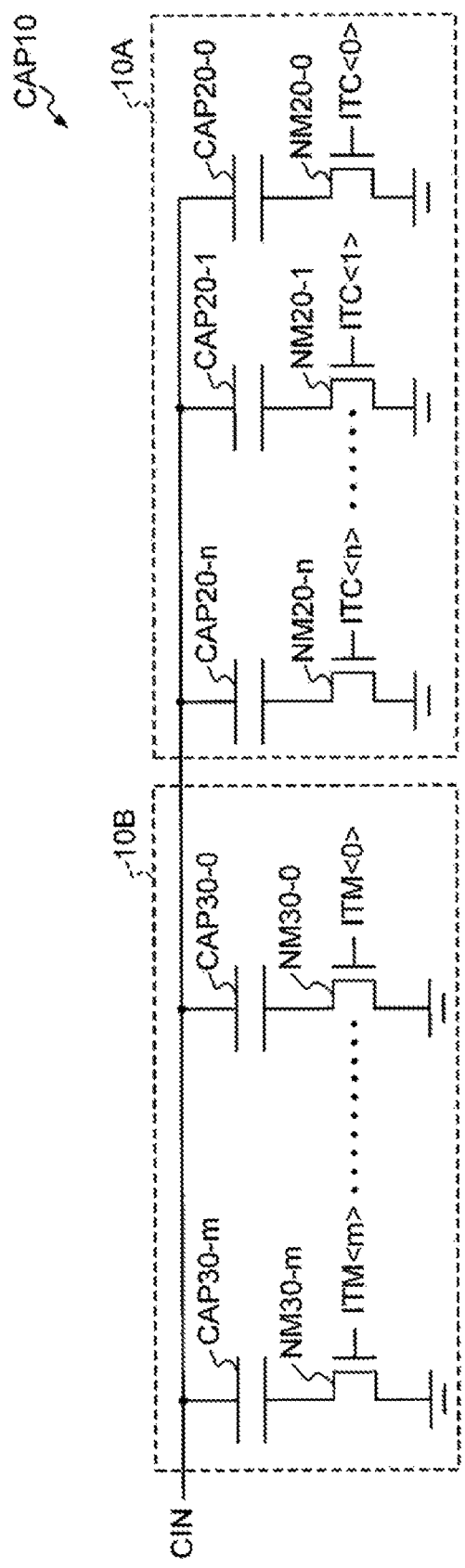
FIG. 21A is a circuit diagram showing a configuration of a CAP10 or CAP20 of Example 7.

FIG. 21A is a circuit diagram showing a configuration of the first capacitor circuit CAP10 of the example. The first capacitor circuit CAP10 includes a first circuit part 10A and a second circuit part 10B. Besides, the second capacitor circuit CAP20 also has the same configuration.

The first circuit part 10A has the same configuration as the capacitor circuit CAP10 of Example 5 shown in FIG. 14. That is, the first circuit part 10A includes capacitors CAP20-0, CAP20-1, . . . , and CAP20-*n*, and transistors NM20-0, NM20-1, . . . , and NM20-*n* that are N-channel MOSFETs. In each of the capacitors CAP20-0 to CAP20-*n*, one end is connected to the CIN terminal via a common line, and the other end is connected to each drain of the transistors NM20-1 to NM20-*n*. In each of the transistors NM20-0 to NM20-*n*, the source is grounded, and the selection signals ITC<0> to ITC<n> are supplied to the gate.

The second circuit part 10B includes capacitors CAP30-0 to 30-*m* that are m+1 capacitors and transistors NM30-0 to 30-*m* that are m+1 N-channel MOSFETs.

One end of each of the capacitors CAP30-0 to 30-*m* is connected to the CIN terminal via a common line. The other end of the capacitor CAP30-0 is connected to the drain of the transistor NM30-0. Similarly, the other ends of the capacitors CAP30-1 to 30-*m* are respectively connected to the drains of the transistors NM30-1 to 30-*m*.

The source of each of the transistors NM30-0 to 30-*m* is grounded. The inverted selection signals ITM<0> to ITM<m> are supplied to the respective gates of the transistors NM30-0 to 30-*m*.

Figure 21B:
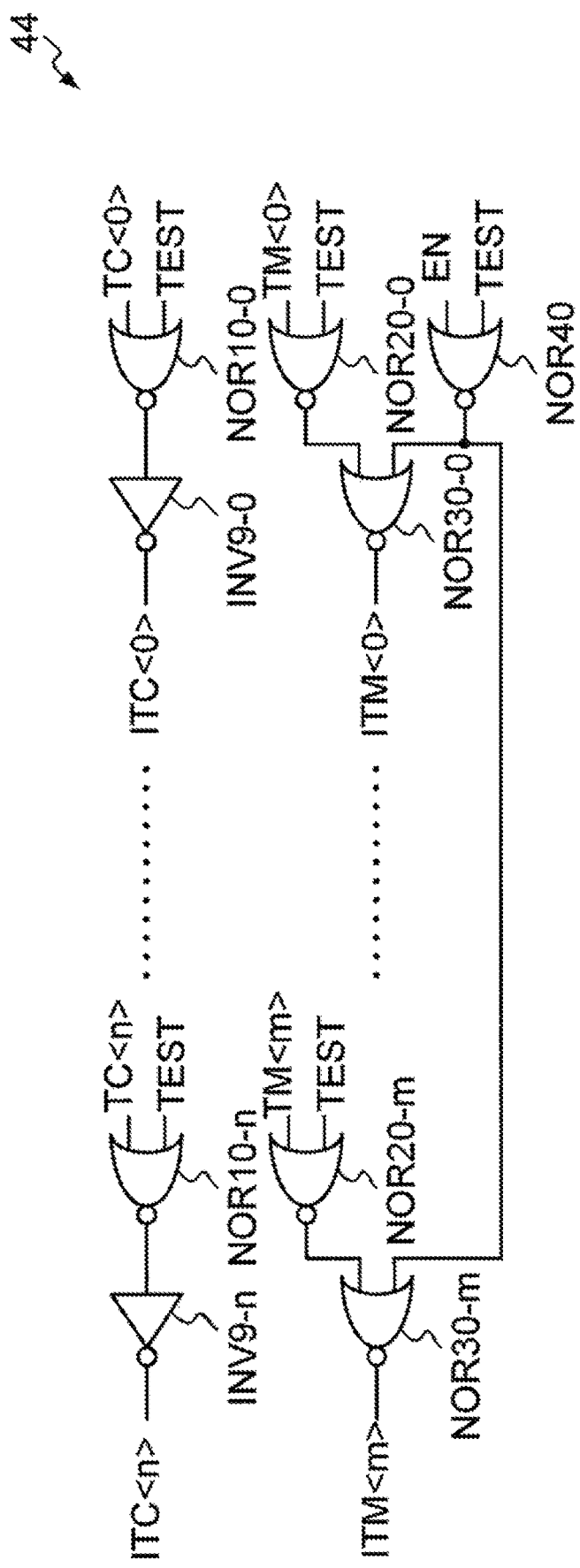
FIG. 21B is a circuit diagram showing a configuration of a signal generation circuit of the CAP10 or CAP20.

FIG. 21B is a circuit diagram showing a configuration of a signal generation circuit 44 which is a part of the first capacitor circuit CAP10. The signal generation circuit 44 includes n+1 NOR gate circuits which are NOR10-0 to 10-*n*, and n+1 inverters which are inverters INV9-0 to 9-*n*. In addition, the signal generation circuit 44 includes m+1 NOR gate circuits which are NOR20-0 to 20-*m*, m+1 NOR gate circuits which are NOR30-0 to 30-*m*, and one NOR gate circuit NOR40.

The output terminals of the NOR10-0 to 10-*n* are respectively connected to the input ends of the inverters INV9-0 to 9-*n*. The selection signals TC<0> to TC<n> are respectively supplied to one input end of each of the NOR10-0 to 10-*n*. The other input end of each of the NOR10-0 to 10-*n* is connected to the test terminal TEST.

The output end of each of the inverters INV9-0 to 9-*n* is connected to the gate of each of the transistors NM20-0 to NM20-*n* of the first capacitor circuit CAP10 shown in FIG. 21A. The inverters INV9-0 to 9-*n* supply the signals obtained by inverting the output signals of the NOR10-0 to 10-*n* as the selection signals ITC<0> to ITC<n> to the gates of the transistors NM20-0 to NM20-*n*.

The output end of each of the NOR20-0 to 20-*m* is connected to one input terminal of each of the NOR30-0 to 30-*m*. One input end of each of the NOR20-0 to 20-*m* is connected to the signal input terminal T2<m:0>, and receives an input of the margin trimming signal TM<m:0>. The other input end of each of the NOR20-0 to 20-*m* is connected to the test terminal TEST.

All of the other input terminals of the NOR30-0 to 30-*m* are connected to the output terminal of the NOR40. One input end of the NOR40 is connected to the enable terminal EN, and the other input end is connected to the test terminal TEST. The output end of each of the NOR30-0 to 30-*m* is connected to the gate of each of the transistors NM30-0 to NM30-*m* of the first capacitor circuit CAP10 shown in FIG. 21A. Each of the NOR30-0 to 30-*m* outputs the inverted selection signals ITM<0> to ITM<m>, and supplies the inverted selection signals to the gate of each of the transistors NM30-0 to NM30-*m*.

Figure 22A:
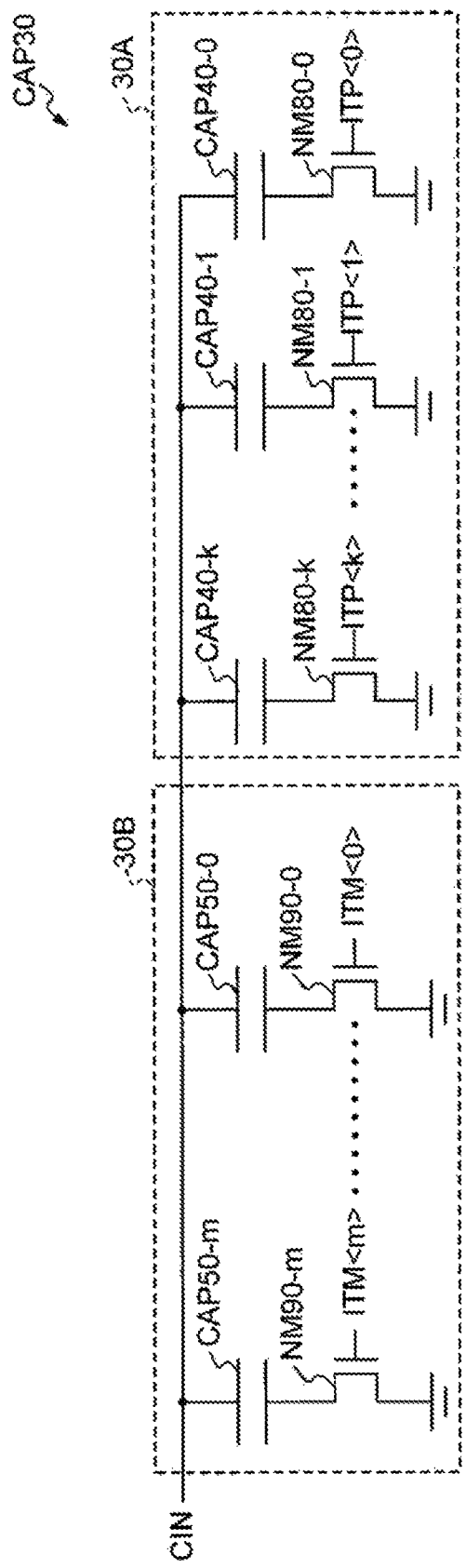
FIG. 22A is a circuit diagram showing a configuration of a CAP30 of Example 7.

FIG. 22A is a circuit diagram showing a configuration of the third capacitor circuit CAP30. The third capacitor circuit CAP30 includes a first circuit part 30A and a second circuit part 30B.

The first circuit part 30A includes capacitors CAP40-0, CAP40-1, . . . , and CAP40-*k*, and transistors NM80-0, NM80-1, . . . , and NM80-*k* that are N-channel MOSFETs. In each of the capacitors CAP40-0 to CAP40-*k*, one end is connected to the CIN terminal via a common line, and the other end is connected to each drain of the transistors NM80-1 to NM80-*k*. In each of the transistors NM80-0 to NM80-*k*, the source is grounded, and selection signals ITP<0> to ITP<k> are supplied to the gate.

The second circuit part 30B includes capacitors CAP50-0 to 50-*m* that are m+1 capacitors and transistors NM90-0 to 90-*m* that are m+1 N-channel MOSFETs.

One end of each of the capacitors CAP50-0 to 50-*m* is connected to the CIN terminal via a common line. The other end of the capacitor CAP50-0 is connected to the drain of the transistor NM90-0. Similarly, the other ends of the capacitors CAP50-1 to 50-*m* are respectively connected to the drains of the transistors NM90-1 to 90-*m*.

The source of each of the transistors NM90-0 to 90-*m* is grounded. The inverted selection signals ITM<0>-ITM<m> are supplied to the gates of the transistors NM90-0 to 90-*m*.

Figure 22B:
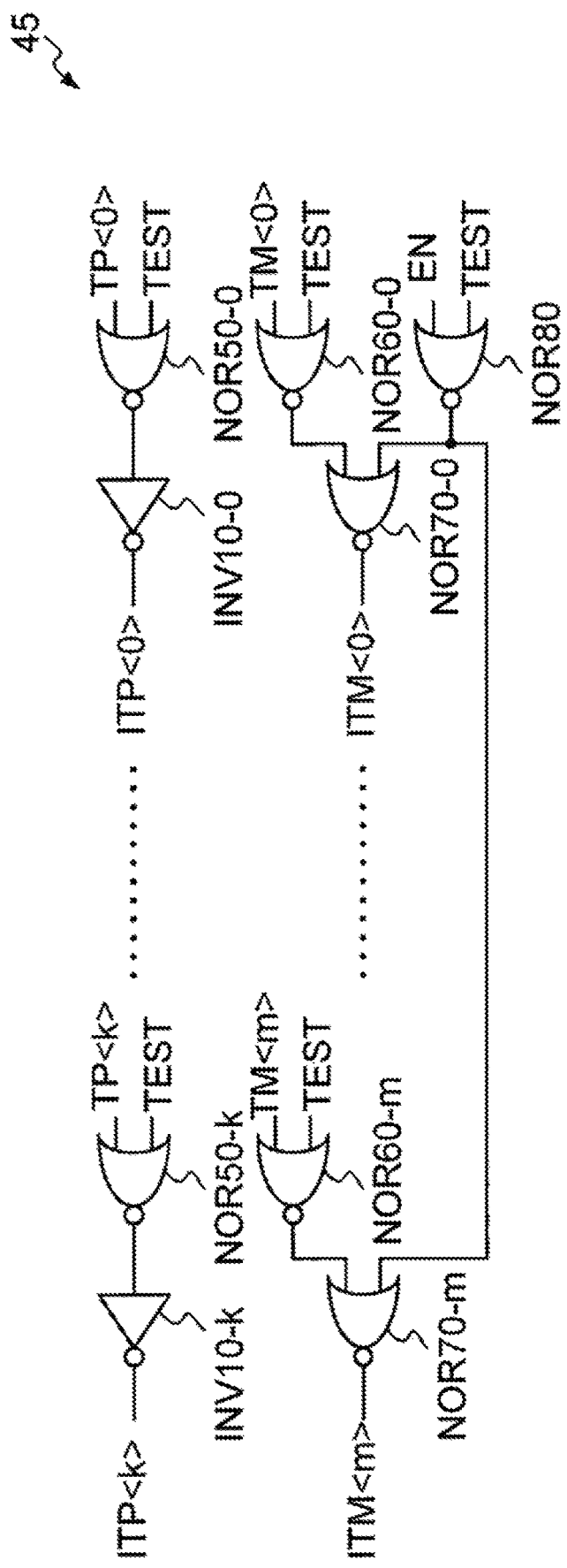
FIG. 22B is a circuit diagram showing a configuration of a signal generation circuit of the CAP30.

FIG. 22B is a circuit diagram showing a configuration of a signal generation circuit 45 which is a part of the third capacitor circuit CAP30. The signal generation circuit 45 includes k+1 NOR gate circuits which are NOR50-0 to 50-*k*, and k+1 inverters which are inverters INV10-0 to 10-*k*. In addition, the signal generation circuit 45 includes m+1 NOR gate circuits which are NOR60-0 to 60-*m*, m+1 NOR gate circuits which are NOR70-0 to 70-*m*, and one NOR gate circuit NOR80.

The output terminals of the NOR50-0 to 50-*k* are respectively connected to the input ends of the inverters INV10-0 to 10-*k*. Selection signals TP<0> to TP<k> are respectively supplied to one input end of each of the NOR50-0 to 50-*k*. All of the other input ends of the NOR50-0 to 50-*k* are connected to the test terminal TEST.

The output end of each of the inverters INV10-0 to 10-*k* is connected to the gate of each of the transistors NM80-0 to NM80-*k* of the third capacitor circuit CAP30 shown in FIG. 22A. The inverters INV10-0 to 0-*k* supply the signals obtained by inverting the output signals of the NOR50-0 to 50-*k* as the selection signals ITP<0> to ITP<k> to the gate of each of the transistors NM80-0 to NM80-*k*.

The output end of each of the NOR60-0 to 60-*m* is connected to one input terminal of each of the NOR70-0 to 70-*m*. One input end of each of the NOR60-0 to 60-*m* is connected to the signal input terminal T2<m:0>, and receives an input of the margin trimming signal TM<m:0>. The other input end of each of the NOR60-0 to 60-*m* is connected to the test terminal TEST.

All of the other input terminals of the NOR70-0 to 70-*m* are connected to the output end of the NOR80. One input end of the NOR80 is connected to the enable terminal EN, and the other input end is connected to the test terminal TEST. The output end of each of the NOR70-0 to 70-*m* is connected to the gate of each of the transistors NM90-0 to NM90-*m* of the third capacitor circuit CAP30 shown in FIG. 22A. Each of the NOR70-0 to 70-*m* outputs the inverted selection signals ITM<0> to ITM<m> and supplies the inverted selection signals to the gate of each of the transistors NM90-0 to NM90-*m*.

Next, the operation of the capacitance sensor circuit 15 of the example is described.

[Non-Test Mode]

When the signal level of the test mode signal TEST supplied to the test terminal TEST of the switching circuit SW in FIG. 20 is at the L-level, the CIN0 and CIN0P terminals of the switching circuit SW are connected and the CIN1 and CIN1P terminals are connected, and the inputs of the CIN0T and CIN1T terminals become the L-level.

In addition, the signal level of the test signal ITEST supplied to the test terminal TEST1 of the switching circuit SW becomes the H-level, and the signal level of the inverted test signal ITESTB supplied to the test terminal TEST2 becomes the H-level. Since neither the CIN terminal of the third capacitor circuit CAP30 nor the CIN terminal of the second capacitor circuit CAP20 is connected to the amplifier circuit 30, the operation of the capacitance sensor circuit 15 is not affected.

Since the input of the test terminal TEST of the first capacitor circuit CAP10 becomes the L-level, the trimming signal ITC<n:0> (that is, the selection signals ITC<0> to ITC<n>) in FIG. 21B is a signal in phase with the signal TC<n:0> (that is, the selection signals TC<0> to TC<n>). In addition, the ITM<m:0> (that is, the inverted selection signals ITM<0> to ITM<m>) behaves in the same manner as the AND gates of the margin trimming signal TM<m:0> (that is, the selection signals TM<0> to TM<m>) and the enable signal EN. This is the same state as that in FIG. 16 of Example 6. Therefore, when the test mode signal TEST supplied to the switching circuit SW in FIG. 20 is at the L-level, the same operation as in Example 6 is possible.

[Test Mode]

Next, when the signal level of the test signal TEST is at the H-level, the CIN0 and CIN1T terminals, and the CIN1 and CIN1T terminals of the switching circuit SW are connected, and the inputs of the CIN0P and CIN1P terminals of the switching circuit SW become the L-level.

In addition, the signal level of the test signal ITEST becomes the H-level, and the signal level of the inverted test signal ITESTB becomes the H-level. Since neither one end of the capacitor CAP0 nor the CIN terminal of the first capacitor circuit CAP10 is connected to the amplifier circuit 30, the operation of the capacitance sensor circuit 15 is not affected.

Since the input of the test terminal TEST of the second capacitor circuit CAP20 becomes the L-level, the trimming signal ITC<n:0> (that is, the selection signals ITC<0> to ITC<n>) in FIG. 21B is in phase with the first trimming signal TC<n:0> (that is, the selection signals TC<0> to TC<n>). In addition, the ITM<m:0> (that is, the inverted selection signals ITM<0> to ITM<m>) behaves in the same manner as the AND gates of the margin trimming signal TM<m:0> (that is, the selection signals TM<0> to TM<m>) and the enable signal EN. This is the same state as that in FIG. 16 of Example 6.

In addition, since the input of the test terminal TEST of the third capacitor circuit CAP30 becomes the L-level, the ITP<k:0> (that is, the selection signals ITP<0> to ITP<k>) in FIG. 22B is a signal in phase with the capacitance value selection signal TP<k:0> (that is, the selection signals TP<0> to TP<k>).

Here, the enable signal EN at the H-level, the capacitance value selection signal TP<k:0> assuming the parasitic capacitance of the capacitor CAP0 outside the semiconductor integrated circuit, and the margin trimming signal TM<m:0> in which the capacitance value of the third capacitor circuit CAP30 is half of the difference between the capacitance value before melting and the capacitance value after melting of the dielectric DE between the electrodes of the capacitor CAP0 are input as the input signals of the third capacitor circuit CAP30. Since the enable signal EN is at the H-level, the ITM<m:0> and the TM<m:0> in FIG. 22B are in-phase signals. When the capacitance values of the capacitors CAP50-0 to 50-m in FIG. 22A are set to be the double of the capacitance values of the capacitors CAP30-0 to 30-m in FIG. 21A, the capacitance value equivalent to the difference between the capacitance value before melting and the capacitance value after melting of the dielectric DE between the electrodes of the capacitor CAP0 is set for the capacitors CAP50-0 to 50-m.

The calibration is performed in this state and the second trimming signal TCO<n:0> is set so that the capacitance value of the second capacitor circuit CAP20 and the capacitance value of the third capacitor circuit CAP30 have the same capacitance value. When the data of the TCO<n:0> at this time is input to the TC<n:0>, and the capacitance sensor circuit enable signal CSREN at the H-level and the calibration enable signal CALEN at the L-level are supplied to operate the capacitance sensor circuit 15, the calibration enable signal CALEN is at the L-level and thus the control signal ICAL also becomes the L-level, and all of the ITM<m:0> in FIG. 21B also become the L-level. Since none of the capacitors CAP30-0 to 30-m function as a capacitance, the capacitance value of the second capacitor circuit CAP20 is set to a capacitance value which is obtained by subtracting, from the capacitance value of the third capacitor circuit CAP30, the capacitance value equivalent to half of the difference between the capacitance value before melting and the capacitance value after melting of the dielectric DE between the electrodes of the capacitor CAP0.

When the enable signal EN at the L-level is further input, the ITM<m:0> in FIG. 22A all become the L-level, and none of the capacitors CAP50-0 to 50-m function as a capacitance value. Therefore, the capacitance value of the third capacitor circuit CAP30 is set to a capacitance value which is obtained by subtracting, from the capacitance value of the second capacitor circuit CAP20, the capacitance value equivalent to half of the difference between the capacitance value before melting and the capacitance value after melting of the dielectric DE between the electrodes of the capacitor CAP0.

In other words, by inputting the enable signal EN at the H-level, the capacitance sensor circuit 15 can be operated in a state that the capacitance value of the second capacitor circuit CAP20 is smaller than the capacitance value of the third capacitor circuit CAP30 by the capacitance value equivalent to half of the difference between the capacitance value before melting and the capacitance value after melting of the dielectric DE between the electrodes of the capacitor CAP0.

In addition, by inputting the enable signal EN at the L-level, the capacitance sensor circuit 15 can be operated in a state that the capacitance value of the third capacitor circuit CAP30 is smaller than the capacitance value of the second capacitor circuit CAP20 by the capacitance value equivalent to half of the difference between the capacitance value before melting and the capacitance value after melting of the dielectric DE between the electrodes of the capacitor CAP0.

As described above, according to the capacitance sensor circuit 15 of the example, the calibration operation and the capacitance sensor operation can be performed in the test mode. This is effective for testing at a wafer stage in which the capacitor CAP0 is not connected.

Example 8

Figure 23:
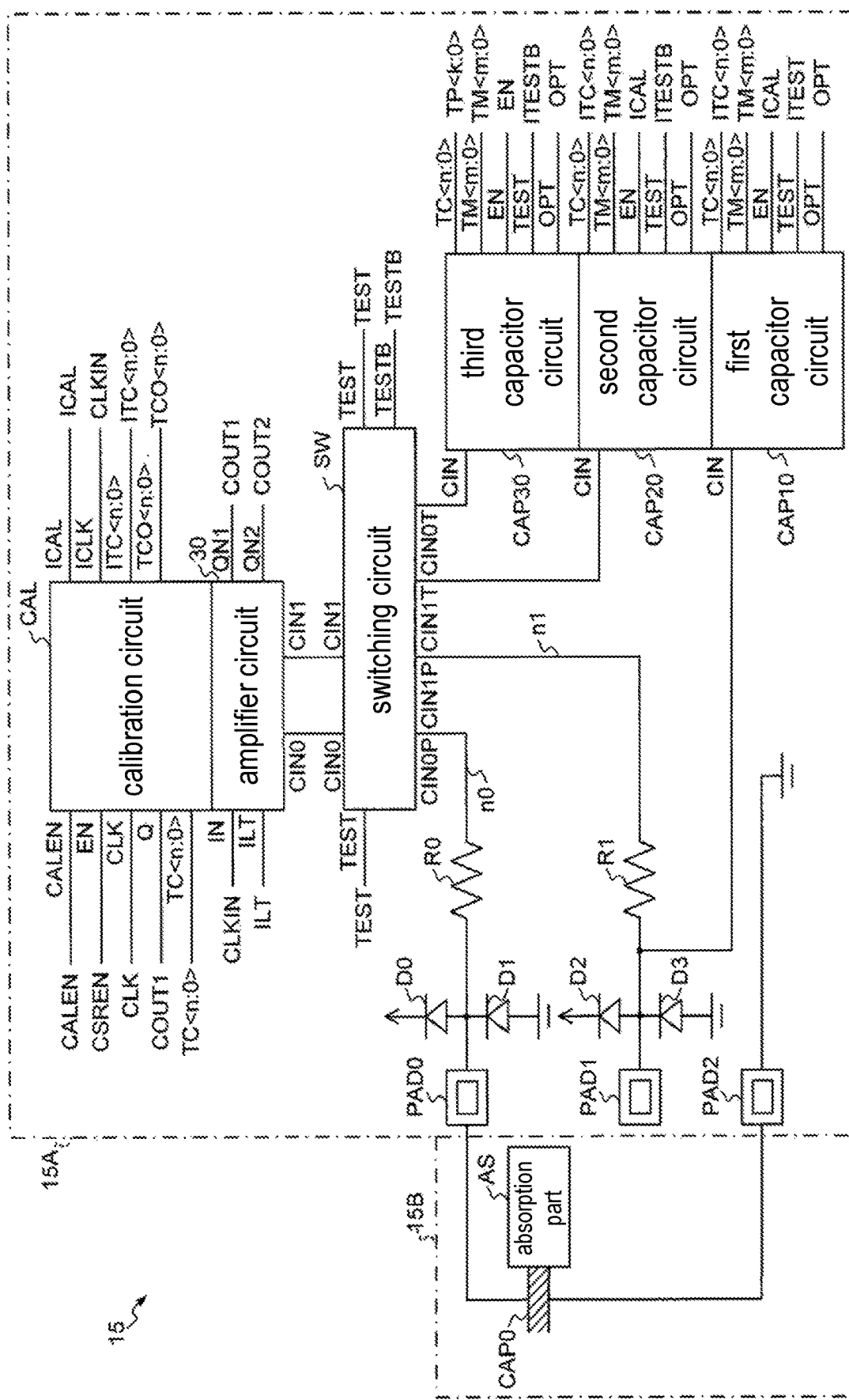
FIG. 23 is a block diagram showing a configuration of a capacitance sensor circuit of Example 8.

Next, Example 8 of the disclosure is described. FIG. 23 is a block diagram showing a configuration of the capacitance sensor circuit 15 of the example. The capacitance sensor circuit 15 of the example is different from the capacitance sensor circuit 15 of Example 7 in that a detection switching signal OPT is input to the first capacitor circuit CAP10, the second capacitor circuit CAP20, and the third capacitor circuit CAP30.

The detection switching signal OPT is a capacitance increase/decrease detection switching signal used for switching detection of decrease and detection of increase in capacitance value of the capacitor CAP0. When the detection switching signal OPT is at the L-level, the capacitance sensor circuit 15 is controlled to detect a decrease in capacitance of the capacitor CAP0. When the detection switching signal OPT is at the H-level, the capacitance sensor circuit 15 is controlled to detect an increase in capacitance of the capacitor CAP0. The detection switching signal OPT is supplied to signal input terminals OPT arranged in the first capacitor circuit CAP10, the second capacitor circuit CAP20, and the third capacitor circuit CAP30.

The configurations of the calibration circuit CAL, the amplifier circuit 30, the switching circuit SW, the capacitor CAP0, the resistor R0, the resistor R1, the diodes D0 to D3, and the PAD0-2 are the same as those of the capacitance sensor circuit 15 of Example 7.

The first capacitor circuit CAP10 of the example has the same basic configuration as that of the first capacitor circuit CAP10 of Example 7 shown in FIG. 21A, and is different from the capacitor circuit CAP10 of Example 7 in the configuration of the signal generation circuit 44. Besides, the second capacitor circuit CAP20 also has the same configuration as that of the first capacitor circuit CAP10.

Figure 24:
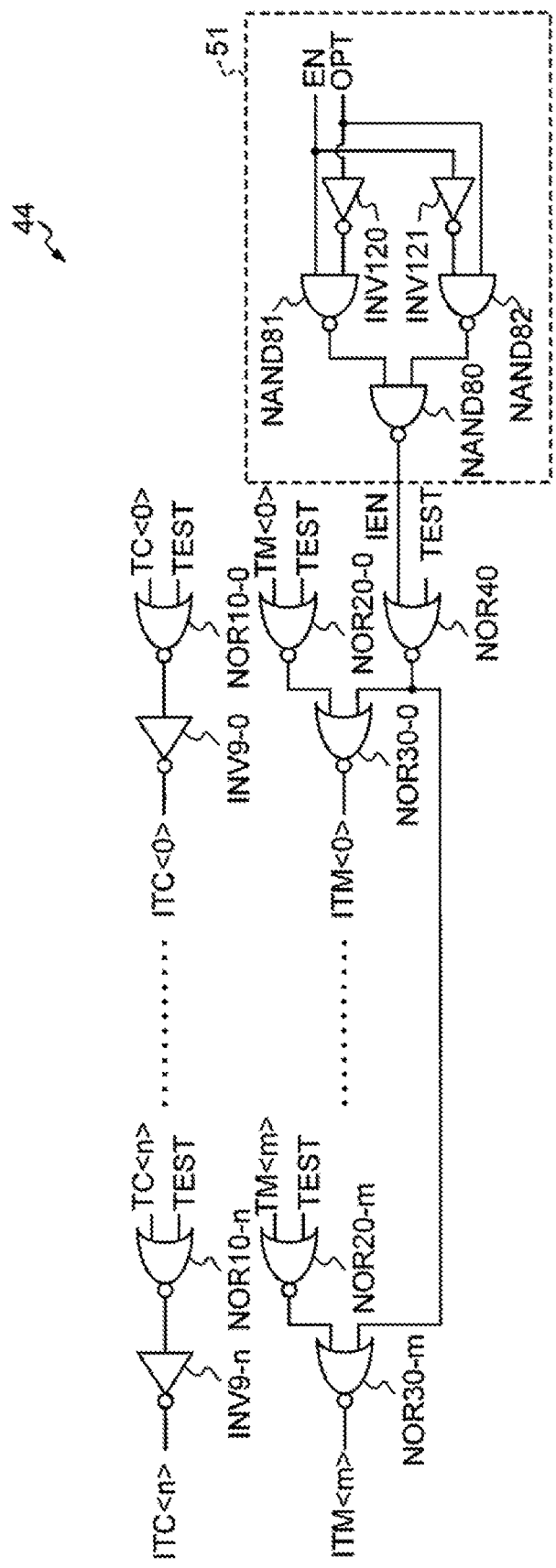
FIG. 24 is a circuit diagram showing a configuration of a signal generation circuit of a CAP10 or CAP20 of Example 8.

FIG. 24 is a circuit diagram showing a configuration of the signal generation circuit 44 of the first capacitor circuit CAP10 of the example. Besides, the second capacitor circuit CAP20 also has a signal generation circuit 44 having the same configuration. The signal generation circuit 44 of the example is different from the signal generation circuit 44 of Example 7 in terms of including an EN control part 51.

The EN control part 51 includes a NAND80, a NAND81 and a NAND82 which are two-input NAND gate circuits, and inverters INV120 and INV121.

One input end of the NAND81 is connected to the enable terminal EN of the first capacitor circuit CAP10 in common with the input end of the inverter INV121. The other input end of the NAND81 is connected to the output end of the inverter INV120.

One input end of the NAND82 is connected to the output end of the inverter INV121. The other input end of the NAND82 is connected to the signal input terminal OPT of the first capacitor circuit CAP10 in common with the input end of the inverter INV120.

One input end of the NAND80 is connected to the output end of the NAND81. The other input end of the NAND80 is connected to the output end of the NAND82. The output end of the NAND80 is connected to one input end of the NOR40. The EN control part 51 generates an enable signal IEN based on the signals supplied to the enable terminal EN and the signal input terminal OPT, and supplies the enable signal IEN to one input end of the NOR40.

Figure 25:
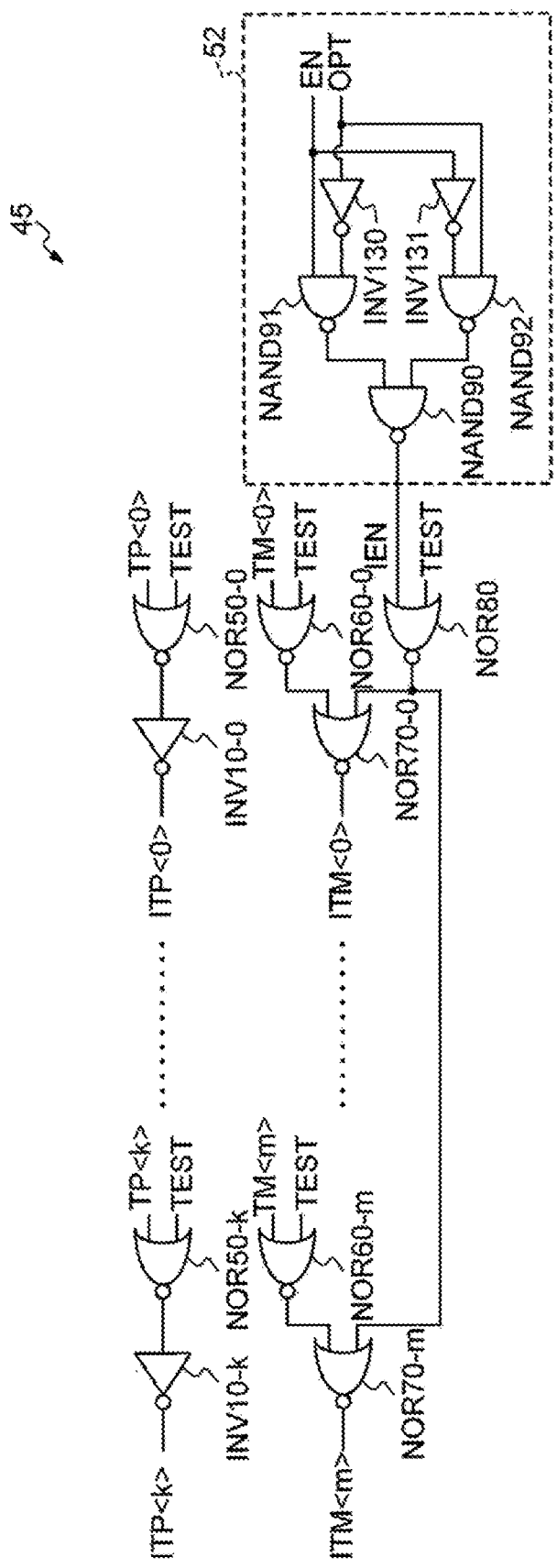
FIG. 25 is a circuit diagram showing a configuration of a signal generation circuit of a CAP30 of Example 8.

FIG. 25 is a circuit diagram showing a configuration of the signal generation circuit 45 of the third capacitor circuit CAP30 of the example. The signal generation circuit 45 of the example is different from the signal generation circuit 45 of Example 7 in terms of including an EN control part 52.

The EN control part 52 includes a NAND90, a NAND91 and a NAND92 which are two-input NAND gate circuits, and inverters INV130 and INV131.

One input end of the NAND91 is connected to the enable terminal EN of the third capacitor circuit CAP30 in common with the input end of the inverter INV131. The other input end of the NAND91 is connected to the output end of the inverter INV130.

One input end of the NAND92 is connected to the output end of the inverter INV131. The other input end of the NAND92 is connected to the signal input terminal OPT of the third capacitor circuit CAP30 in common with the input end of the inverter INV130.

One input end of the NAND90 is connected to the output end of the NAND91. The other input end of the NAND90 is connected to the output end of the NAND92. The output end of the NAND90 is connected to one input end of the NOR80. The EN control part 52 generates the enable signal IEN based on the signals supplied to the enable terminal EN and the signal input terminal OPT, and supplies the enable signal IEN to one input end of the NOR80.

Next, the operation of the capacitance sensor circuit 15 of the example is described.

[State in which Detection Switching Signal OPT is at L-Level]

When the detection switching signal OPT is at the L-level, the EN control part 51 shown in FIG. 24 outputs an enable signal IEN in phase with the EN and supplies the enable signal IEN to one input end of the NOR40. Thereby, the signal generation circuit 44 of the example is in the same state as the signal generation circuit 44 of Example 7 shown in FIG. 21B.

In addition, since the detection switching signal OPT is at the L-level, the EN control part 52 shown in FIG. 25 outputs an enable signal IEN in phase with the EN and supplies the enable signal IEN to one input end of the NOR80. Thereby, the signal generation circuit 45 of the example is in the same state as the signal generation circuit 45 of Example 7 shown in FIG. 22B.

[State in which Detection Switching Signal OPT is at H-Level]

Next, when the detection switching signal OPT is at the H-level, the EN control part 51 in FIG. 24 outputs an inverted signal of the EN as the enable signal IEN and supplies the inverted signal to one input end of the NOR40. Similarly, the EN control part 52 in FIG. 25 outputs an inverted signal of the EN as the enable signal IEN, and supplies the inverted signal to one input end of the NOR80.

[Non-Test Mode]

At this time, when the test signal TEST at the L-level is input to the test terminal TEST of the switching circuit SW shown in FIG. 23, the CIN0 and CIN0P terminals, and the CIN1 and CIN1P terminals of the switching circuit SW are respectively connected, and the inputs of the CIN0T and CIN1T terminals of the switching circuit SW become the L-level. In addition, the test signal ITEST becomes the L-level and the inverted test signal ITESTB becomes the H-level.

Since neither the CIN terminal of the third capacitor circuit CAP30 nor the CIN terminal of the second capacitor circuit CAP20 is connected to the amplifier circuit 30, the operation of the capacitance sensor circuit 15 is not affected. Since the input of the test terminal TEST of the first capacitor circuit CAP10 is at the L-level, the trimming signal ITC<n:0> (that is, the selection signals ITC<0> to ITC<n>) in FIG. 24 is a signal in phase with the signal TC<n:0> (that is, the selection signals TC<0> to TC<n>). In addition, the ITM<m:0> (that is, the inverted selection signals ITM<0> to ITM<m>) behaves in the same manner as the AND gates of the margin trimming signal TM<m:0> (that is, the selection signals TM<0> to TM<m>) and the enable signal EN.

When the calibration is performed in this state, the calibration enable signal CALEN is at the H-level, and thus the control signal ICAL becomes the H-level, and the enable signal IEN in FIG. 24 becomes the L-level, in other words, all of the ITM<m:0> become the L-level. Thereby, the capacitors CAP30-0 to 30-m do not function as capacitances, and the first capacitor circuit CAP10 has the same capacitance value as that of the capacitor CAP0.

When the capacitance sensor circuit 15 is operated after the calibration, the calibration enable signal CALEN becomes the L-level, and thus the control signal ICAL becomes the L-level, and the enable signal IEN in FIG. 24 becomes the H-level, in other words, all of the ITM<m:0> are signals in phase with the TM<m:0>. Therefore, the capacitance value of the first capacitor circuit CAP10 is set to a capacitance value which is obtained by adding, to the capacitance value including the parasitic capacitance of the capacitor CAP0, half of the difference between the capacitance value before melting and the capacitance value after melting of the dielectric DE between the electrodes of the capacitor CAP0.

[Test Mode]

When the test signal TEST is at the H-level, the CIN0 and CIN0T terminals, and the CIN1 and CIN1T terminals of the switching circuit SW are respectively connected. The inputs of the CIN0P and CIN1P terminals of the switching circuit SW become the L-level. In addition, the test signal ITEST becomes the H-level, and the inverted test signal ITESTB becomes the L-level.

Since neither one end of the capacitor CAP0 nor the CIN terminal of the first capacitor circuit CAP10 is connected to the amplifier circuit 30, the operation of the capacitance sensor circuit 15 is not affected. Since the input of the test terminal TEST of the second capacitor circuit CAP20 becomes the L-level, the trimming signal ITC<n:0> in FIG. 24 is a signal in phase with the first trimming signal TC<n:0>. In addition, the ITM<m:0> behaves in the same manner as the AND gates of the margin trimming signal TM<m:0> and the enable signal EN.

In addition, since the input of the test terminal TEST of the third capacitor circuit CAP30 becomes the L-level, the ITP<k:0> (that is, the selection signals ITP<0> to ITP<k>) in FIG. 25 are signals in phase with the capacitance value selection signals TP<k:0> (that is, the selection signals TP<0> to TP<k>).

Here, the enable signal EN at the H-level, the capacitance value selection signals TP<k:0> assuming the parasitic capacitance of the capacitor CAP0 outside the semiconductor integrated circuit, and the margin trimming signal TM<m:0> in which the capacitance value of the third capacitor circuit CAP30 is half of the difference between the capacitance value before melting and the capacitance value after melting of the dielectric DE between the electrodes of the capacitor CAP0 are input as the input signals of the third capacitor circuit CAP30. Since the enable signal EN is at the H-level, all of the ITM<m:0> in FIG. 25 become the L-level, and none of the capacitors CAP50-0 to 50-*m* shown in FIG. 22A (that is, the capacitors constituting the second circuit part 30B of the third capacitor circuit CAP30 of the example) function as a capacitance.

The calibration is performed in this state, and the second trimming signal TCO<n:0> is set so that the capacitance value of the second capacitor circuit CAP20 and the capacitance value of the capacitor CAP0 have the same capacitance value. When the data of the TCO<n:0> at this time is input to the TC<n:0>, and the capacitance sensor circuit enable signal CSREN at the H-level and the calibration enable signal CALEN at the L-level are supplied to operate the capacitance sensor circuit 15, the calibration enable signal CALEN is at the L-level and thus the control signal ICAL also becomes the L-level, and all of the ITM<m:0> in FIG. 24 become signals in phase with the TM<m:0>.

Thereby, the capacitance value of the second capacitor circuit CAP20 is set to a capacitance value, which is obtained by adding, to the capacitance value of the third capacitor circuit CAP30, half of the difference between the capacitance value before melting and the capacitance value after melting of the dielectric DE between the electrodes of the capacitor CAP0.

When the enable signal EN at the L-level is further input, the ITM<m:0> and the TM<m:0> in FIG. 25 are in-phase signals. The capacitance values of the capacitors CAP50-0 to 50-*m* in FIG. 22A are set to be the double of the capacitance values of the capacitors CAP30-0 to 30-*m* in FIG. 21A (that is, the capacitors constituting the second circuit part 10B of the second capacitor circuit CAP20 of the example), the capacitance value equivalent to the difference between the capacitance value before melting and the capacitance value after melting of the dielectric DE between the electrodes of the capacitor CAP0 is set for the capacitors CAP50-0 to 50-*m*. The capacitance value of the third capacitor circuit CAP30 is set to a capacitance value which is obtained by adding, to the capacitance value of the second capacitor circuit CAP20, half of the difference between the capacitance value before melting and the capacitance value after melting of the dielectric DE between the electrodes of the capacitor CAP0.

In other words, by inputting the enable signal EN at the H-level, the capacitance sensor circuit 15 can be operated in a state that the capacitance value of the second capacitor circuit CAP20 is larger than the capacitance value of the third capacitor circuit CAP30 by the capacitance value equivalent to half of the difference between the capacitance value before melting and the capacitance value after melting of the dielectric DE between the electrodes of the capacitor CAP0.

In addition, by inputting the enable signal EN at the L-level, the capacitance sensor circuit 15 can be operated in a state that the capacitance value of the third capacitor circuit CAP30 is larger than the capacitance value of the second capacitor circuit CAP20 by the capacitance value equivalent to half of the difference between the capacitance value before melting and the capacitance value after melting of the dielectric DE between the electrodes of the capacitor CAP0.

As described above, according to the capacitance sensor circuit 15 of the example, the calibration operation and the detection operation of capacitance increase/decrease performed by the capacitance sensor circuit 15 can be performed in the non-test mode and the test mode.

In addition, the disclosure is not limited to the above embodiments. For example, in Example 1, the example in which the exclusive logic gate circuit 36 includes the NAND gate circuits and the inverters has been described, but other logic gate circuits and elements may be used to implement an equivalent configuration.

In addition, in Example 2, the example in which the second latch circuit LT2 stores some output signals of the exclusive logic gate circuit 36 has been described, but the circuit configuration is not particularly limited. In addition, instead of the latch circuit, other sequential circuits may be used to store the signals.

In addition, in Example 3, the example in which the resistors R0 and R1, the diodes D0 to D3, and the parasitic capacitance are used to apply the countermeasures against static electricity and noise to the capacitance sensor circuit 15 has been described. However, instead of the diodes, other electrostatic protection elements may be used to implement the countermeasures against static electricity. In addition, other elements may be used to constitute a noise removal filter.

In addition, in Example 4, the example in which the PAD0 and PAD1 are set to the high impedance state by adding the inverter and the NMOS transistor to the amplifier circuit 30 has been described, but other elements may also be used to implement the same configuration.

In addition, in Example 5, the example in which the capacitor and the NMOS transistor are used in the capacitor circuit in the semiconductor integrated circuit has been described, but the type of the capacitor is not particularly limited. Any capacitor such as an NMOS capacitor, a MIM (Metal Insulator Metal) capacitor, a MOM (Metal Oxide Metal) capacitor or the like may be used. In addition, other elements may be used instead of the NMOS transistor.

In addition, in Example 6, the example in which the capacitor and the NMOS transistor are used in the capacitor circuit in the semiconductor integrated circuit and the inverter and the NAND gate circuit are used in the circuit for selecting the capacitor and the NMOS transistor has been described. However, it is not limited to the inverter and the NAND gate circuit, and other logic gate circuits may also be used.

In addition, in Example 6, the example in which the calibration circuit CAL is configured by the clock signal control circuit, the latch circuit, the inverter, the NAND gate circuit, the NMOS transistor, and the PMOS transistor has been described, but the configuration of the clock signal control circuit or the latch circuit is not particularly limited. In addition, instead of the inverter and the NAND gate circuit, other sequential circuits and logic gates may be used. Other elements may be used instead of the NMOS transistor and the PMOS transistor.

In addition, in Example 7, the example has been described in which the test circuit mode capacitor circuit and the non-test mode capacitor circuit are switched by the switching circuit and the calibration operation or the detection of the capacitance change are performed in the test mode capacitor circuit, but the switching circuit may have any circuit configuration. In addition, the example has been described in which the capacitor and the NMOS transistor are used in the capacitor circuit in the semiconductor integrated circuit and the inverter and the NOR gate circuit are used in the circuit for selecting the capacitor and the NMOS transistor. However, other logic gate circuits may be used instead of the inverter and the NOR gate circuit.

In addition, in Example 8, the example has been described in which the NAND gate circuit and the inverter are added in the capacitor circuit in the semiconductor integrated circuit, and a method for adding the capacitance value corresponding to the capacitance change during the calibration and deleting the same after the calibration and a method for adding the capacitance value corresponding to the capacitance change not during the calibration but after the calibration are switched, to thereby switch the detection of increase in capacitance and the detection of decrease in capacitance. However, the configuration of the capacitor circuit in the semiconductor integrated circuit is not limited to the above configuration, and may be a configuration using other logic gate circuits or elements.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A capacitance sensor circuit, comprising:
a capacitance variable capacitor whose electrostatic capacitance changes corresponding to an environmental change between a first capacitance and a second capacitance;
a reference capacitor having a fixed electrostatic capacitance between the first capacitance and the second capacitance as a reference capacitance value; and
an amplifier circuit that charges the capacitance variable capacitor via a first node and charges the reference capacitor via a second node corresponding to a clock signal, amplifies a potential difference between a potential of the first node and a potential of the second node, and outputs a binary determination signal indicating whether the electrostatic capacitance of the capacitance variable capacitor has changed to exceed the reference capacitance value based on the amplified potential difference;
wherein the amplifier circuit comprises:
a differential amplification part that amplifies the potential difference between the potential of the first node and the potential of the second node, and generates a potential difference signal indicating the amplified potential difference;
a bias control part that supplies a bias signal to the differential amplification part, and controls an operation current of the differential amplification part; and
an output part that outputs the binary determination signal based on the potential difference signal;
when it becomes a state that a difference between an increase degree of the potential of the first node and an increase degree of the potential of the second node is less than a predetermined value due to a change in the electrostatic capacitance of the capacitance variable capacitor, the output part holds and outputs the binary determination signal immediately before the state, and the bias control part stops a current flowing through the differential amplification part.

2. The capacitance sensor circuit according to claim 1, wherein when the it becomes the state that the difference between the increase degree of the potential of the first node and the increase degree of the potential of the second node is less than the predetermined value, the bias control part charges the capacitance variable capacitor and the reference capacitor to thereby stop the current flowing through the differential amplification part.

3. The capacitance sensor circuit according to claim 1, wherein the output part comprises:
a first latch circuit that holds the potential difference signal, and outputs the binary determination signal based on the held potential difference signal; and
a second latch circuit that holds the bias signal, and outputs a detection signal indicating whether the difference between the increase degree of the potential of the first node and the increase degree of the potential of the second node is less than the predetermined value.

4. The capacitance sensor circuit according to claim 1, wherein the reference capacitor is arranged inside semiconductor integrated circuit, and
the capacitance variable capacitor is arranged outside the semiconductor integrated circuit; and
the capacitance sensor circuit comprises:
a first pad that connects one end of the capacitance variable capacitor and the first node,
a first resistor in which one end is connected to the first node and the other end is connected to the one end of the capacitance variable capacitor via the first pad,
a second resistor in which one end is connected to the second node and the other end is connected to one end of the reference capacitor,
a second pad connected to the other end of the second resistor,
a third pad that connects the other end of the reference capacitor and the capacitance variable capacitor, a first diode part including at least one diode connected between the other end of the first resistor and the first pad, and a second diode part including at least one diode connected between the other end of the second resistor and the second pad.

5. The capacitance sensor circuit according to claim 1, wherein the amplifier circuit controls the first node and the second node to be in a high impedance state corresponding to a supply of a test mode signal, and controls the bias signal generation part to cut off the operation current of the differential amplification part.

6. A capacitance sensor circuit, comprising:

a capacitance variable capacitor whose electrostatic capacitance changes corresponding to an environmental change between a first capacitance and a second capacitance;

a first capacitor circuit comprising a plurality of capacitors and being capable of selecting all or a portion of plurality of capacitors to provide a capacitance value as an electrostatic capacitance of the first capacitor circuit; and an amplifier circuit that charges the capacitance variable capacitor via a first node and charges the capacitors of the first capacitor circuit via a second node corresponding to a clock signal, amplifies a potential difference between a potential of the first node and a potential of the second node, and outputs a binary determination signal indicating whether the electrostatic capacitance of the capacitance variable capacitor has changed to exceed the capacitance value of the first capacitor circuit based on the amplified potential difference;

wherein the amplifier circuit comprises:

a first charging part that is connected to the first node and charges the capacitance variable capacitor;

a second charging part that is connected to the second node and charges the capacitors of the first capacitor circuit;

a differential amplification part that amplifies the potential difference between the potential of the first node and the potential of the second node, and generates a potential difference signal indicating the amplified potential difference;

a bias control part that supplies a bias signal to the differential amplification part, and controls an operation current of the differential amplification part; and an output part that outputs the binary determination signal based on the potential difference signal; and the first capacitor circuit selectively changes a capacitance value by switching connection and non-connection between each of the plurality of capacitors and the second node based on a capacitance value selection signal.

7. The capacitance sensor circuit according to claim 6, comprising a calibration circuit that executes a calibration of the amplifier circuit, wherein the calibration circuit supplies, during a calibration period for executing the calibration of the amplifier circuit, a first trimming signal for cancelling a parasitic capacitance of the capacitance variable capacitor and a second trimming signal for setting the capacitance value of the capacitor circuit, to the first capacitor circuit; and the calibration circuit supplies, during a normal operation period after the calibration period, the second trimming signal to the first capacitor circuit.

8. The capacitance sensor circuit according to claim 7, comprising a storage part that stores a data value of the second trimming signal, wherein the calibration circuit reads the data value from the storage part after the capacitance sensor circuit is powered on, and outputs the data value as the first trimming signal.

9. The capacitance sensor circuit according to claim 6, comprising:

a second capacitor circuit having a plurality of capacitors and being capable of selectively changing a capacitance value;

a third capacitor circuit having a plurality of capacitors and configured to be capable of selectively changing a capacitance value; and a switching circuit that receives a supply of a switching signal for switching a test mode and a non-test mode, and switches connection between the capacitance variable capacitor, the first capacitor circuit, the second and third capacitor circuits, and the amplifier circuit corresponding to the switching signal;

wherein the switching circuit connects, corresponding to the switching signal indicating switching to the test mode, the second capacitor circuit to the amplifier circuit, and the third capacitor circuit to the amplifier circuit; and the switching circuit connects, corresponding to the switching signal indicating switching to the non-test mode, the capacitance variable capacitor to the amplifier circuit, and the first capacitor circuit to the amplifier circuit.

10. The capacitance sensor circuit according to claim 9, wherein in the test mode, the first charging part charges the second capacitor circuit, and the second charging part charges the third capacitor circuit;

the differential amplification part amplifies a potential difference corresponding to a capacitance difference between the second capacitor circuit and the third capacitor circuit; and the output part outputs the binary determination signal corresponding to the amplified potential difference.

11. The capacitance sensor circuit according to claim 9, wherein each of the first capacitor circuit, the second capacitor circuit and the third capacitor circuit receives supply of a control signal for setting an operation of the amplifier circuit to one of a first detection mode and a second detection mode;

the amplifier circuit operates to detect that the capacitance value of the capacitance variable capacitor is smaller than the capacitance value of the first capacitor circuit in the test mode and the first detection mode, and the amplifier circuit operates to detect that the capacitance value of the capacitance variable capacitor is larger than the capacitance value of the first capacitor circuit in the test mode and the second detection mode.

12. The capacitance sensor circuit according to claim 11, wherein the amplifier circuit operates to detect that the capacitance value of the second capacitor circuit is smaller than the capacitance value of the third capacitor circuit in the non-test mode and the first detection mode, and operates to detect that the capacitance value of the second capacitor circuit is larger than the capacitance value of the third capacitor circuit in the non-test mode and the second detection mode.

13. A semiconductor integrated circuit, which is electrically connected to a capacitance variable capacitor whose electrostatic capacitance changes corresponding to an environmental change between a first capacitance and a second capacitance and which determines whether the electrostatic capacitance of the capacitance variable capacitor has changed to exceed a reference capacitance value, comprising:
- a reference capacitor having a fixed electrostatic capacitance between the first capacitance and the second capacitance as the reference capacitance value; and
- an amplifier circuit that charges the capacitance variable capacitor via a first node and charges the reference capacitor via a second node corresponding to a clock signal, amplifies a potential difference between a potential of the first node and a potential of the second node, and outputs a binary determination signal indicating whether the electrostatic capacitance of the capacitance variable capacitor has changed to exceed the reference capacitance value based on the amplified potential difference;

wherein the amplifier circuit comprises:
- a differential amplification part that amplifies the potential difference between the potential of the first node and the potential of the second node, and generates a potential difference signal indicating the amplified potential difference;
- a bias control part that supplies a bias signal to the differential amplification part, and controls an operation current of the differential amplification part; and
- an output part that outputs the binary determination signal based on the potential difference signal;
- when it becomes a state that a difference between an increase degree of the potential of the first node and an increase degree of the potential of the second node is less than a predetermined value due to a change in the electrostatic capacitance of the capacitance variable capacitor, the output part holds and outputs the binary determination signal immediately before the state, and the bias control part stops a current flowing through the differential amplification part.

* * * * *